United States Patent [19]
Komatsu et al.

[11] Patent Number: 5,796,580
[45] Date of Patent: Aug. 18, 1998

[54] AIR-COOLED INFORMATION PROCESSING APPARATUS HAVING COOLING AIR FAN, SUB-FAN, AND PLURAL SEPARATED COOLING AIR FLOW CHANNELS

[75] Inventors: Toshihiro Komatsu, Ibaraki-ken; Hitoshi Matsushima, Ryugasaki; Toshio Hatada, Tsuchiura; Susumu Iwai, Hadano; Tetsuro Homma, Hadano; Yoshihiro Kondo, Hadano; Shouhei Fuse, Hadano; Hiroshi Yamada, Kanagawa-ken; Kazuo Morita; Hiroshi Ito, both of Hadano; Akiyoshi Iida, Mitsukaido; Kenta Kumagai, Tokyo; Shinichi Shimode, Ibaraki-ken, all of Japan

[73] Assignee: Hitachi, Ltd., Tokyo, Japan

[21] Appl. No.: 226,824

[22] Filed: Apr. 13, 1994

[30] Foreign Application Priority Data

| Apr. 13, 1993 | [JP] | Japan | 5-085868 |
| Apr. 16, 1993 | [JP] | Japan | 5-089695 |
| Jul. 30, 1993 | [JP] | Japan | 5-189920 |

[51] Int. Cl.$^6$ .................. G06F 1/20; G06F 1/16; H05K 7/20
[52] U.S. Cl. .................. 361/687; 361/695
[58] Field of Search .................. 364/708.1; 361/687, 361/690–695

[56] References Cited

U.S. PATENT DOCUMENTS

| 3,903,404 | 9/1975 | Beall et al. | 361/687 |
| 4,035,711 | 7/1977 | Piler | 361/695 X |
| 4,748,540 | 5/1988 | Henneberg et al. | 361/694 X |
| 5,030,128 | 7/1991 | Herron et al. | 364/708.1 X |
| 5,432,386 | 7/1995 | Cerra, Jr. et al. | 361/690 X |
| 5,438,226 | 8/1995 | Kuchta | 361/695 X |
| 5,493,457 | 2/1996 | Kawamura et al. | 361/690 X |

*Primary Examiner*—Michael W. Phillips
*Attorney, Agent, or Firm*—Antonelli, Terry, Stout, & Kraus, LLP

[57] ABSTRACT

An air-cooled information processing apparatus has a plurality of units and a casing accommodating the units. At least one cooling air supply section and at least one cooling air discharge section are provided in the casing, for supplying cooling air into the apparatus and for discharging the air therefrom. A partition member divides the space inside the casing so as to define at least two cooling air flow channels between the cooling air supply section and the cooling air discharge section. At least one main fan unit is disposed in each of the cooling air flow channels. The cooling air flow channels include at least one first cooling air flow channel in which at least two units from among the plurality of units are disposed in parallel with each other with respect to the direction of flow of cooling air, and at least one second cooling air flow channel in which at least two units from among the plurality of units are arranged in series to each other along the flow of cooling air. This cooling arrangement ensures optimum cooling for different types of units in the apparatus, without being accompanied by rise in the noise level, rate of discharge of air, power consumption and production cost.

19 Claims, 71 Drawing Sheets

FIG. 4
FIG. 5
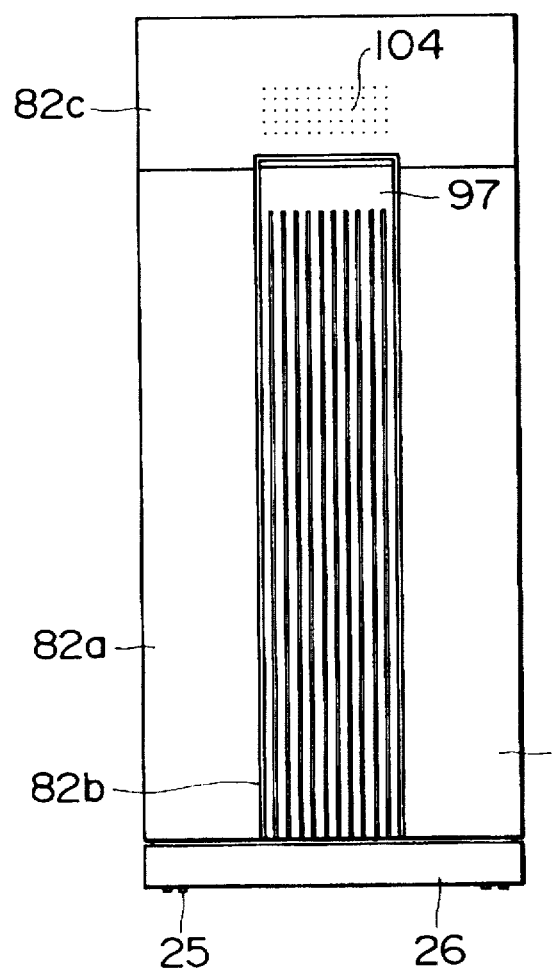
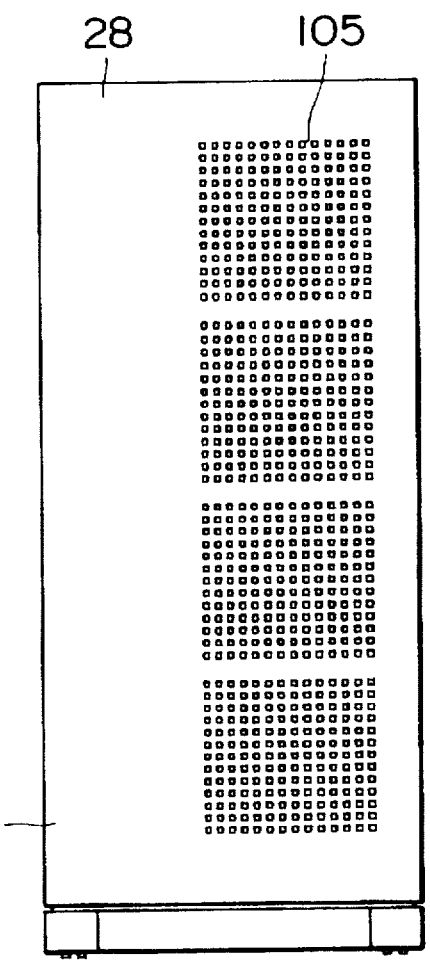

FIG. 47B
FIG. 47A
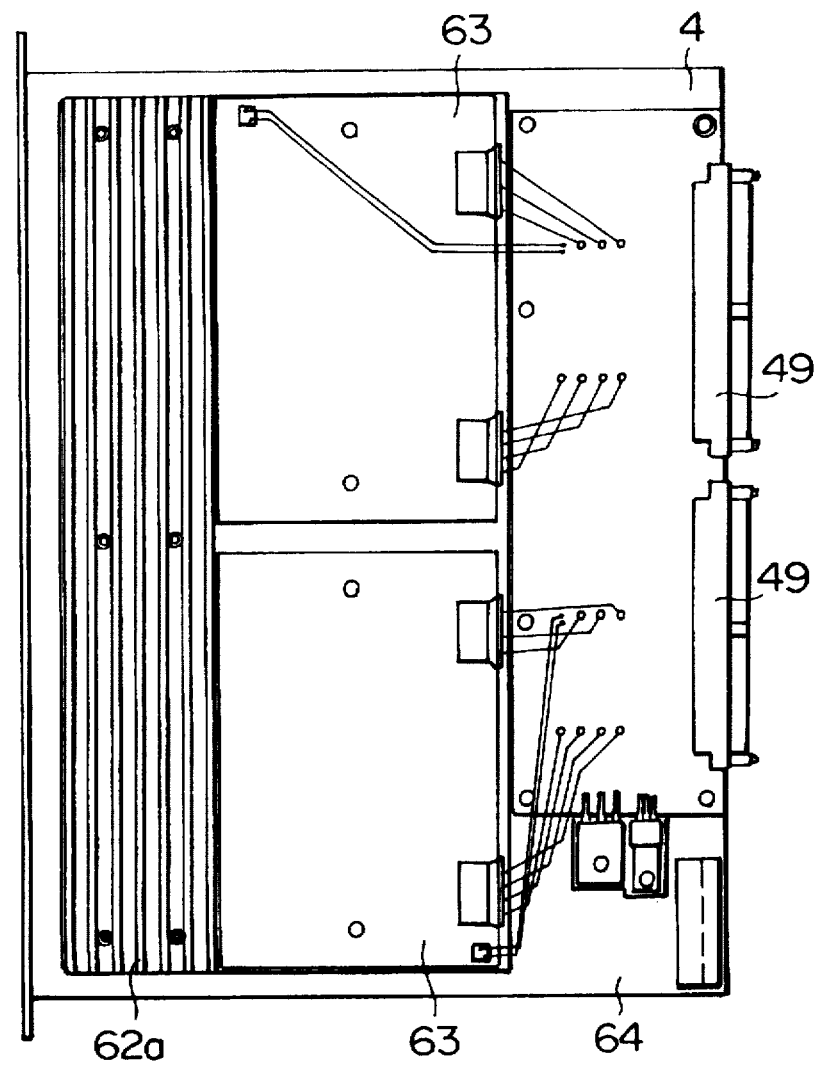
FIG. 47C
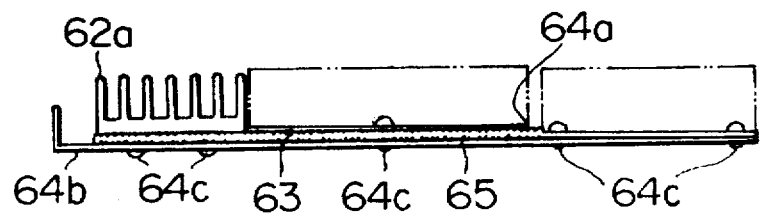

FIG. 74A
FIG. 74C
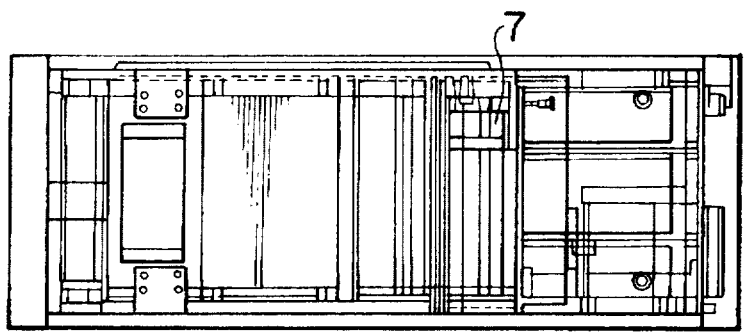
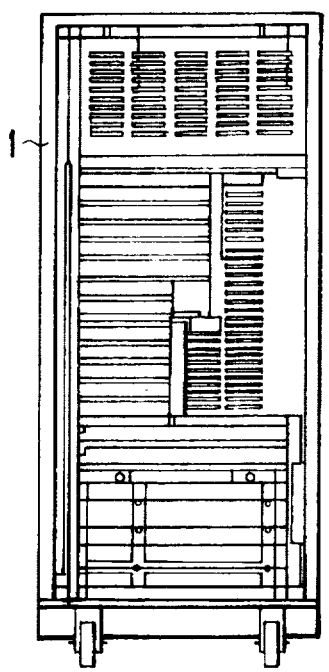
FIG. 74B
FIG. 74D
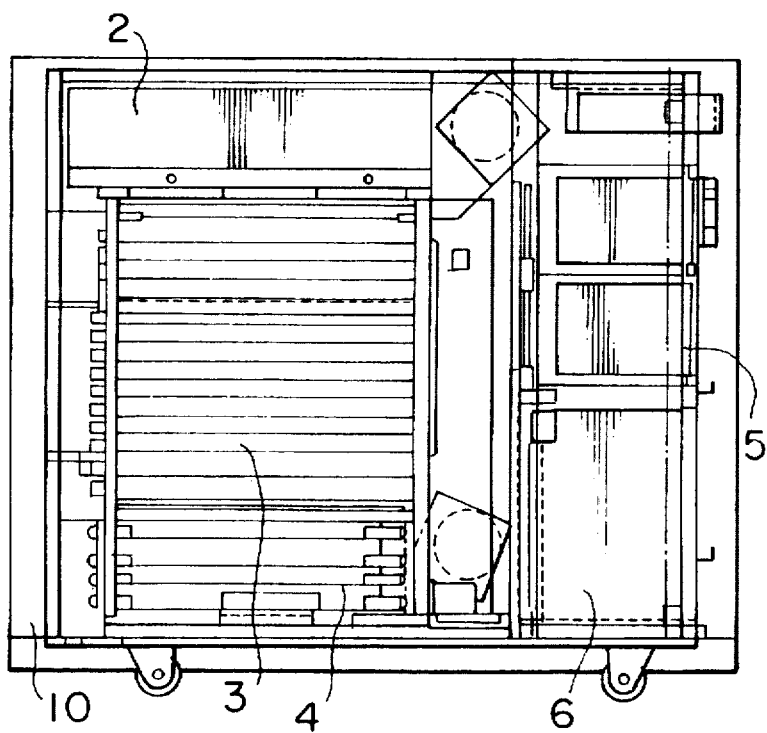
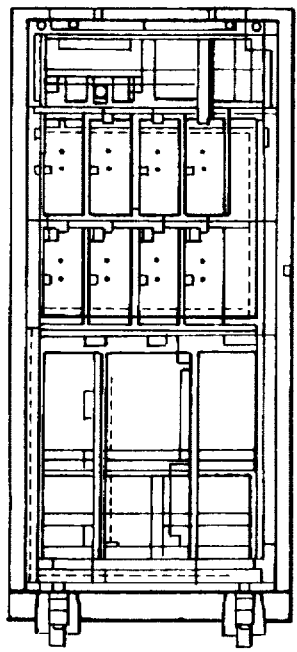

5,796,580

AIR-COOLED INFORMATION PROCESSING APPARATUS HAVING COOLING AIR FAN, SUB-FAN, AND PLURAL SEPARATED COOLING AIR FLOW CHANNELS

BACKGROUND OF THE INVENTION

1. Field of the Invention

The present invention relates to an information processing apparatus having a function of processing and storing information such as a computer, a filing device, a communication control unit and a channeling unit, and more particularly, to an air-cooled information processing apparatus forcedly cooled by air.

The present invention also relates to a cooling structure for electronic apparatus, suitable for cooling an electronic circuit board loaded in an electronic unit, and more particularly to a cooling structure for local cooling of electronic apparatus using an improved slit jet duct.

2. Description of the Related Art

Generally, an information processing apparatus is composed of a casing which accommodates various units such as a central processing unit (CPU), a substrate equipped with LSI chips such as memory, a storage unit and a power supply. These units generate heat when operating. In general, operating temperature ranges, i.e., temperature specifications, are determined for this type of electronic unit. It is, therefore, necessary to cool inside the casing in order to maintain the temperature inside the casing within the temperature range determined by the specifications. In particular devices or units such as CPUs, semiconductor integrated circuit devices, hard disk-type storage devices and so forth require specific consideration in regard to cooling, in order to maintain the operation temperatures within optimum ranges which are generally limited in these devices or units.

An information processing apparatus may be cooled by a water- or air-cooling method. The former needs a water supply, drainage equipment, pipes, heat exchanger and pump, etc. Thus, water-cooled apparatus involves problems or shortcomings such as greater scale of the apparatus itself, necessity of a large space required for installing a heat exchanger, etc. even within the apparatus to be cooled, risk of accidents such as leakage of cooling water, and necessity of protective maintenance for preventing such an accident. Necessity of water supply and drainage functions restricts the installation and impairs the mobility of the whole apparatus. In contrast, in the air-cooling method, there are no such problems. Therefore, in recent years, there is an increasing demand for air-cooling systems even in relatively large capacity information processing apparatuses such as those larger than workstations.

Generally, an air-cooled apparatus has a cooling air inlet and an outlet provided in a wall of a casing, and a fan arranged on either the inlet or the outlet.

Cooling in this air-cooled apparatus is performed by driving the fan which induces flow of air into the casing to cool the internal units and exhausts the air outside the casing.

Arts concerning air-cooling of information processing apparatuses are disclosed in, for example, Japanese Unexamined Patent Publication Nos. 63-108800 and 2-82693, as well as in Japanese Unexamined Utility Model Publication Nos. 62-10495 and 1-157492. More specifically, Japanese Unexamined Patent Publication No. 63-108800 discloses a cooling system in which the interior of the casing forms a portion of a cooling air channel, while Japanese Unexamined Patent Publication No. 2-82693 discloses an art in which suction means and a draft fan are provided for causing cooling air to flow between the exterior and interior of the casing, and partition walls are provided in the casing to cause the air to shunt and cool the internal units. Japanese Unexamined Utility Model Publication Nos. 62-10495 and 1-157492 disclose cooling arrangements in which a circuit board as a source of heat is cooled by a cooling fan which is provided upstream of a package in which the circuit board is packaged.

Current information processing apparatuses employ greater numbers of components or units than ever to meet the demand for diversification of functions. It is also a current trend that, in order to attain higher performance of the apparatus, circuit elements such as semiconductor integrated circuit devices are densely arranged on a board of a given size, resulting in a greater rate of generation of heat. Furthermore, current information processing apparatuses are required to deal with greater quantities of information and, hence, to have storage devices of greater storage capacity. Such storage devices of large storage capacity is realized by, for example, a disk array incorporating a multiplicity of hard disk devices. In order to improve the reliability of the whole information processing apparatus, these hard disk devices are kept under strict operation temperature specifications.

Known forced air cooling techniques could meet these demands only by increasing the number of cooling air fans or by replacing existing fan units with a fan having greater power so as to increase the flow rate of the cooling air.

These countermeasures are unsatisfactory in the following respects: namely, increase in the number of fans or replacement of the fan with a fan having greater power raises the level of noise, while increasing electrical power consumption and production cost, as well as the rate of air discharged, thus impairing the office environment. In addition, no specific consideration is given in the known countermeasures to the relationship between the pattern of flow of cooling air inside the apparatus and the temperature specifications of the unit to be cooled. Consequently, insufficient cooling occurs at local portions of the apparatus. Such local cooling insufficiency may be eliminated when the number of fans is further increased. The use of a greater number of fans, however, enhances the aforesaid problems such as increase in the noise, power consumption, cost and rate of discharged air.

Japanese Unexamined Patent Publication No. 61-85899 discloses a cooling system for cooling electronic devices in which electronic circuit boards or devices as heat generators are encased in a casing and are simultaneously cooled by a cooling air fan which is so arranged as to generate flow of cooling air across the group of electronic circuit boards from front to rear side or from upper to lower side of the group of the electronic circuit boards.

Japanese Unexamined Patent Publication No. 64-28896 discloses another cooling system which is suitable for use in the case where there are electronic devices which produce at different rates. This cooling system employs, in addition to a common air cooling arrangement using a common fan, a specific arrangement for concentrating cooling air to electronic devices which generate heat at large rates. Such a cooling air concentration means is usually realized by a duct which covers almost the entire area of the electronic circuit board to be specifically cooled, and jetting cooling air against such an electronic circuit board from a nozzle or nozzles connected to the duct.

The cooling system of the type disclosed in Japanese Unexamined Patent Publication No. 61-85899, which employs a common cooling arrangement for cooling a plurality of electronic devices regardless of the heat generating rates, exhibits only a low cooling efficiency because certain portion of the cooling air is discharged without effectively taking part in the cooling. This cooling system, when applied to an apparatus which contains one or more electronic devices having specifically large rates of heat generation, requires that the rate of supply of the cooling air is increased to cool down such electronic devices, leading to increase in the noise of air in the fan and in the duct.

The cooling system of the type disclosed in Japanese Unexamined Patent Publication No. 64-28896 also has a drawback in that large and complicated ducts are required to realize the cooling air concentration means and, therefore, could not suitably be used in concentrated air cooling of a plurality of electronic circuit boards or devices.

Known information processing apparatuses, particularly those which are large in scale, employ front panels which are made of steel. Such a front panel is usually provided with peripheral tabs or flanges which serve as a reinforcer and which provide means for adapting the front panel to the apparatus casing. The peripheral flanges are effective in enhancing rigidity of the panel in longitudinal and breadth-wise directions but cannot sufficiently stiffen the panel against distortion which may occur about diagonal lines. It is possible to stiffen the front panel by providing ribs on the back side of the panel or by increasing the thickness of the panel. Such countermeasures, however, are not recommended because the weight of the front panel is undesirably increased and hampers the handling of the front panel in protective maintenance work. When the front panel is supported for movement between open and close positions by, for example, a hinge, the increased weight of the front panel requires greater and stronger supporting structure. In addition, a front panel made of steel can have limited variation in the design due to inferior workability of the steel. Forming a large front panel with a resin requires a large mold, resulting in a rise in the production cost.

Casings of electronic apparatuses such as computers or communication apparatuses generally have elongated box-like form in order to facilitate installation on a floor or in order to attain good harmonization of appearance with other apparatuses. The casing is usually composed of a box-like casing body and a thin front panel which covers the open front side of the box-like casing body, in order to meet requirements from the view point of ease of maintenance and design appearance.

In most cases, the casing body is formed by sheet work from steel sheets in order to attain required strength and shield against electric wave. The front case is molded from plastics in the case of small-sized apparatuses, whereas, in large-size apparatuses, the front panel is formed by sheet work from a steel sheet.

In a cooling system having a single flow path of cooling air, the air is made to flow along various complicated channels according to flow resistances posed by different devices or components in the computer casing. Consequently, insufficient cooling, as well as excessive cooling, takes place at various local portions in the computer casing, so that the whole cooling system exhibits inferior cooling efficiency. Cooling systems also are known in which independent cooling means such as fans are used for different heat-generating components. Cooling systems of this type suffer from disadvantages such as rise in the cost due to use of many fans, as well as complication in the construction of the cooling system and increased level of noise.

In order to overcome these problems, a technique is disclosed in, for example, Japanese Unexamined Patent Publication No. 2-82693, in which an electronic apparatus such as a computer is cooled by air which flows through multiple paths. This technique, however, employs a suction means and a fan which causes flow of air between exterior and interior of the casing, and partition walls are provided in the casing so as to define multiple paths. This known technique therefore is still unsatisfactory from the view point of reduction in the noise level and improvement in the cooling efficiency. Various other techniques also have been proposed in regard to cooling of electronic apparatuses. For instance, Japanese Unexamined Patent Publication No. 63-108800 discloses an art which uses a double-walled casing. Japanese Unexamined Utility Model Publication Nos. 62-10495 and 1-157492 disclose an art in which a cooling fan unit box with slits is disposed upstream of a space between heat-generating boards. These known techniques, however, employ only one path of flow of cooling air through the casing or a cooling fan is integrated with the circuit boards by means of air guides, failing to meet the demands for lower noise level and higher cooling efficiency.

SUMMARY OF THE INVENTION

Accordingly, it is a first object of the present invention to provide an air-cooled information processing apparatus in which, using a cooling system of a limited capacity, devices and components in the apparatus are adequately cooled by forced air cooling, without being accompanied by a rise in the production cost while suppressing increase in the noise, discharge air flow rate and electric power consumption.

It is a second object of the present invention to provide an air-cooled information processing apparatus in which, despite a dense arrangement of devices or units such as heat-generating boards, e.g., IC chips and LSI packages, hard disks, power supply units and so forth, these devices and units can be efficiently cooled to ensure high reliability of the whole apparatus without raising the level of noise.

It is a third object of the present invention to provide a casing structure for electronic apparatuses in which the rigidity of a front panel is enhanced to reduce distortion, while enabling divesification of the design.

It is a fourth object of the present invention to provide an electronic apparatus cooling structure which has a simple construction occupying only a small space and yet capable of providing a high cooling efficiency while enabling local concentration of cooling effect to portions where electronic devices having specifically large rates of heat generation are installed.

In order to achieve the first object, according to one aspect of the present invention, there is provided an air-cooled information processing apparatus having a plurality of units and a casing accommodating the units, comprising: at least one cooling air supply section and at least one cooling air discharge section provided in the casing; a partition member dividing the space inside the casing so as to define at least two cooling air flow channels between the cooling air supply section and the cooling air discharge section; and at least one main fan unit disposed in each of the cooling air flow channels; wherein, the at least two cooling air flow channels include at least one first cooling air flow channel in which at least two units from among the plurality of units are disposed in parallel with each other with respect to the direction of flow of cooling air, and at least one second cooling air flow channel in which at least two units from among the plurality of units are arranged in series to each other along the flow of cooling air.

An assistant cooling device may be provided for enhancing cooling effect on at least one preselected unit of the units disposed in the first cooling air flow channel. The assistant cooling device may be a sub-fan for supplying cooling air to the preselected unit.

The preselected unit may be a main processing unit including at least one processor, a group of memory devices, a plurality of boards carrying the memory devices and support members which support the boards in a substantially rectangular parallelepiped space. In this case, the sub-fan is disposed at the end of the main processing unit adjacent to the cooling air supply section.

One of the units disposed in the second cooling air flow channel may be a storage device unit having a plurality of storage medium driving devices, disposed at an upstream portion of the second cooling air flow channel.

The cooling air supply section may includes an outer wall portion having a first cooling air inlet and forming part of the outer wall of the casing, and an inner wall portion having a second cooling air inlet and spaced apart from the outer wall portion so as to define a channel therebetween; the first inlet and the second inlet do not overlap each other when viewed in the direction normal thereto.

The main fan unit in the first cooling air flow channel may be disposed at the discharge end of the first cooling air flow channel.

The main fan unit in the second cooling air flow channel may be disposed at the supplying end of the second cooling air flow channel.

The suction port of the main fan unit of the second cooling air flow channel may be disposed downstream of the second air inlet of the air supply section, and a baffle member may be disposed in the space between the suction port and the second air inlet such that one of the suction port and the second air inlet is hidden behind the baffle member when viewed in the direction of flow of air.

Part of the space between the inner wall portion and the outer wall portion of the air supply section may be filled with a silencing material.

Although the first cooling air flow channel contains units which are arranged in parallel with one another, the invention does not exclude provision of any unit or units arranged in series to the parallel units in the first cooling air flow channel. Namely, the first cooling air flow channel may contain a plurality of units which are arranged in parallel and additional units which are arranged in series to such parallel units at the downstream side of the parallel units. Similarly, the invention does not exclude any parallel arrangement in the second cooling air flow channel, although the second cooling air flow channel has been described to essentially contain series connection of units. For instance, a pair of units which are parallel to each other may be disposed in series to another unit in the second cooling air flow channel.

The casing accommodating a plurality of units has at least one air supply section and at least one air discharge section for supplying cooling air into and discharging the warmed cooling air from the interior of the casing.

Thus, the space inside the casing communicates with the ambient air only at these portions. By minimizing the number of the portions which provide communication between interior and exterior, it is possible to suppress radiation of noise to the exterior of the casing, and to efficiently intake and discharge cooling air by fewer fan units.

According to the invention, a member which materially forms a partition divides the space inside the casing so as to form at least two cooling air flow channels. At least one main fan unit is disposed in each cooling air flow channel. With this arrangement, it is possible to optimize the flow rates of cooling air along each cooling air channel.

Preferably, the units arranged in parallel with one another within the first cooling air flow channel have cooling temperature specifications which are close to each other and which have comparatively small cross-sectional areas as viewed in the direction of flow of the cooling air. With this arrangement, the units can efficiently be cooled with fresh cooling air which is still low in temperature.

In the second cooling air flow channel, units to be cooled are arranged in series along the channel. These units therefore are supplied with cooling air at an equal rate. Consequently, the units which are in a downstream portion of the channel receive cooling air which has been heated to higher temperature by the heat dissipated from the upstream units. Preferably, therefore, the units in the first cooling air flow channel are so arranged that the units which have lower upper limit temperatures and which require sufficient cooling are disposed upstream of units which have higher upper limit temperatures. With this arrangement, it is possible to efficiently cool the series units at moderate rates by a common main fan unit.

It is possible to use an assistant cooling device for a specific unit or units out of the plurality of units so as to enhance cooling effects on such unit or units. The assistant cooling device may be, for example, a sub-fan which increases the velocity of cooling air directed to the specific unit or units so as to enhance the cooling effect.

When the air supply section has a double-walled structure, it is possible to suppress direct external emission of noise generated by the fan inside the casing.

The units arranged in parallel in the first cooling air flow channel may be stacked one on another. Similarly, the units arranged in series within the second cooling air flow channel may be stacked. Such a stacking of units makes it possible to efficiently dispose many units within the limited space inside the casing, while ensuring that cooling air is distributed to all these units.

In order to achieve the second aspect, i.e., to realize an air-cooled information processing apparatus which can be efficiently cooled with reduced noise despite dense arrangement of units, the present invention in its another aspect provides an air-cooled information processing apparatus having heat-generating units such as IC chips and LSI packages, comprising: at least two cooling air flow channels through which cooling air flows to cool the heat-generating units; and a cooling air fan disposed in each of the cooling air flow channels, the cooling air fan being disposed between adjacent heat-generating units arranged along each cooling air flow channel.

The second aspect of the invention can be realized in various ways. For instance, the cooling air outlet of each of the channels can be provided in the lower surface of the air-cooled information processing apparatus. In another form, the cooling air fan is disposed in each of the cooling air flow channels at a bend of the cooling air flow channel. The portions of the casing providing air inlet and outlet are preferably double-walled. It is also possible to provide an additional cooling air fan for the purpose of local cooling.

It is also possible to arrange such that the circuit board itself form a part of the duct having restricted slit-like inlet and outlet, the outlet of the duct being disposed at the suction side of the cross-flow fan.

The speed of the motor driving the cross-flow fan may be varied in accordance with the output of an air temperature sensor disposed in the vicinity of the suction end of the fan.

The cooling air fan may be a commercially available through-flow fan. In such a case, the fan is arranged at a predetermined inclination.

The CPU unit which is the core part of the apparatus may have a duct-like structure part of which is presented by an electronic circuit board. In such a case, a slide rail, lever and a guide pin are provided on the CPU unit.

The hard disk device as data storage means may be constructed as a unit, with irregular spacing between adjacent hard disks. Such a hard disk unit is provided with a slide rail and a connector.

Preferably, the air discharge port is provided in the bottom of an electronic device, and a punched member of 2 mm diameter, 4 mm diameter is provided in the air discharge port.

It is also possible to use a common lever or separate levers as a jig or jigs for mounting and demounting the packages. Such jigs are preferably accommodated in the casing of the apparatus.

The air supply section may have a dual port arrangement in which a pair of inlet ports are provided so as not to overlap each other.

To achieve the third object, the present invention in its third aspect provides an air-cooled information processing apparatus having a casing including a casing body and a front panel which forms a front wall of the casing and which is made of a steel sheet, the front panel being recessed at its central portion leaving flat surfaces at both longitudinal ends thereof, the casing further including a resin mold part received in the recessed central portion of the front panel.

The front panel may have a gate-shaped continuous flattened region including one longitudinal end portion and both lateral side portions of the front panel. The resin mold part may have such a curved surface that concaves at its central portion with both end portions flush with the front panel. It is possible to provide a decorative pattern consisting of convexities and concavities on the curved surface of the resin mold part. An indicating means may be provided on a flat surface which is presented at one longitudinal end of the resin mold part.

At least the surfaces of the front panel and the resin mold part may be painted with achromatic colors of different color tastes.

The resin mold part may have at least two small panels which are arranged side by side in the longitudinal direction. At least one of the small panels may be a bezel of a storage device.

In a preferred form of the invention, the power storage battery is disposed in the vicinity of the bottom of the apparatus so that the weight center of the electronic device is set to a level below the level of the centroid of the whole apparatus.

By using two or more cooling air flow channels, while adopting various measures such as installation of the cooling fan between adjacent heat-generating elements, disposition of the cooling air discharge port in the bottom of the apparatus, isolation of cooling fans from each other and double-walled structure of the casing, it is possible to effectively suppress the rise of air temperature inside the casing and to develop uniform temperature distribution over heat-generating units, thus reducing the power for driving the fans, as well as noise.

Space factor inside the casing also can be improved by installing the cooling fans at the bends of two or more cooling air flow channels or by installing a commercially-available through-flow fan at an inclination, thus reducing the size of the casing and the production cost of the apparatus, while attaining excellent cooling effect.

The invention can be carried out in various forms such as the use of a local cooling fan unit for cooling a unit which generates heat at a specifically large rate. It is also possible to arrange such that the circuit board itself forms part of the duct having restricted slit-like inlet and outlet, the outlet being disposed near the suction end of the cross-flow fan. It is also possible to construct such that the package circuit boards are arranged in the direction of flow of the cooling air through the duct. These arrangements offer effective supply of cooling air so as to ensure high degrees of reliability of operations of the devices or units such as the circuit boards carrying IC chips and LSI packages, hard disk device, power supply unit and so forth.

The speed of the motor driving the cross-flow fan may be varied in accordance with the air temperatures sensed at the fan inlet by means of a temperature sensor of a control package. The speed control is conducted such that the speed of the fan is reduced when the sensed air temperature is low and increased when the same is high, so that wasteful supply of cooling air is avoided and the noise of the fan is reduced, thus attaining noise reduction of the whole computer apparatus.

In the arrangement in which the CPU unit as the core part is constructed as a duct a part of which is formed of an electronic circuit board, it is possible to suppress temperature rise of the high-temperature portion of the CPU, thus contributing to improvement in the reliability of the semiconductors. In addition, demounting and mounting of the CPU unit can quickly be done by virtue of the slide rail, lever and the guide pin provided on the CPU unit having the duct-like structure. This permits an easy addition of the processing unit, as well as enhancement of the computing performance, thus providing an effective measure for maintenance and enhancement.

In one form of the invention, the hard disk device as data storage means is constructed as a unit, with irregular interval between adjacent disks. A slide rail and a connector are provided on such a hard disk unit. This arrangement enables easy distribution of cooling air to the heat-generating elements downstream of the hard disk unit, while shortening the time required for demounting and mounting of the hard disk unit. It is therefore possible to add disks and to increase the storage capacity simply by replacing the hard disk unit. This arrangement therefore constitutes an effective measure for easy maintenance and enhancement.

In one form of the invention, a punched member of 2 mm and 4 mm in diameter is provided in the air discharge port which is provided in the bottom of the electronic device. With this arrangement, the cooling air after cooling can be discharged from the entire area of the air discharge port, which decelerates velocity of the discharged air to eliminate generation of noise which otherwise may be caused due to collision of the discharged air with the floor, thus contributing to reduction in the noise.

Common or separate levers as jigs for mounting and demounting the packages may be installed inside the casing of the apparatus. Such jigs shorten the time required for demounting and mounting, thus ensuring that the protective maintenance is carried out without fail.

The air intake or supply port may have a dual hole arrangement having a pair of ports which are arranged so as not to overlap each other. One of these ports is provided in the panel cover. This arrangement effectively prevents direct emission of noise to the exterior from the interior of the electronic device.

In a specific form of the invention, the weight of the power storage battery is so taken into consideration that the battery is situated near the bottom of the electronic apparatus at a level below the level of the centroid of the apparatus. This arrangement enhances the stability of the electronic apparatus to keep the apparatus upright even in the case of, for example, an earthquake.

Furthermore, according to the present invention, a resin mold part is mounted in the central recessed portion of a front panel, thus stiffening the front panel against warp about diagonal lines. The resin mold part, which has a size smaller than that of the front panel, can have a variety of designs.

It is possible to provide the resin mold part with a cushioning or bumper function. Any decorative pattern composed of convexities and concavities further enhances the strength of the front panel.

The front panel and the resin mold part may be colored in achromatic colors of different color tastes. Such coloring of the front panel and the resin mold part provides good harmony between the apparatus and the environment in which the apparatus is installed, while eliminating necessity for consideration of discord of colors due to difference of colors between the steel sheet and the resin, as well as discord of colors between these two different materials which is enhanced due to difference in the rate of color degradation between these materials.

In a specific form of the invention in which the resin mold part is composed of two or more small panels arranged side by side in the longitudinal direction, it is possible to reduce the size of the resin mold part and, by using the bezel of the storage means as one of the small panels, it is possible to obtain a plurality of types of apparatuses which are basically the same in construction but have diversified functions.

In order to achieve the fourth object of the present invention, the present invention in its fourth aspect provides a cooling structure for cooling semiconductor devices in a casing by using a duct structure which has a plurality of slit-like openings. In a preferred form, the shapes of slit-like openings are varied corresponding to difference in the rate of heat generation between different units such as memory units. Uniform temperature distribution is obtained over many units such as memory units, by providing a local cooling fan in the duct or constructing the duct in a partly demountable manner.

With the arrangement in accordance with the fourth aspect of the invention, it is possible to simultaneously cool a plurality of circuit boards. In addition, the duct can easily be mounted on and demounted from the casing. It is thus possible to obtain a cooling system which is quite useful from the view point of packaging. Variation in the shape of the slit-like openings in the duct makes it possible to supply cooling air at different rates to different semiconductor devices which generate heat at different rates, thus making it possible to cool the semiconductor devices to develop uniform temperature distribution.

BRIEF DESCRIPTION OF THE DRAWINGS

FIG. 4 is an exterior front view showing one embodiment of the present invention;

FIG. 5 is an exterior rear view showing one embodiment of the present invention;

FIG. 47A is a plan view of a package constituting one part of DC/DC converter to be used in one embodiment of the present invention, FIG. 47B is a side view thereof and FIG. 47C is a front view thereof;

FIGS. 74A–74D are plan, front and side views of a computer showing one embodiment of the present invention;

DESCRIPTION OF THE PREFERRED EMBODIMENTS

The preferred embodiments of the present invention will be described with reference to the accompanying drawings. The overall structure will be described first followed by a detailed description.

1. Overall structure

An information processing apparatus embodying the present invention comprises the following components or units: a main processing unit including a high-speed RISC (reduced instruction set computing) processor with a cache memory, a main memory, a system bus connecting them and a controller; a storage unit having a plurality of hard disk storage elements; a communication unit; a power supply unit; and a cooling device, etc.

A description will be given of the overall structure, beginning with illustration of configuration of the embodiment, followed by descriptions of the external structure of the casing and the mounting of units in the casing.

1.1. System configuration

Figure 1:
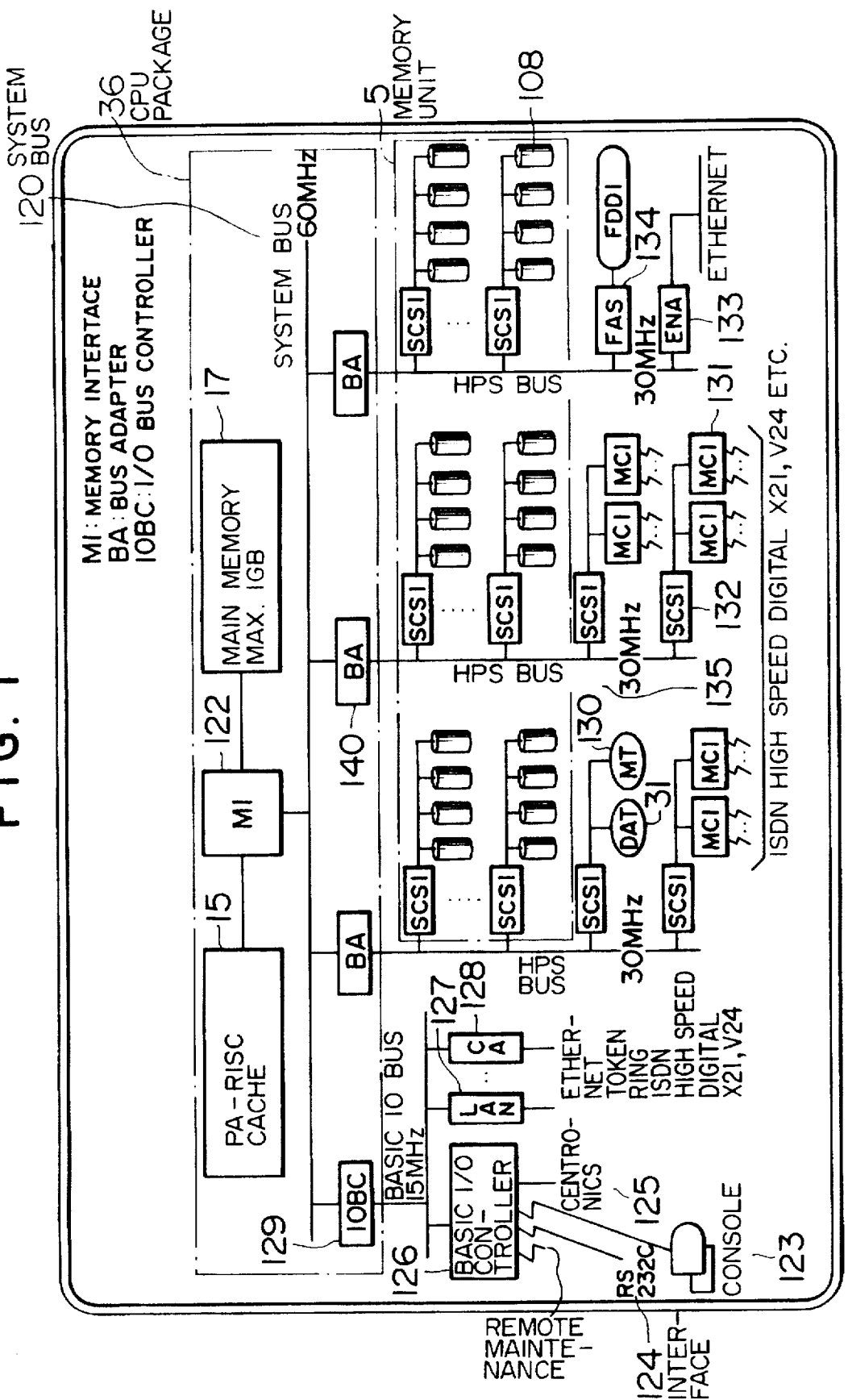
FIG. 1 is a block diagram of a system outline of a computer showing one embodiment of an information processing apparatus of the present invention.

FIG. 1 shows a system outline of a computer of one embodiment of an information processing apparatus according to the present invention. This embodiment comprises: a CPU package (CPU base board); a basic I/O controller 126 interconnecting and controlling a console 123 and RS 232C interface 124/centronics interface 125; a memory unit 5 (also referred to as an HDD unit) having a plurality of HDD (hard disk drive) devices 108 arranged in an array therein; SCSI (small computer system interface) controller 132 interconnecting and controlling DAT (digital audio tape recorder) device 31, MT (magnetic tape recorder) device 130 and MCI (multiple communication interface controller) 131; and HPS (high performance server) bus 135 interconnecting and controlling ENA (Ethernet adaptor) 133 which is an Ethernet LAN (local area network) connect adaptor, FDDI (fiber distributed data interface) connect adaptor FAS (FDDI adaptor single attachment) 134, SCSI 132, ENA 133 and FAS 134.

The CPU package 36 contains a high-speed RISC processor module 15 involving a cache memory, a mass main memory 17 for processing program and data, a system bus 120 interconnecting the RISC processor and various peripheral controllers; an MI (memory interface) 122 which is a controller of the system bus 120 and the main memory 17; an IOBC (I/O bus controller) 129 connected to LAN 127 and CA (communication adaptor) 128 to control them; and BAs (bus adaptors) 140 connected to HPS buses 135 to control them.

Figure 2:
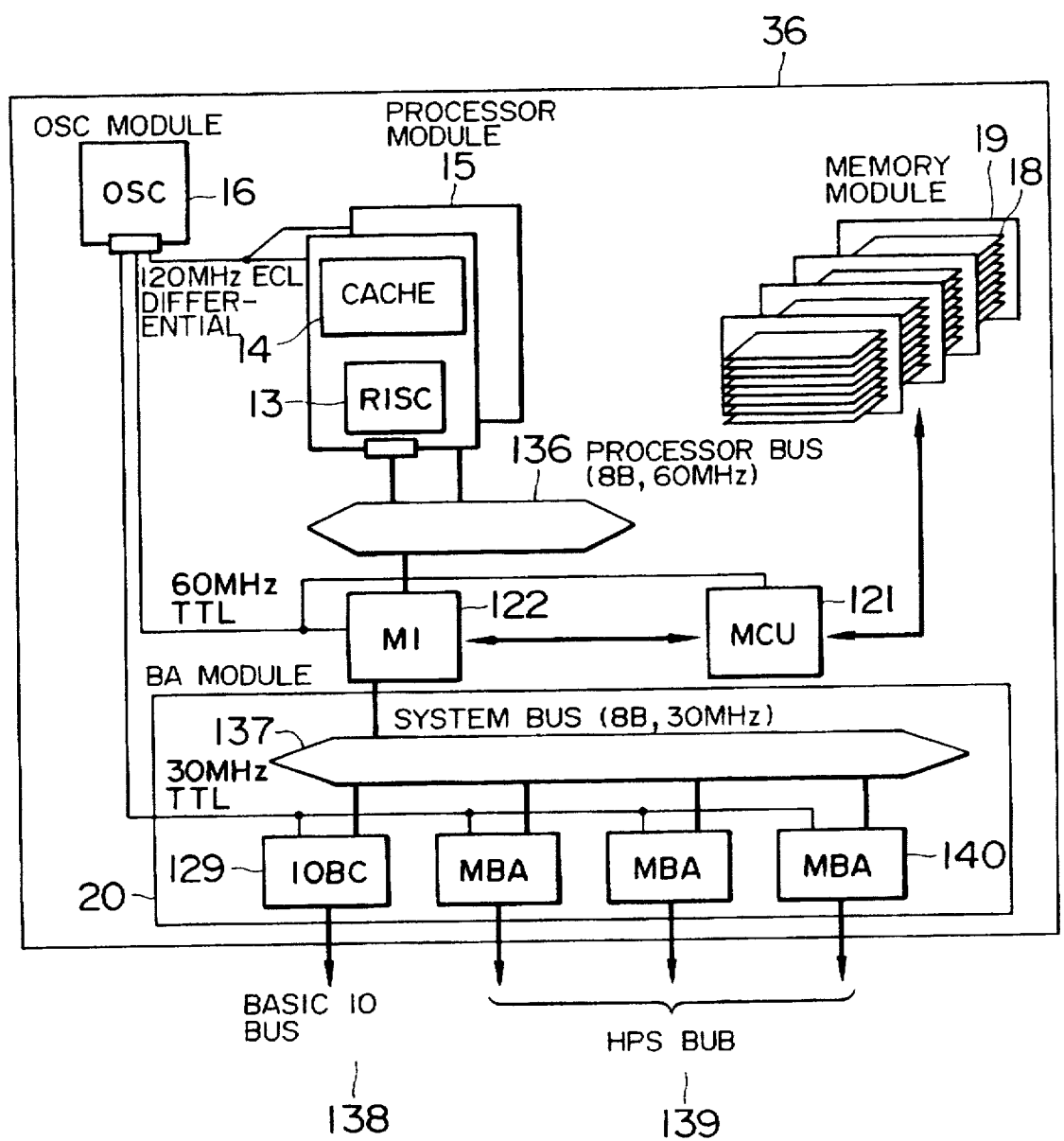
FIG. 2 is a schematic diagram of a CPU portion of a computer showing one embodiment of the present invention.

FIG. 2 schematically shows a logic of a CPU package 36, which is a main processing unit. The following components are mounted in the CPU package (CPU base board) 36: the RISC processor module 15, MS (main storage) middle card (memory module) 19, OSC (oscillator) package (OSC module) 16 and BA package (BA module) 20, as well as the MCU (memory control unit) 121, processor bus 136 and MI (memory interface) 122 controlling the system bus 137.

The RISC processor module 15 has a high-speed RISC chip package 13 and a mass cache memory 14, and is connected to a processor bus of 8 byte/60 Mhz.

The MS middle card 19 has four blocks, each containing. Eight sheets of MS package 18 (memory sub module), and is connected to MCU 121.

The OSC package 16 mounts a high-speed transmitting circuit and distributes clocks to respective modules.

The BA package 20 is connected to a system bus of 8 byte/30 Mhz, and has IOBC 129 interconnecting and controlling the basic IO bus 138 and BAs 140 interconnecting and controlling HPS bus 139.

1.2 External structure of the casing

Figure 3:
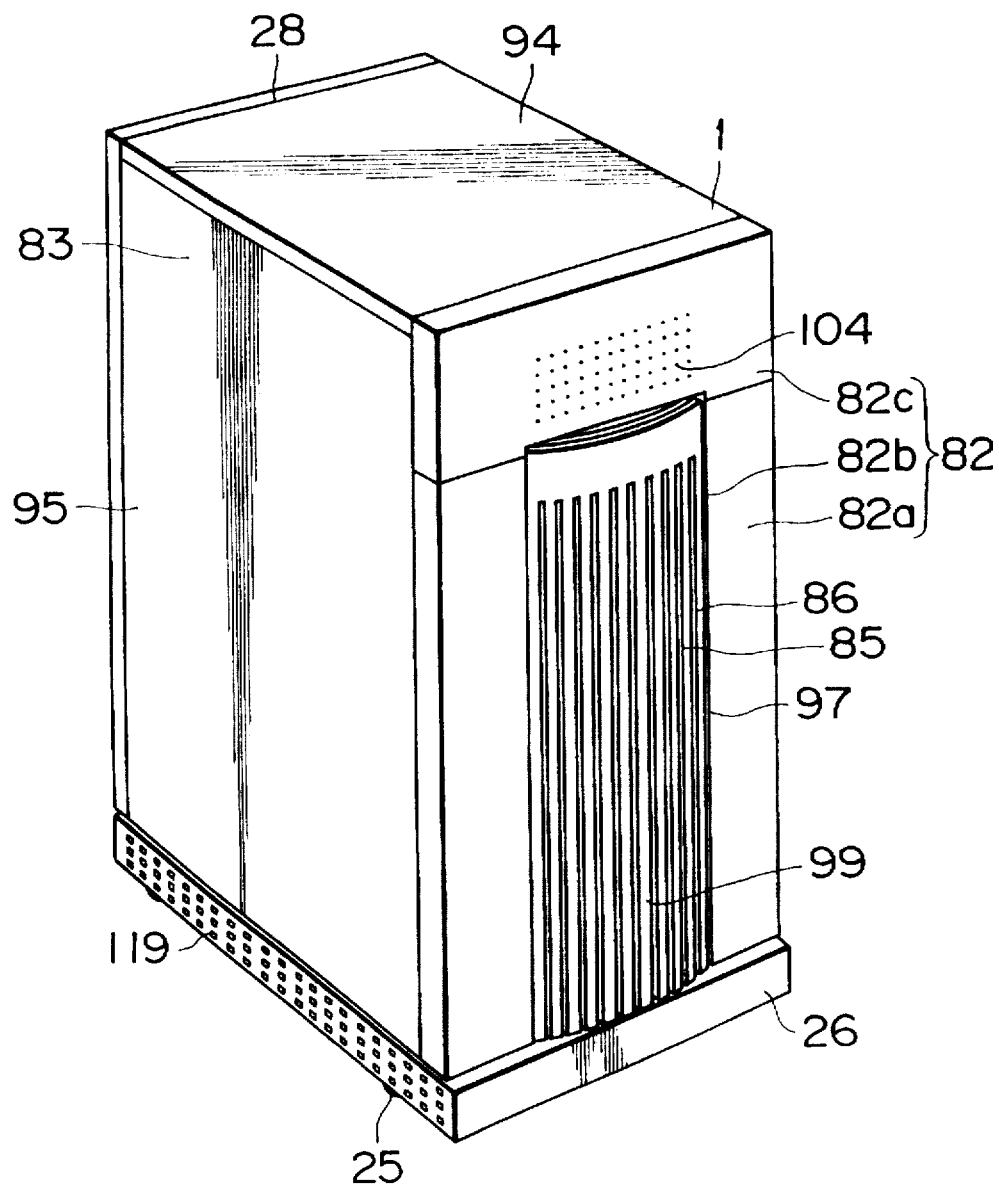
FIG. 3 is an exterior perspective view of a computer showing one embodiment of the present invention.
Figure 6:
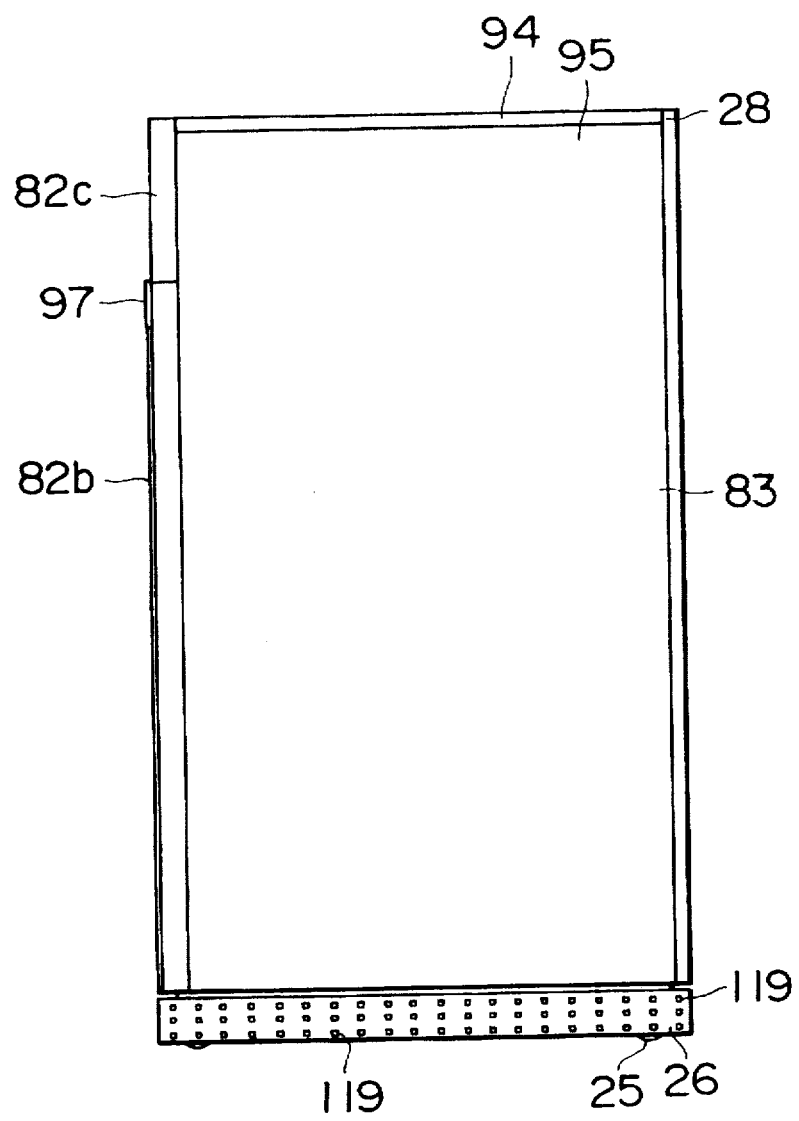
FIG. 6 is an exterior right side view showing one embodiment of the present invention.
Figure 7:
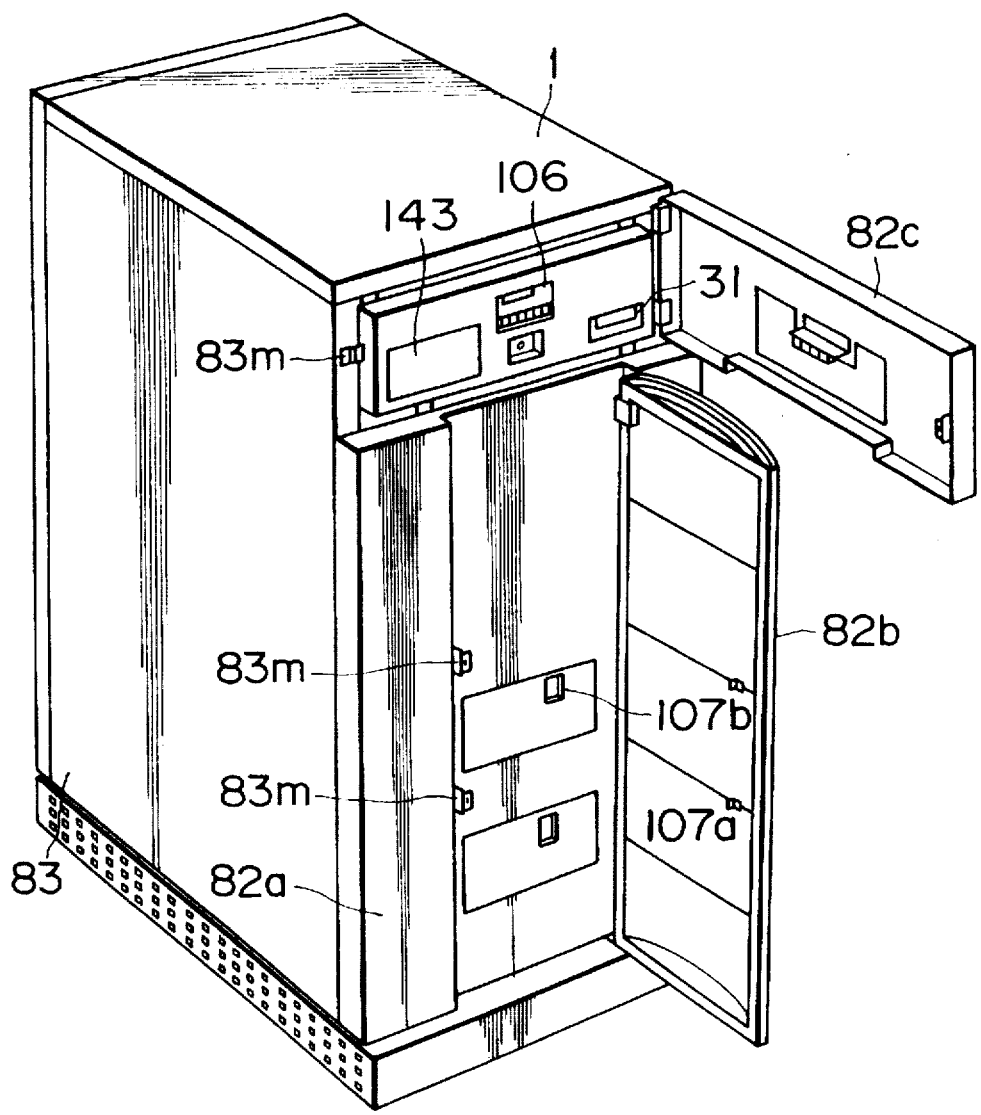
FIG. 7 is a perspective view of an opening condition of a front panel of the computer showing one embodiment of the present invention.

FIGS. 3 to 6 are external views showing one embodiment of the computer of the present invention. FIG. 3 is a perspective view of a casing 1 of the computer. FIG. 4 is a front view; FIG. 5 is a rear view, and FIG. 6 is a right side view thereof. FIG. 7 is a perspective view showing an open condition of the front panel of the casing.

The casing 1 has a main body 83 and a front panel 82. The front panel 82 has a fixed panel 82a, a main door panel 82b and a sub door panel 82c. An indicator 104 is formed on the sub door panel 82c for indicating power supply and system running. The main door panel 82b and the sub door panel 82c are formed such that they can move between open and close positions as shown in FIG. 7. A decorative panel 97 is fitted on the front portion of the main door panel 82b. As shown in FIG. 6, the decorative panel 97 is slightly protruded.

FIG. 7 shows an open condition of the main door panel 82b and the sub door panel 82c of the front panel 82. When the sub door panel 82c is opened, operating portions of a control panel 106, a DAT 31, and 8 mm MT (cassette media tape recorder) 143 come out, and they can be operated therefrom. When the main door panel 82b is opened, a main breaker 107a of a power switch 107 and a charging breaker 107b come out. A computer 1000 can be accessed by switching them on.

At the points of contact of the main door panel 82b and the sub door panel 82c of the main body 83 with peripheral portions thereof, seize members 83m are fitted. When the main door panel 82b and the sub door panel 82c are closed, these panels are locked by means of the seize members 83m.

The main body 83 of the casing 1 contains an air supply panel 28 at the rear thereof, side plates 95 at both sides thereof, a top plate 94 at the upper surface, and a base plate 26 at the lower surface thereof. Air vents 105 are provided in the air supply panel 28. The portion of the air vents 105 of the air supply panel 28 constitutes a part of the inlet portion 710, which will be described hereinafter. In this embodiment, the air supply panel 28 also serves as a cable cover.

Skirt plates 26 and casters 25 are provided at the bottom portion of the casing 1. The skirt plates 26 are fitted over the entire surface of the front and both sides and a part of the rear surface. At both side portions of the skirt plates 26, air outlets 119 of, for example, 5 mm square are provided, to secure an air exhausting area. A punched member 27 having a lot of small holes is mounted on the air-outlet portion 750, as described hereinafter.

In this embodiment, the casing 1 is an achromatic color of a gray shade which harmonizes with the installation. And, the color of the front panel 82 and the main body 83 is different from the resin-molded portion 86 adjacent to the front panel. Thus, the casing 1 harmonizes with the achromatic color used in many floors when viewed from a distance. Meanwhile, even though the casing 1 is colored differently in part, it is not necessary to consider the difference in a color of a steel plate and a resin placed adjacently, and due to differences according to the deterioration speed of the materials.

As has been described above, according to this embodiment, magnetic shielding of the units inside the casing 1 can be obtained by forming the entire casing 1 with steel plate.

Since the resin-molded portion 86 is fitted to a depressed portion 85 formed on the decorative panel 97, the distortion of the front panel diagonally can be reduced. Therefore, the rigidity of the casing 1 can be obtained by lightening the weight of the front panel 82.

Further, the casing 1 can be designed in various ways to down-size by miniaturizing the resin-molded portion 86. Therefore, various designs of the casing 1 can be obtained at a low cost.

Still further, protruding the resin-molded portion 86 can provide a bumper function. Strength of the resin-molded portion and the decorative panel 97 can be further improved by forming an irregular pattern on the resin-molded portion 86.

1.3 Mounted structure

Figure 8:
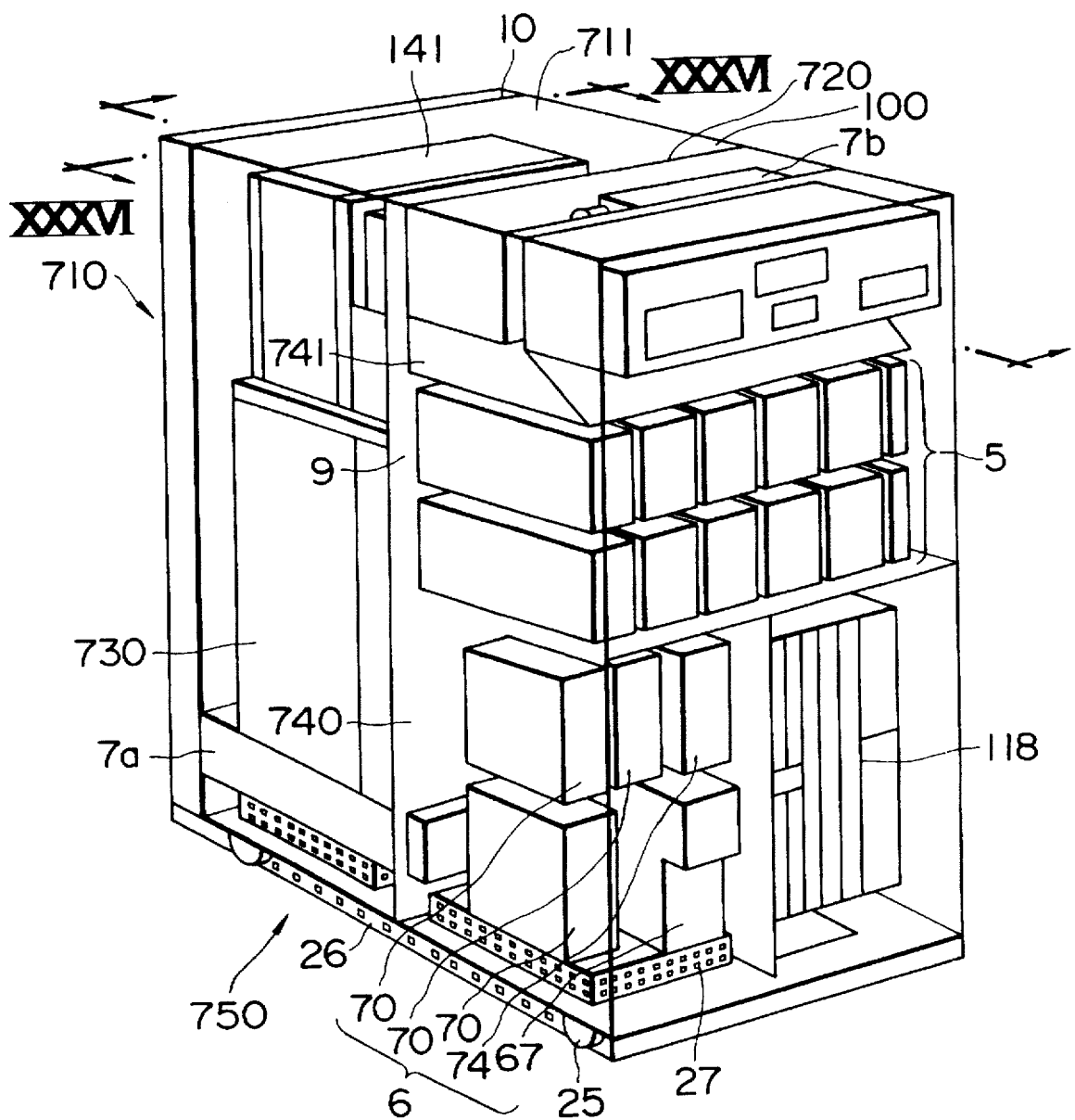
FIG. 8 is a front-side typical perspective view of mounting condition of equipments of the computer showing one embodiment of the present invention.
Figure 9:
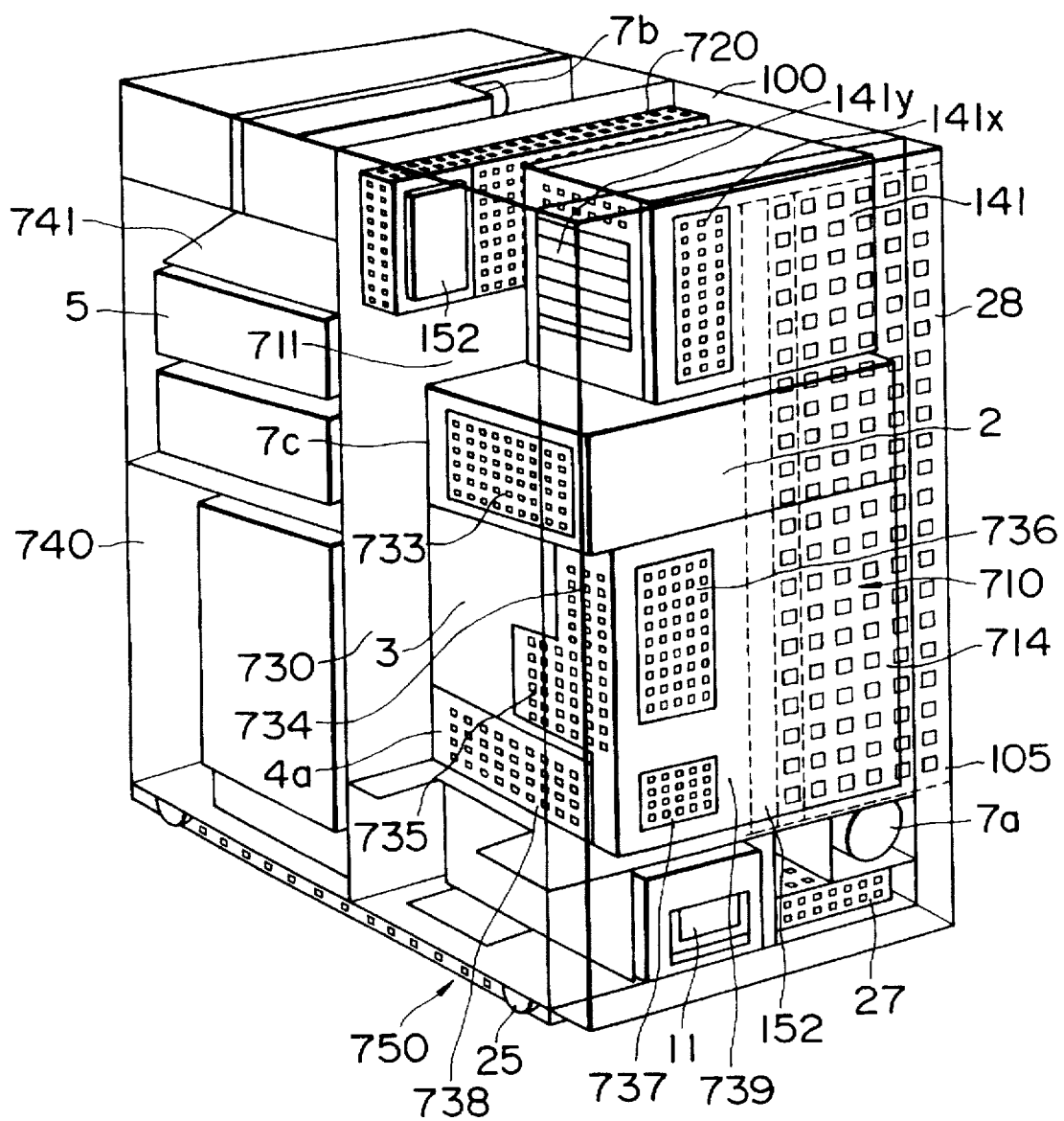
FIG. 9 is a rear-side typical perspective view of a mounting condition of equipments of the computer showing one embodiment of the present invention.
Figure 10:
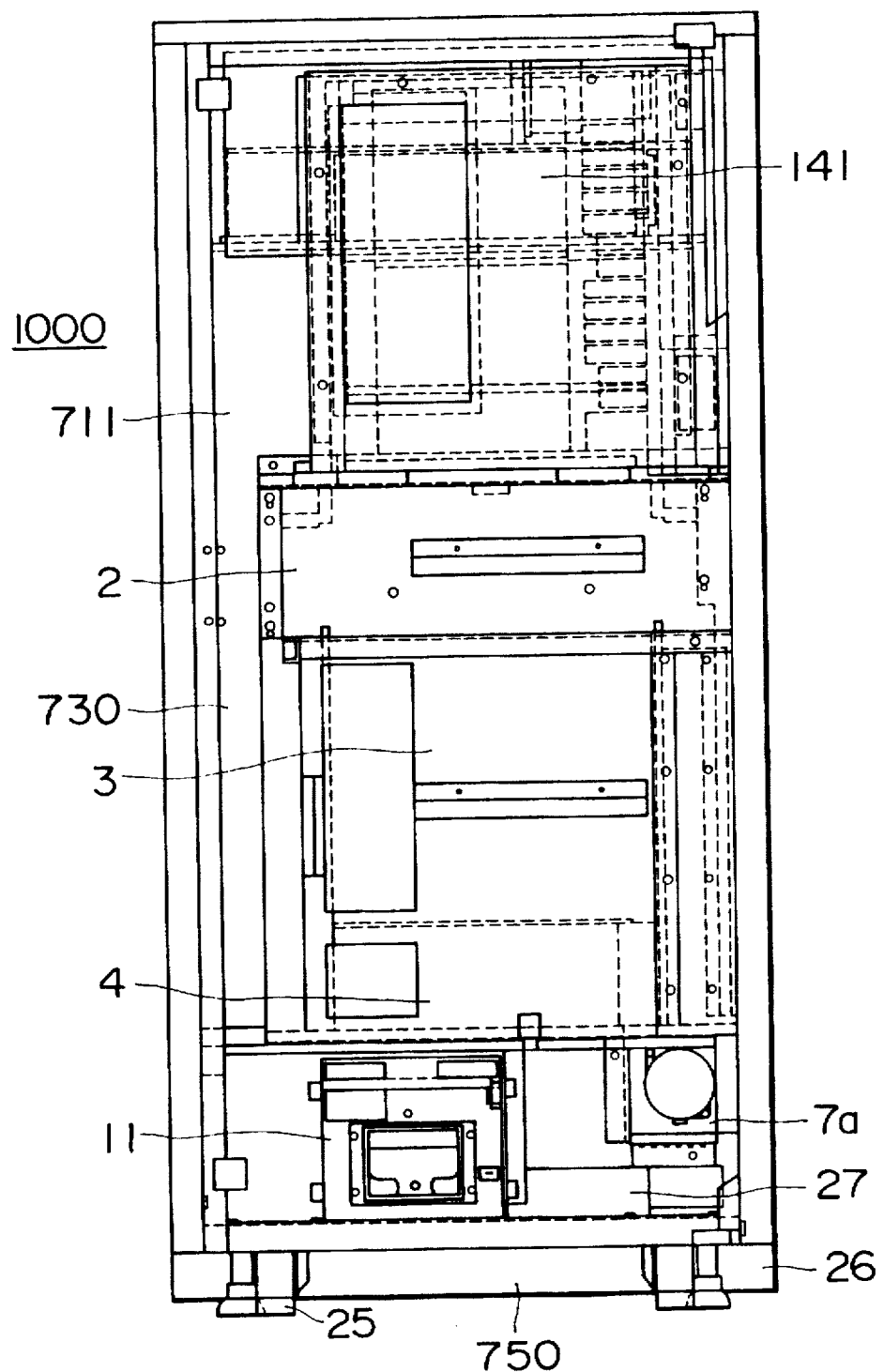
FIG. 10 is a rear view of a mounting condition of equipments of the computer showing one embodiment of the present invention.

The mounted structure of one embodiment of the computer of the present invention is shown in FIGS. 8 to 10. FIG. 8 is a perspective view showing the front of the computer 1000; FIG. 9 is a perspective view showing the rear of the computer 1000; and FIG. 10 is a plan view of the computer 1000.

The computer 1000 contains hardware resources having a system configuration as described above. It is assumed here that hardware resources are discrete components which can be handled independently. Thus, the computer 1000 is regarded as having the following components: a main processing unit (CPU) unit 2 which is the heart of the computer; a basic I/O (input,output) package unit 3; a basic DC/DC converter 4a (FIG. 9); a storage unit (hereinafter also referred to as an HDD unit) 5 for storing information; an AC/DC converter 6 which is an electric supply portion and comprises a plurality of converters; cooling fan units 7a–7c which are cooling devices; a CPU backboard 8 which is an electric and signal intermediary unit; a HDD backboard 9; a circuit unit 118; an extended I/O (input, output) package 141; a cable cover 10 which is a sheath of the casing (FIG. 8); and a battery 11 as shown in FIGS. 8 to 10. Each of the HDD 108 of the storage unit 5 are fixed to the HDD backboard 9.

The cooling fan units 7a–7c are dispersed and composed of the main fan units 7a and 7b serving as main fans, and the sub-fan unit 7c used for local cooling.

Incidentally, units to be loaded can be suitably modified in accordance with the computer's specification. But, forms and sizes of the respective units and the positions thereof in the casing 1 should be determined in advance so that changing the position of the units in the casing 1 can be minimized even when the specification of the computer is modified. And, the cooling system need not be specially modified.

Figure 11A:
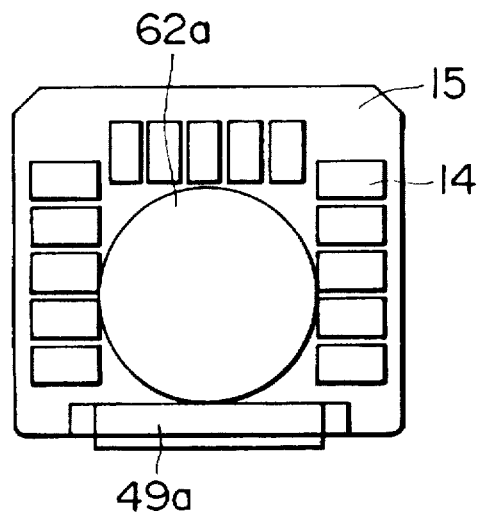
FIG. 11A is a front view showing a mounted RISC (reduced instruction set computing) processor module to be used in the computer of one embodiment of the present invention.
Figure 11B:
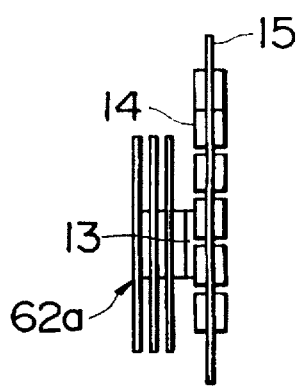
FIG. 11B is a top view thereof.
Figure 12:
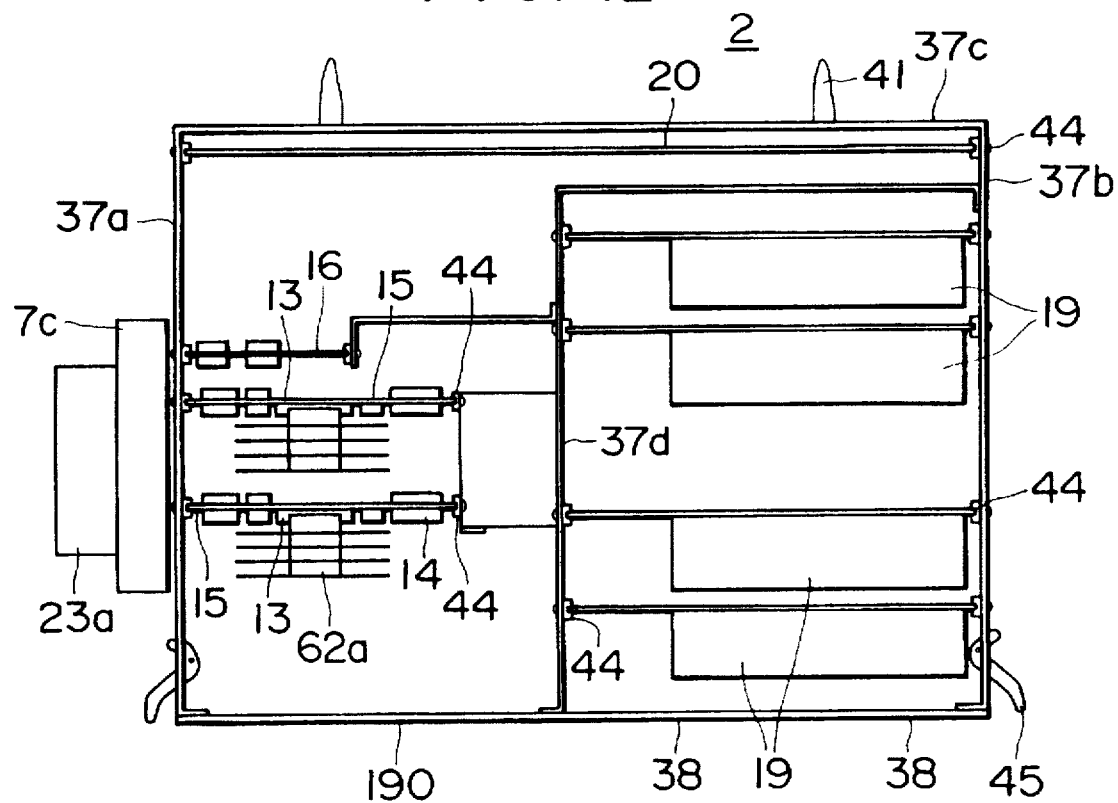
FIG. 12 is a top view showing a structure of a main processing unit to be used in one embodiment of the present invention.

From the viewpoint of mounting, the main processing unit 2 comprises, as shown in FIGS. 11A, 11B and 12, the following packages: an LSI package 12 (MI 122, MCU 121 in FIG. 2) intermediating data exchanges between CPU and the memory; two sheets of RISC processor modules 15 equipped with an RISC chip package and a cache memory temporarily storing data; an OSC package 16 controlling the active frequency of the RISC chip; four sheets of MS middle cards 19 consisting of a main storage; and a BA (bus adapter) package 20 intermediating different signal lines. This BA package 20 contains a connector for transmitting electric signals to the extended I/O package 141. PA-RISC manufactured by Hewlett-Packard may be used as the RISC processor module 15 in the present embodiment. The MS middle card 19 can mount a maximum of eight stages of an MS (main storage) package 18 equipped with large memory capacity on both sides (see FIG. 42).

1.3.1 Entire structure of the cooling system

The entire structure of the cooling system for cooling units according to this embodiment will be described.

Figure 64:
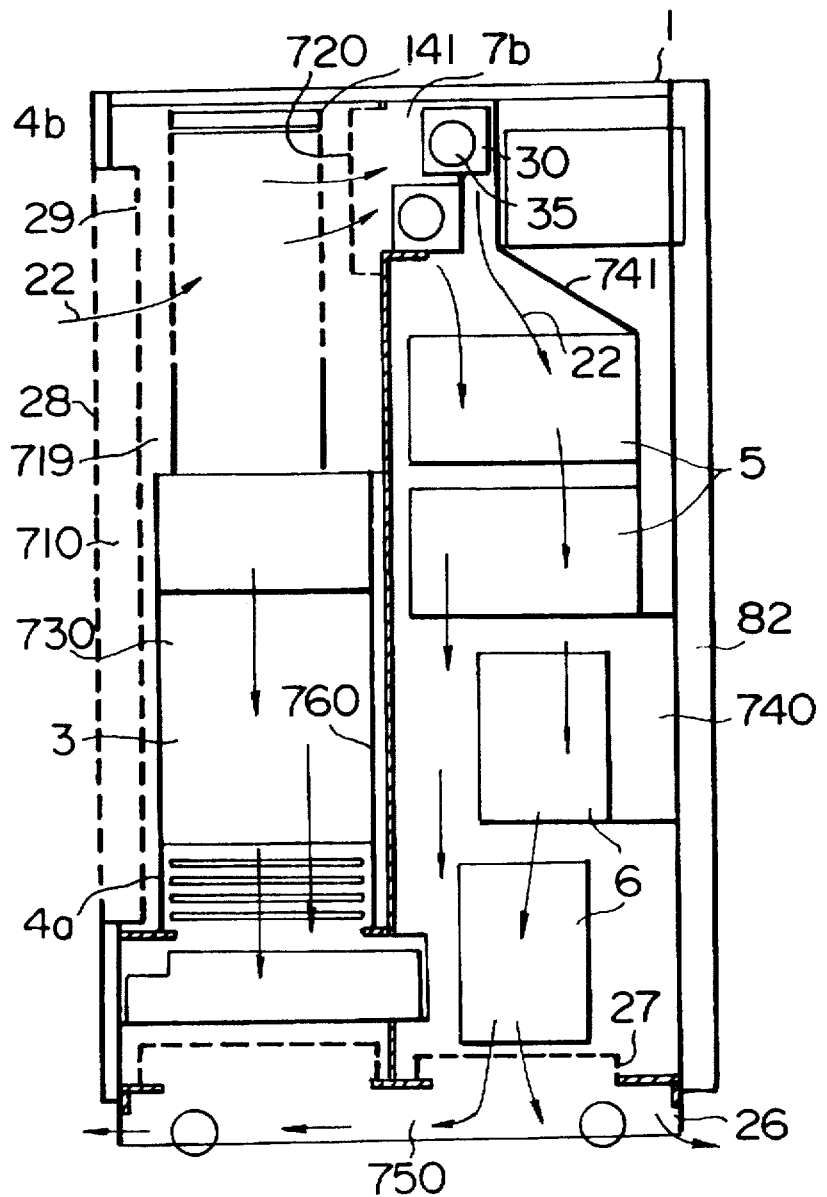
FIG. 64 is a sectional view taken on line LXIV—LXIV of FIG. 8 showing a computer in one embodiment of the present invention.

A cooling system in this embodiment is arranged at every place in the casing 1 as shown in FIGS. 64 and 9, and has the following components: an inlet portion 710 for inducing cooling air; an outlet portion 750 for exhausting cooling air; two systems of cooling air flow channel, e.g. the first flow channel 730 and the second flow channel 740 both formed within the area from the inlet portion 710 to the outlet portion 750 by substantially separating an inner space of the casing 1 by a partition wall 760; a main fan unit 7a arranged in the first flow channel 730; and a main fan unit 7b arranged in the second flow channel 740.

In the this embodiment, a plate-like member is used as the partition 760. However, the partition is not limited thereby. Any member may be used as the partition as long as it separates the flow channel. For example, side walls of the equipment, base board or the like may be used. Also, the partition may be omitted if the passage is substantially separated.

A plurality of units is arranged in parallel along a flow of the cooling air in the first flow channel 730. Another plurality of units is arranged in series along a flow of the cooling air. That is to say, in the first flow channel 730, the cooling air blown into the casing 1 through the inlet portion 710 is separated to the respective units and blown out therefrom, combined to flow through the main fan unit 7a and exhausted out of the casing 1 through the outlet portion 750. In the second flow channel 740, the cooling air blown into the casing 1 through the inlet portion 710 flows along the respective units through a main fan unit 7b of an inlet 720 and exhausts out of the casing 1 through the outlet portion 750.

The respective units in the first and second flow channels may be arranged by temperature specifications thereof.

Factors for determining the temperature specifications will be described hereinafter.

The HDD unit 5 will be described first. In each HDD, a disk is rotated by a motor when it is actuated. The storage capacity of the HDD is proportional to the product of number of revolutions of the disk and the track's byte-average-speed (byte/sec). For example, the storage capacity of an HDD having 5400 revolutions and a byte average speed of 3.7 megabytes is 2 gigabytes. Therefore, there is a tendency to increase the number of revolutions to increase the storage capacity of the HDD. Since the HDD constantly rotates at high speed on applying power, a bearing of the motor is heated. By a heat deformation of the bearing, a life of the HDD is shortened. Therefore, it has been found that the HDD has a severe temperature specification.

In order to increase the calculating speed, it is necessary to lower the temperature of the semiconductor in the main processing unit 2 and in the main I/O package unit 3. For example, when the temperature of the semiconductor goes by 10° C., the calculating speed increases about two times. When the temperatures of the respective loaded LSLs are uniformly distributed, reliability thereof is further improved.

The conversion efficiency of the basic DC/DC converter 4a and AC/DC converter 6 are 78% and 85%, respectively. Upon conversion, these converters generate heat by 22% and 15%, respectively. However, since the AC/DC converter 6 has almost no semiconductors and generates no heat with respect to the operating temperature, it has not so severe temperature specification as other devices and packages.

The air temperature near the circuit unit 118 may be increased by about 5° C. above the temperature of the main processing unit 2 and the basic I/O package unit 3 because power consumption of the circuit unit 118 is low.

Based upon the factors as described above, the upper limits of the air temperature are 50° C. near the HDD unit 5, the main processing unit 2, the basic I/O package unit 3 and the basic DC/DC converter 4a, 55° C. near the circuit unit 118 and 60° C. near the AC/DC converter 6. The upper limits of the surface temperatures of the semiconductors and the devices are 55° C. at the HDD unit 5, 85° C. at the main processing unit 2 and the basic I/O package unit 3, 70° C. at the basic DC/DC converter 4a, 85° C. at the circuit unit 118 and 90° C. at the AC/DC converter 6.

Accordingly, the cooling air flows in the main component as follows. In the first flow channel 730, the cooling air flows in the order of the inlet portion 710, (the main processing unit 2, the basic I/O package unit 3, the basic DC/DC converter 4a), the main fan unit 7a and the outlet portion 750. In the second flow channel 740, the cooling air flows in the order of the inlet portion 710, (the bypass 711, the extended I/O package 141), the main fan unit 7b, the HDD unit 5, (the AC/DC converter 6, the circuit unit 118), and the outlet portion 750. The units stated in the above parentheses are arranged in parallel as shown in FIGS. 8 to 10, 36, 64, 65, 66 and 68.

In the second flow channel 740, there is an extended I/O package 141 between the inlet portion 710 and the main fan unit 7b. However, since the bypass 711 is in parallel, the cooling air from the portion 710 is sucked by the main fan unit 7b through the bypass 711. Therefore, even when the cooling air flows through the package 141, the temperature does not increase. The package 141 is the extended package and is sometimes omitted. However, since the extended I/O package 141 also serves as a sound insulation wall as described hereinafter, a dummy box or a package may be preferably arranged when the package 141 is omitted.

Figure 62:
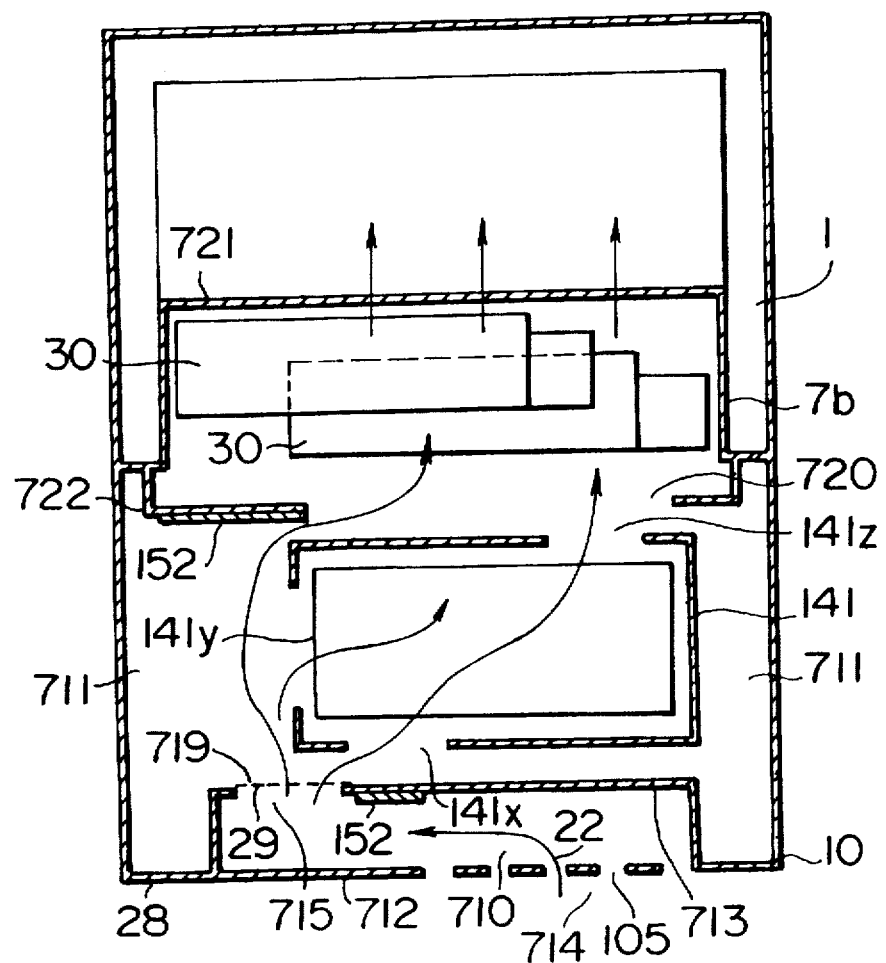
FIG. 62 is a sectional view showing a structure of an air-supply panel and that of intake port of the second passage to be used in one embodiment of the present invention.

The inlet portion 710 is a part of the outer wall of the casing, and has a dual structure of an outer wall portion 712 and an inner wall portion 713. The outer wall portion 712 is an air supply panel 28 provided with the first inlet 714 having a great number of air vents 105 within the rectangle (as also shown in FIG. 5). The box-shaped inner wall portion 713 is fitted inside of the outer wall portion and is provided with the second inlet 715 arranged with a space for forming a flow channel of the cooling air. When seen from the rear side of the computer 1000 (FIG. 5), the first inlet 714 and the second inlet 715 are positioned not to overlap each other in order to prevent noises directly produced by the main fan unit 7b, etc. (a top view is also shown in FIG. 62).

A filter 29 is attached to the second inlet 715 to prevent dust from entering. Further, a silencing material 152 is fitted to a part of the inner wall portion 713. Glass wool having a thickness of about 15 mm may be used as the silencing material 152. The glass wool may be applied to the inner wall portion 713 with a double-sided tape or the like.

Figure 36:
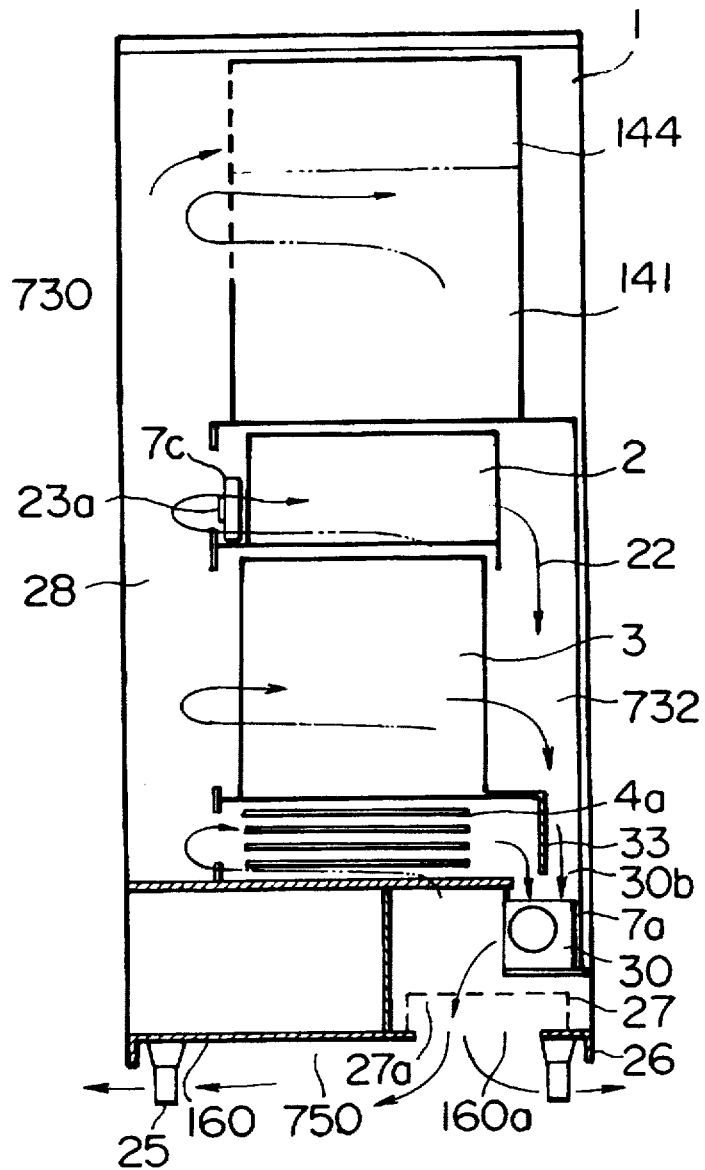
FIG. 36 is a sectional view taken on line XXXVI—XXXVI of FIG. 8 showing a flow of a cooling wind in a computer of one embodiment of the present invention.

The main fan unit 7a is arranged near the bottom portion of the inner side of a bottom plate 160 of the casing 1, at the exhaust side of the first flow channel 730. As shown in FIG. 36, the main fan unit 7a has a cross-flow fan 30. In the first flow channel 730, the cooling air is separated at the air supply side of the respective units such as the main processing unit 2, and each of the separated cooling air flows joins at the exhaust side thereof. The main fan unit 7a sucks in the joined cooling air and exhausts same through an opening 160a provided at the bottom plate 160 and the outlet portion 750.

According to UL standard, a punched member having punched holes of a diameter of about 2 mm or less is provided at an opening positioned below a heat source to prevent fire caused, one in a thousand, by sparks from the heat source having fallen on the floor. Also, the punched member having punched holes with a diameter of 4 mm is provided at the opening which is not positioned below a heat source to prevent small animals such as insects, rats or the like from intrusion. According to this embodiment, the punched member 27 having punched holes 27a with diameters of 2 to 4 mm is arranged at the surface of the outlet portion to meet the standard requirements as described above. By this, an air speed at the outlet portion 750 may be reduced. Further, the sound or the like generated when the cooling air 22 strikes against the floor may be extremely lowered.

When the outlet of the cooling air 22 is arranged below the heat source, the cooling air should be exhausted outside the computer 1 through the punched holes having a diameter of less than 2 mm. However, when the cooling air 22 is exhausted through such small holes, a pressure loss may increase and a static pressure of the fan should be increased. Thus, there is a tendency of increasing of the load of the cooling fan, and of big noises. To improve this fact, the punched member 27 is made a box-shaped (irregular) to increase exhausting area.

Figure 68:
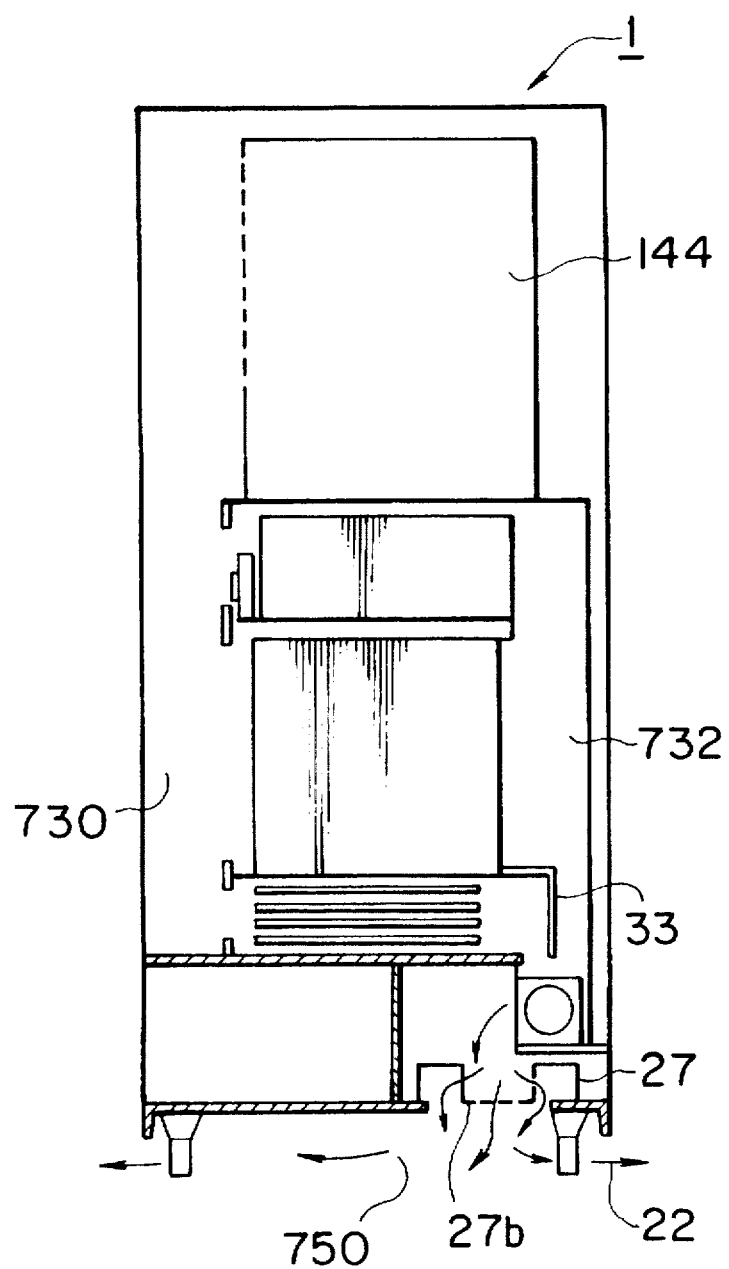
FIG. 68 is a sectional view showing another example of an exhaust portion of cooling wind in a computer of one embodiment of the present invention.

The typical forms of the punched member 27 are shown in FIGS. 36 and 68. FIG. 36 shows an example of the box-shaped punched member 27, and FIG. 68 shows an example of the box-shaped punched member 27 having a protruded portion 27a on a portion thereof for increasing the opening area.

Incidentally, as described hereinafter, a duct 33 is formed on the inlet side of the main fan unit 7a for dividing the cross sectional area of inlet 30b, as shown in FIG. 36.

Figure 50:
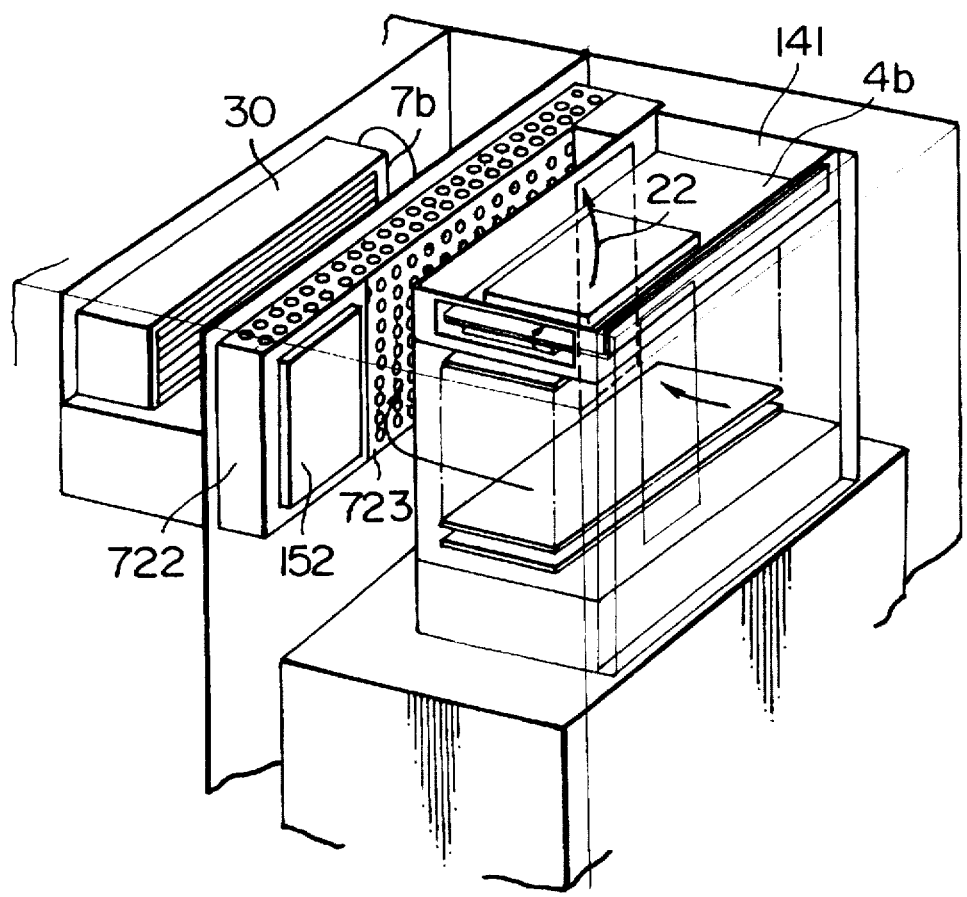
FIG. 50 is a perspective view of an extended I/O package unit to be used in one embodiment of the present invention.

The main fan unit 7b is arranged on the inlet 720 of the second flow channel. As shown in FIG. 62, the unit 7b has two cross-flow fans 30, a case 721 for supporting the cross-flow fans 30 and a panel member 722 for constituting the inlet 720 at the front of the case. The panel member 722 is provided with a great number of air vents 723 as shown in FIG. 50. The punched member may be used as the panel member 722. Such a panel member 722 may be used for reducing a noise from the cross-flow fans 30. One object of using such panel member 27 is to reduce noises from the cross-flow fans 30.

A shorter length of one cross-flow fan 30 than that of a vertical section of the passage is a reason of an arrangement of two cross-flow fan 30 in the main fan unit 7b. A shortage of length of the cross flow fans 30 may be avoided by arranging them at longitudinally different positions.

Figure 46:
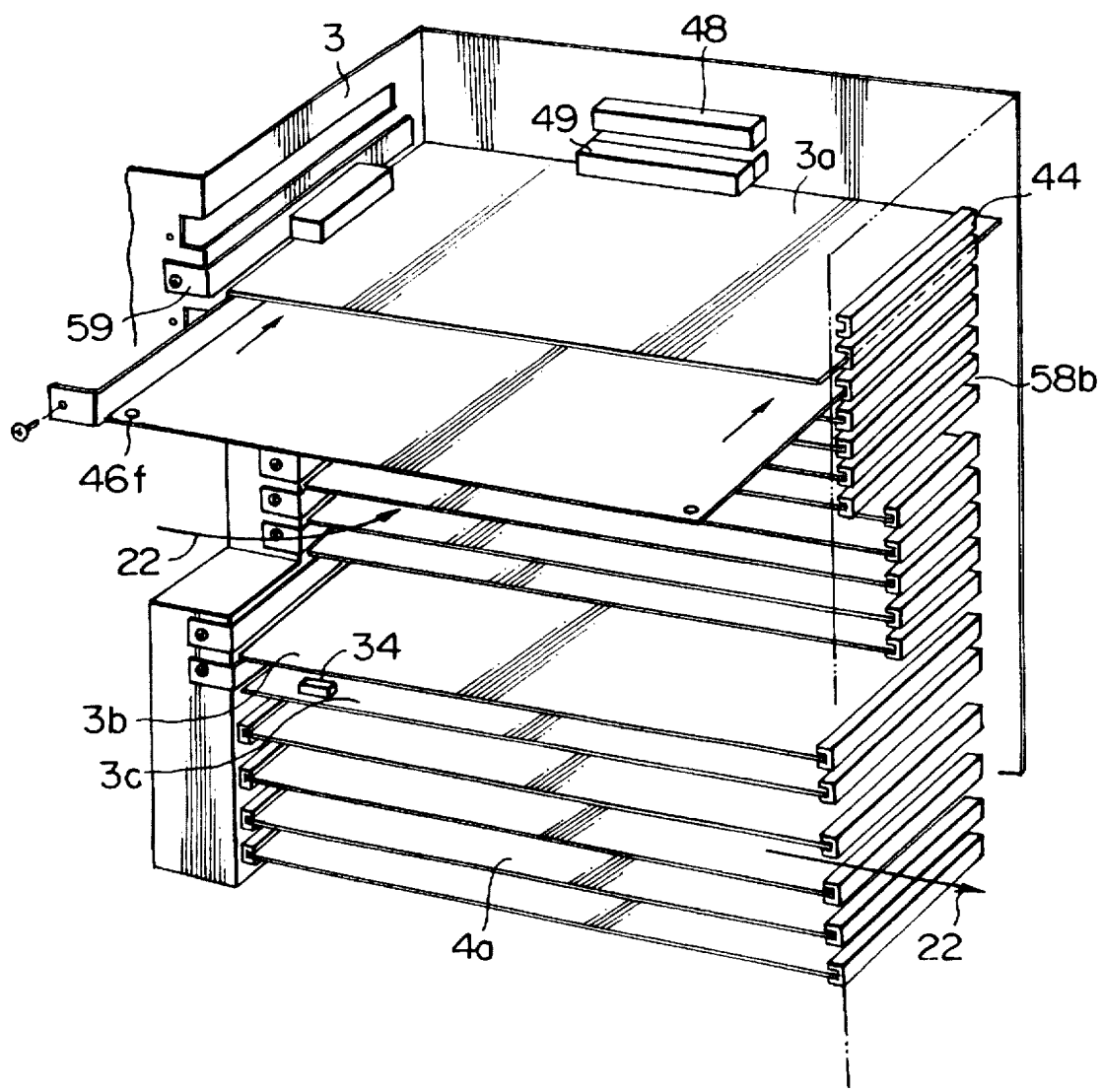
FIG. 46 is a perspective view of I/O package unit constituting one embodiment of the present invention.

The cross-flow fans 30 of the main fan units 7a and 7b are formed such that they can be driven at various speeds, and air speed may be changed as needed, as described hereinafter. As shown in FIG. 46, a control circuit as well as a temperature sensor 34 are mounted on any one of the packages of the basic I/O package unit 3 to change number of revolutions of the motor by an output signal from the control circuit. For example, when the temperature of the supplied air is 30° C. or less, a voltage for driving the motor becomes 17 V, and 24 V when 30° C. or more, thereby to change a volume of cooling air 22 from the cross-flow fan 30.

1.3.2 Local cooling

In this embodiment, in addition to the main cooling member in the first and second flow channels as described above, auxiliary units for particular units arranged in the first flow channel are provided in order to increase a cooling ability. As auxiliary units, sub-fan unit 7c is provided for blowing air to the particular units. Also, a duct 33 is provided as an auxiliary unit having a function of securing a volume of cooling air.

In this embodiment, local and silent cooling is performed on the RISC processor module 15, the OSC package 16, and the basic I/O converter 4a in FIGS. 8 to 10. In the local and silent cooling, a heated portion at a high temperature (heat spot) is cooled at a minimum amount of flowing air by controlling the flowing of air in front and rear of the fan, thereby making it possible to cool a whole computer 1000 by a fan having a small cooling ability and generating smaller noise. The HDD unit 5 in the second flow channel 740 obtains a cooling effect almost same as that of the local cooling described above because it is positioned just after the main fan unit 7b.

Cooling of the RISC processor module is described first. The cooling ability is increased by an individual forced air cooling method. For example, a board of PA 71000 series manufactured by Hewlett-Packard may be used for the RISC processor module 15. At least one sheet of the RISC processor module 15 is loaded in the main processing unit 2. In this embodiment, two sheets of the RISC processor modules are loaded in the main processing unit 2 as shown in FIG. 12.

A structure of the RISC processor module 15 is shown in FIG. 11. One RISC chip package 13 is mounted on the RISC processor module 15 and twenties of cache memories 14 are mounted on both sides of the RISC processor module 15. An electric signal may be transmitted by a male connector 49a. A disk-like radiating fin 62a is provided in the RISC chip package 13 for performing a sufficient cooling.

FIG. 12 is a top view of the entire main processing unit 2. Two sheets of RISC processor module 15 and an OSC package 16 are arranged at one end portion (inlet side) of a case 190 of the main processing unit 2, and four sheets of MS middle cards 19 are arranged at the other end portion thereof. A sub-fan unit 7c for local cooling is formed outside of the end portion of the inlet side of the case 190. The OSC package 16 for controlling the RISC processor module 15 is formed adjacent to the RISC processor module 15. An axial fan 23a of 80×80×24 mm$^3$ for supplying the cooling air 22, manufactured by Sanyo Electric Co., Ltd. and jet slits 24 are formed in the sub-fan unit 7c for local cooling. The axial fan 23a has a size of about 80 mm, a maximum flux of 1 m$^3$, and a noise of about 30 dB. The jet slits 24 are formed rectangularly.

Regarding a cooling of the RISC processor module 15, there is a problem of difficulty in cooling the cache memories 14 positioned at a lower portion of the disk-like radiating fin 62a. This problem is attributable to the fact that the cooling air from the axial fan 23a is slightly blocked by the disk-like radiating fin 62a (especially, by a post portion thereof) and that the cooling air is considerably warmed when passing through the radiating fin 62a.

Figure 13A:
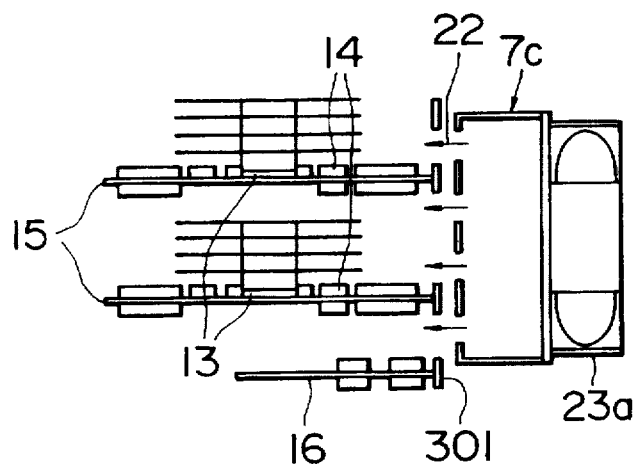
FIG. 13A is a top view showing one example of a mounting condition of a sub fan unit and RISC processor module for a local cooling to be used in one embodiment of the present invention.
Figure 13B:
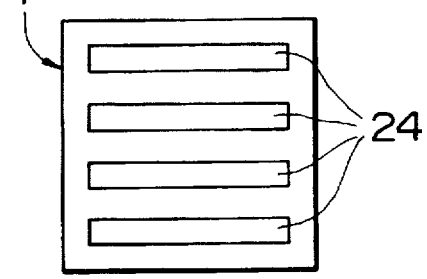
FIG. 13B is a front view of the sub fan unit.

FIGS. 13A and 13B show a specific example of a cooling of the RISC processor module 15 according to the present invention. In the embodiment of FIGS. 13A and 13B, four rectangular jet holes are provided in the sub fan unit 7c for a local cooling. The RISC processor modules 15 may be cooled from the both side thereof because they are positioned between two jet slits 24. By this, flowing speed of the cooling air along a substrate may be increased and cache memories 14 behind the RISC chip packages 13 may be sufficiently cooled.

In this embodiment, positions of guide rails correspond to those of portions between the jet holes. Thus, flowing of the cooling air from the jet slits 24 is not interrupted by the guide rail 301. The size of the duct is 9 by 70 mm.

In this embodiment, the RISC chip packages 13 and the cache memories 14 are designed so as to have temperatures sufficiently below the upper limit temperatures of 110° C. The lower the operating temperature of the RISC chip packages 13 and the cache memories 14 become, the reliability thereof become more sufficient. It is known by experience that reliability and speed of calculation is remarkably increased when elements are used at a junction in a wiring board with a maximum temperature of 85° C. or less, in comparison with a case when used near the upper limit temperature of 110° C.

Incidentally, in the embodiment of FIGS. 13A and 13B, the RISC processor module 15 may be cooled in a same manner as described above as long as the axial fan 23a is running even when the cross-flow fans 30 for cooling a whole of the computer 1000 stop. On the other hand, even when the axial fan 23a stops, a parallel flow of the cooling air is formed by the cross-flow fans 30 and the RISC processor modules 15 are operated at temperatures lower than the upper limit of 110° C. Therefore, it is assumed that dual cooling is performed.

Figure 14A:
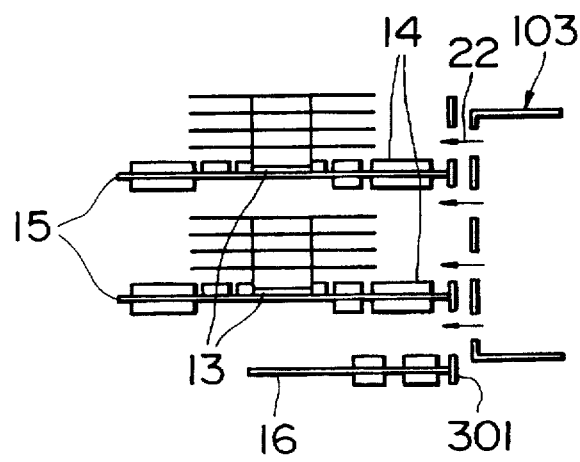
FIG. 14A is a top view showing one example of a mounting condition of a cooling structure of RISC processor module to be used in one embodiment of the present invention.
Figure 14B:
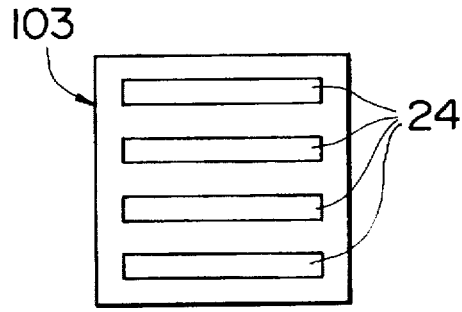
FIG. 14B is a front view showing one example of a duct to be used therefor.

In this embodiment, the axial fan 23a is provided at the upper side of the RISC processor modules 15. However, even when the axial fan 23a is not provided, cooling air direction may be controlled by providing a duct 103 as shown in FIGS. 14A and 14B, and sufficient cooling ability may be obtained.

One surface of the OSC package 16 formed adjacent to the RISC processor modules 15 is cooled by the jet from the axial fan 23a, and the other surface thereof is cooled by a parallel flow of the cooling air from the cross-flow fans 30. By this, the elements on the circuit board may be sufficiently cooled compared with the case when both surfaces of the OSC package 16 are cooled by the cross-flow fan 30.

Figure 15A:
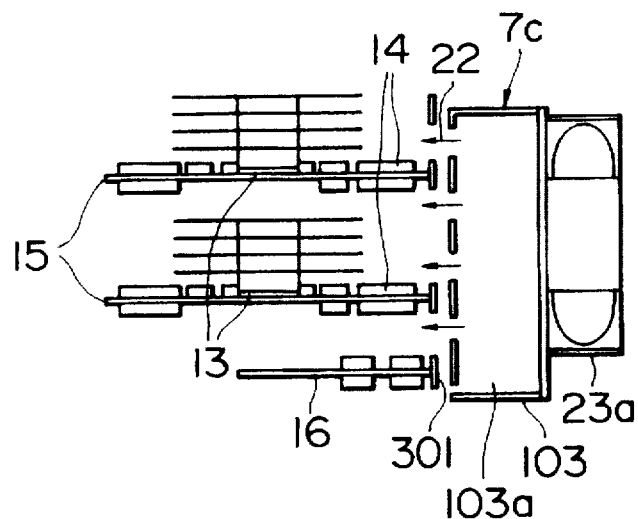
FIG. 15A is a top view showing the other example of a mounting condition of the sub fan unit and RISC processor module for a local cooling to be used in one embodiment of the present invention.
Figure 15B:
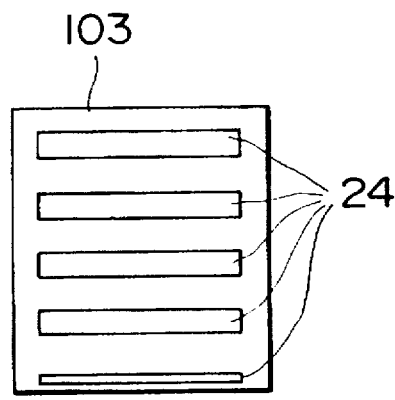
FIG. 15B is a front view of the sub fan unit.

Further, this embodiment may be modified as shown in FIG. 15. An opening portion 103a of the duct 103 of the fan unit 7c for local cooling as described above may be extended up to the position of the OSC package 16. By this,the cooling air from the axial fan 23a may be supplied to IC chips fitted on the under surface of the OSC package. As a result, reliability of the OSC package may be increased.

The modifications of cooling the RISC processor modules 15 will be described with reference to FIGS. 16 to 37.

Figure 16A:
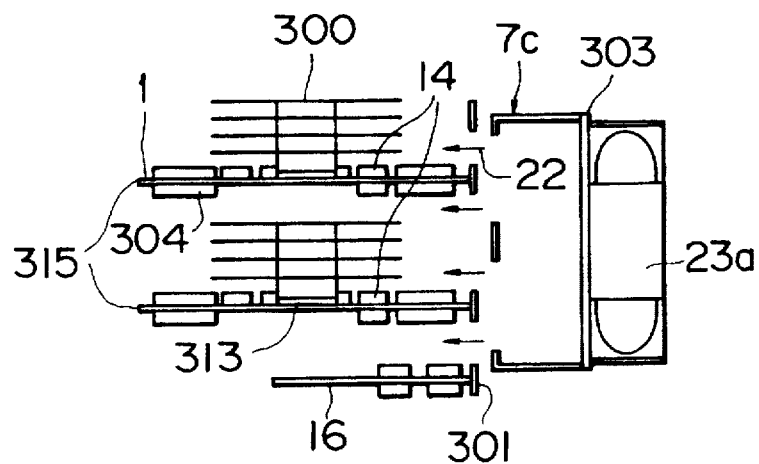
FIGS. 16A and 16B show a first modification of the cooling structure of RISC processor module.
Figure 16B:
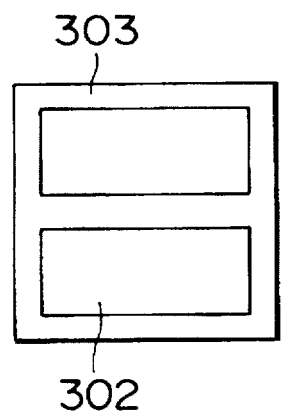

FIG. 16 shows a first modification. One or two circuit boards are provided. One CPU 313 and twenties of memories are mounted on the circuit board. A duct 303 is provided at an upper portion of the circuit board. An axial fan 23a is provided at a further upper portion of the circuit board so as to contact with the duct 303. An OSC board 2 for controlling a cooling of the circuit board is formed adjacent to the circuit board.

Regarding a cooling of the circuit board, there is a problem of difficulty in cooling the memories 14 positioned at a lower portion of a disk-like heat sink 300. This problem is attributable to the fact that the cooling air from the axial fan 23a is slightly blocked by the disk-like heat sink (especially, by a post portion thereof) and that the cooling air is considerably warmed when passing through the heat sink 300.

Accordingly, two large rectangular slits are provided in the duct 303 in the embodiment of FIG. 16. The respective centers of the slits 302 and the center of the substrate 1 are coaxially arranged. By combining the slits 302 and the guide rails 301, four rectangular slits 302 are substantially formed. By this, speed of the cooling air flowing along the circuit boards 1 may be increased and cache memories 14 behind the CPUs 315 may be sufficiently cooled. Since the respective slits 302 have sufficiently large width, the guide rails 301 have less effect on flowing of the cooling air from the rectangular slits 302. Thus, the embodiment has the following advantage: pressure loss of the duct 303 is small because of the wide width of the slits 302, thereby increasing a volume of the cooling air flowing from the axial fan 23a; and the cooling ability is not changed even when the relative position of the circuit board 1 and the duct 303 is slightly shifted. The size of the slits is 36 mm by 70 mm, and the slits are formed with the space of about 6 mm. The distance between the guide rails 301 and the duct 303 is about 2 mm. The pitch between the circuit board 1 is about 42 mm. The disk-like heat sink 300 has a disk having a diameter of 64 mm, a post having a diameter of 20 mm and a fin having a thickness of 1 mm, pitch of 4 mm and a height of 25 mm.

Figure 17A:
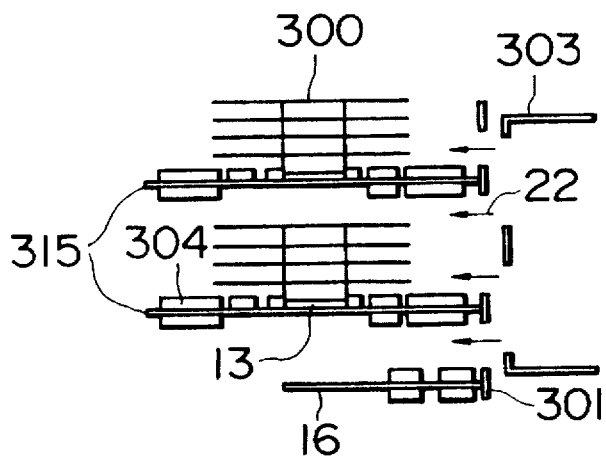
FIGS. 17A and 17B show a second modification thereof.
Figure 17B:
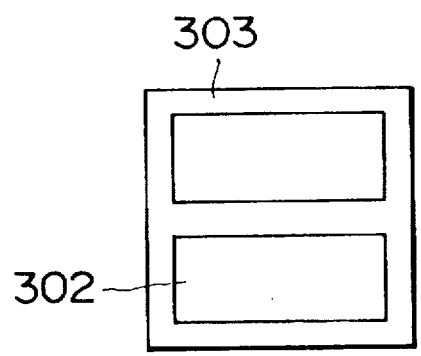

FIG. 17 shows a modification of FIG. 16 in which the axial fan 23a formed as upper portion of the duct 303 by contact therewith is removed.

Figure 18A:
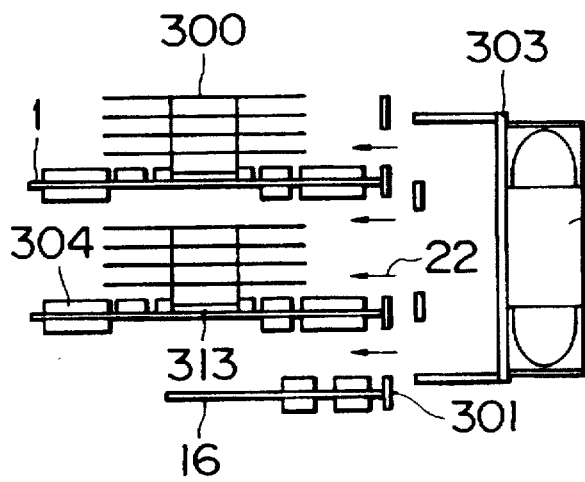
FIGS. 18A and 18B show a third modification thereof.
Figure 18B:
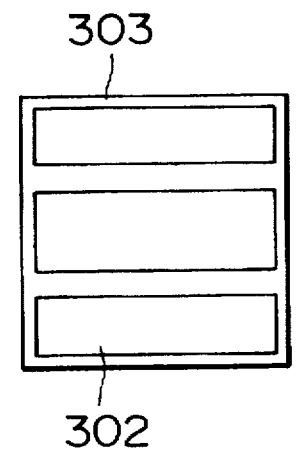

FIG. 18 shows an embodiment in which three rectangular slits 302 are formed in the duct 303. Similarly to the embodiment shown in FIG. 16, the speed of the cooling air flowing along the circuit boards 1 may be increased and cache memories 304 behind the CPUs 315 may be sufficiently cooled. The size of the slits is 16 mm by 70 mm. The guide rails 301 may be removed from the embodiments shown in FIGS. 13 and 16.

Figure 19A:
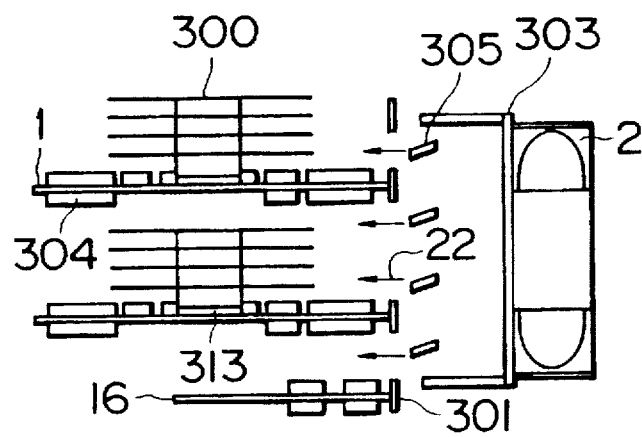
FIGS. 19A and 19B show a fourth modification thereof.
Figure 19B:
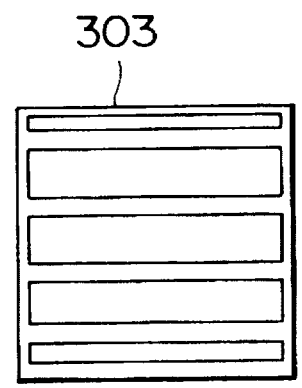
Figure 20A:
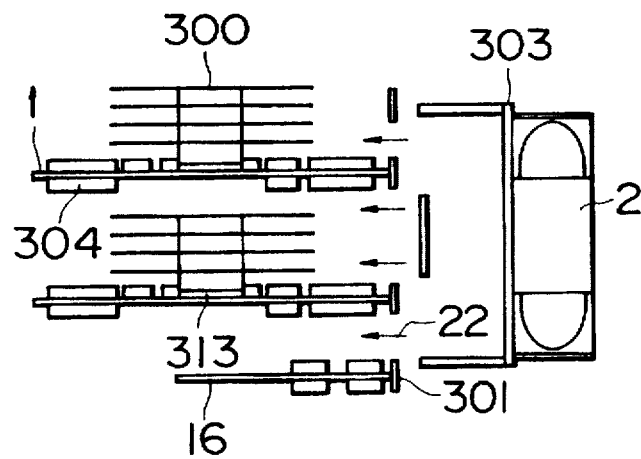
FIGS. 20A an 20B show a fifth modification thereof.
Figure 20B:
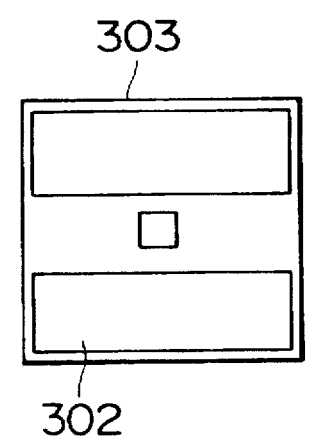
Figure 21A:
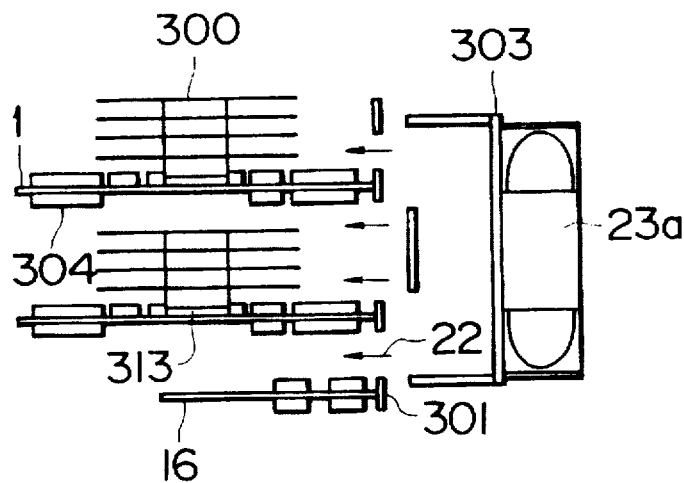
FIGS. 21A and 21B show a sixth modification thereof.
Figure 21B:
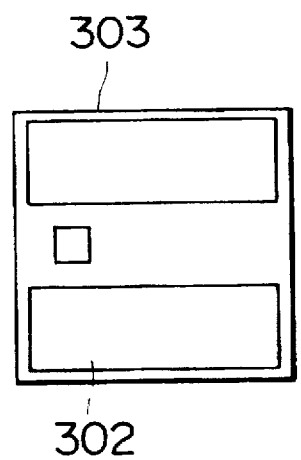
Figure 22A:
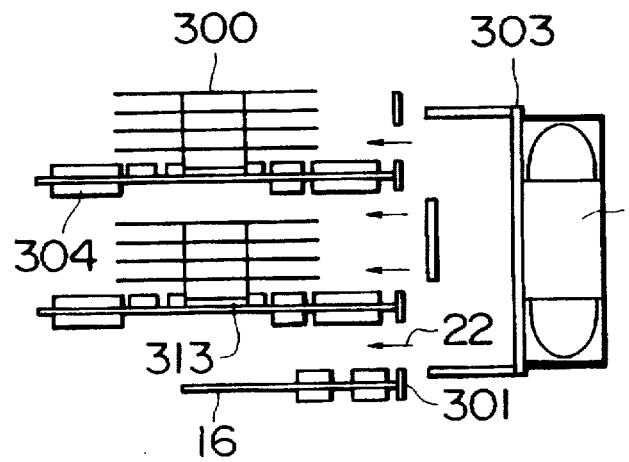
FIGS. 22A and 22B show a seventh modification thereof.
Figure 22B:
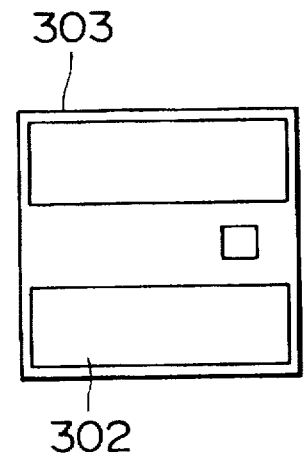
Figure 23A:
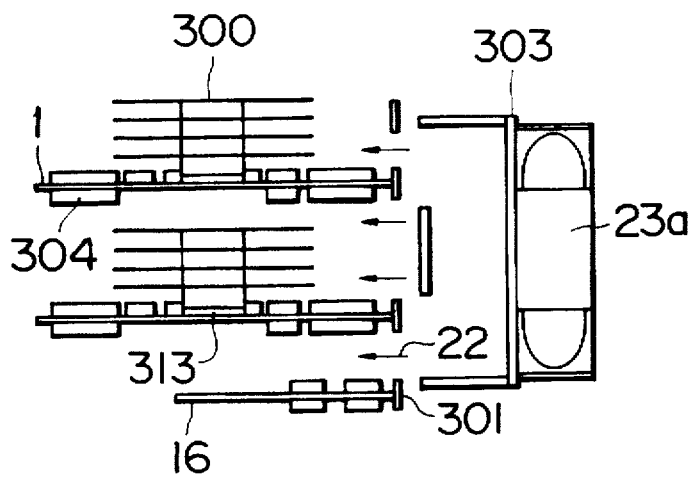
FIGS. 23A and 23B show an eighth modification thereof.
Figure 23B:
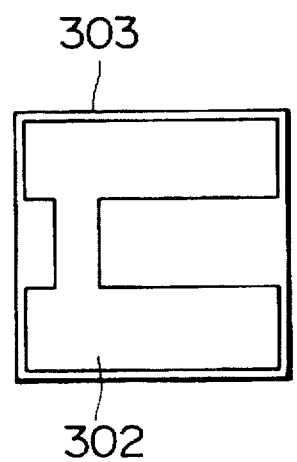
Figure 24A:
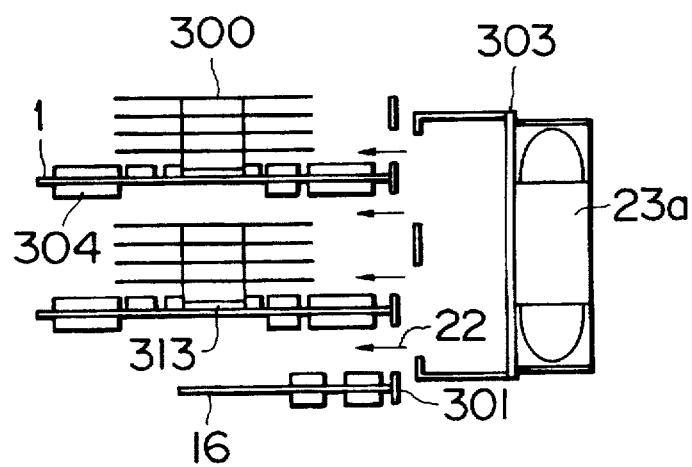
FIGS. 24A and 24B show a ninth modification thereof.
Figure 24B:
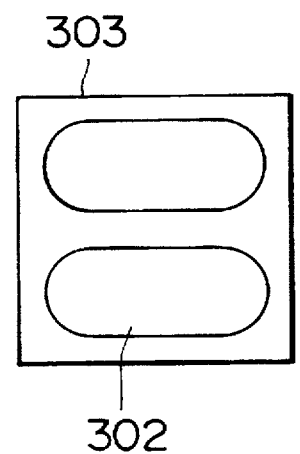
Figure 25A:
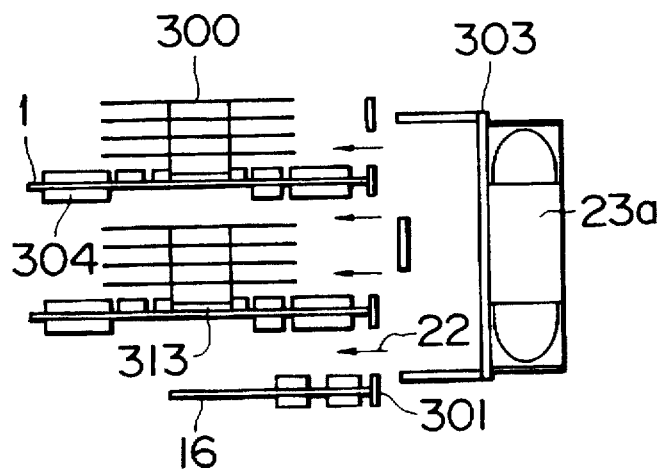
FIGS. 25A and 25B show a tenth modification thereof.
Figure 25B:
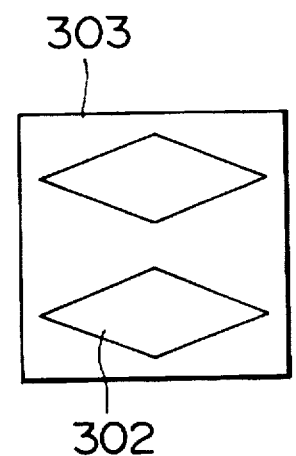
Figure 26A:
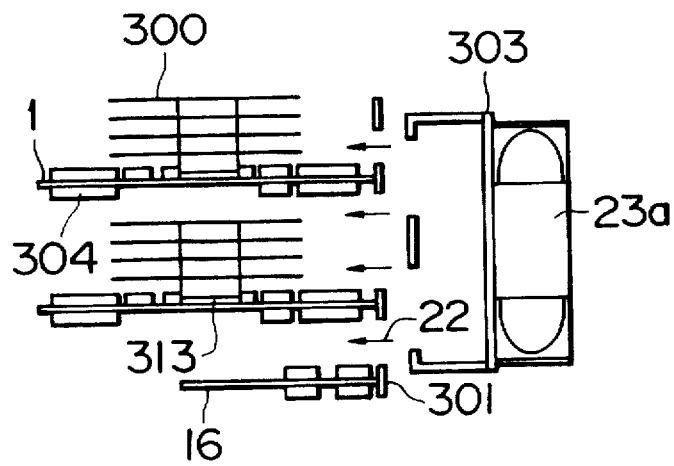
FIGS. 26A and 26B show an eleventh modification thereof.
Figure 26B:
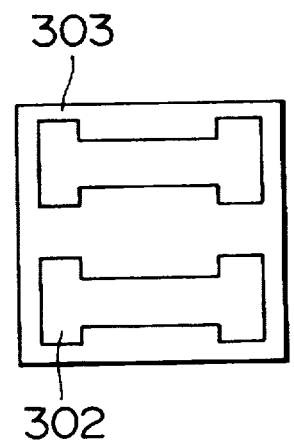
Figure 27A:
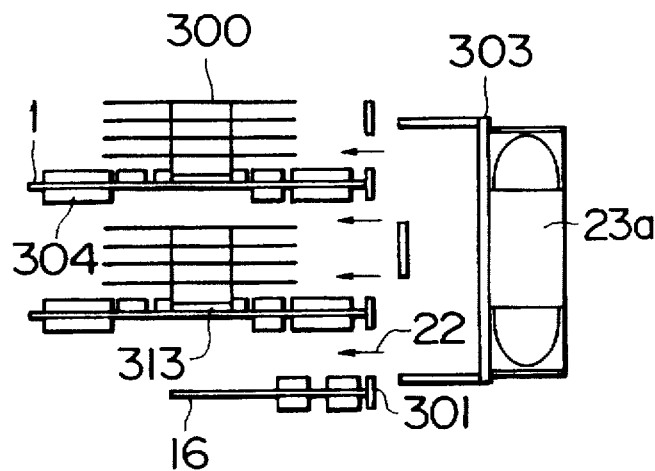
FIGS. 27A and 27B show a twelfth modification thereof.
Figure 27B:
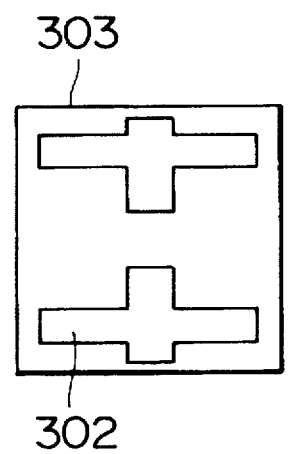
Figure 28A:
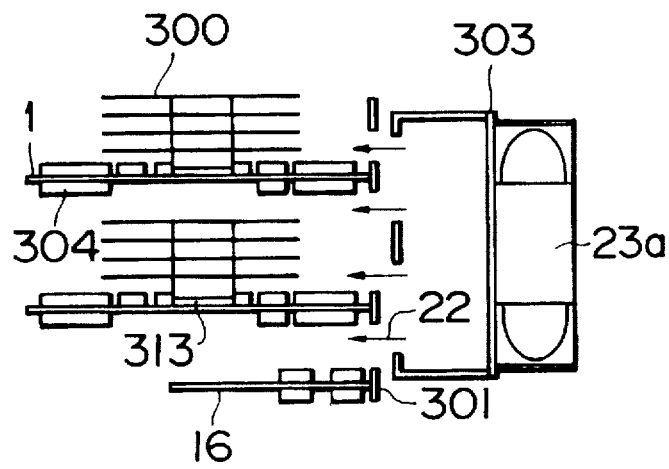
FIGS. 28A and 28B show a thirteenth modification thereof.
Figure 28B:
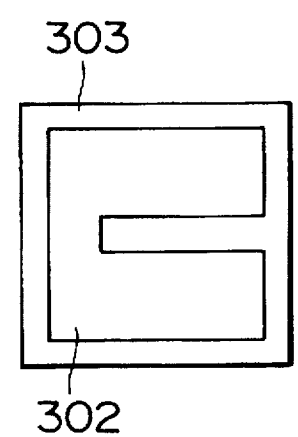
Figure 29A:
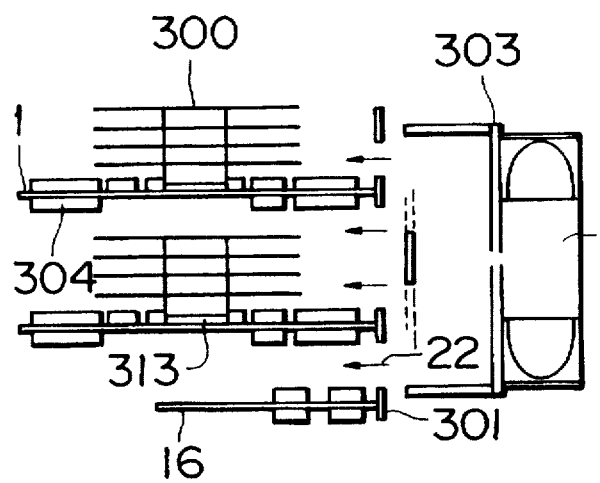
FIGS. 29A and 29B show a fourteenth modification thereof.
Figure 29B:
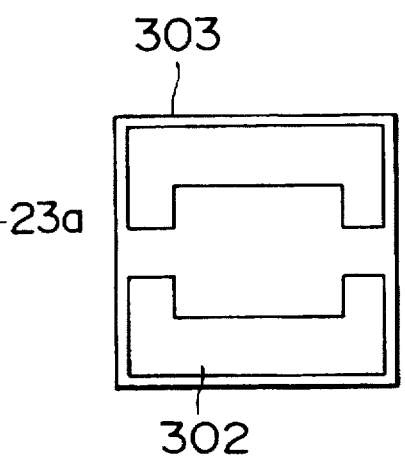
Figure 30A:
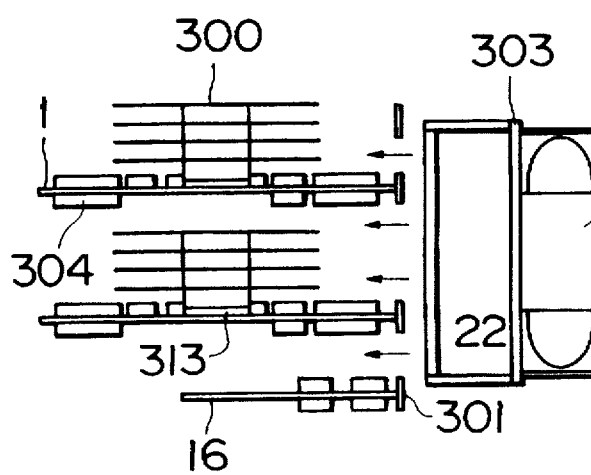
FIGS. 30A and 30B show a fifteenth modification thereof.
Figure 30B:
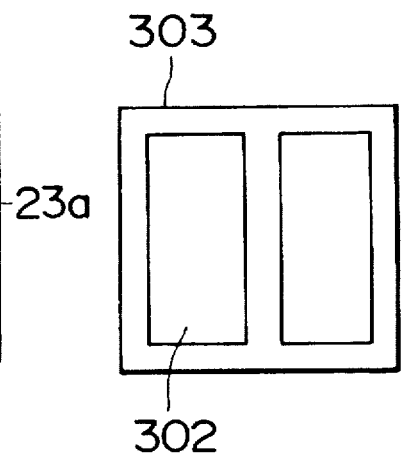

FIG. 19 shows an embodiment in which louvers are used. By bending the flow of the cooling air from the axial fan 23a with the louvers 305, the portion where it is difficult to cool the memories 304 may be locally cooled. This embodiment has advantage that the memories 304 provided at a lower portion of the heat sink 300 on the circuit board 1 may be sufficiently cooled. The size of the respective louvers is 10 mm by 70 mm, and angle thereof is about 30°. FIGS. 20 to 22 show embodiments in which other slits having a different size is formed between the slits 302. The temperatures of the memories 304 behind the heat sink 300 loaded between the circuit boards 1 are apt to increase. In this embodiment, the memories 304 may be cooled by satisfactorily applying the cooling air thereto or by increasing the amount of the cooling air.

FIGS. 23 to 30 show embodiments in which the slits are of various shapes, such as H-shaped, oval, diamond-shaped, I-shaped, cross-shaped and U-shaped or the like.

Figure 31A:
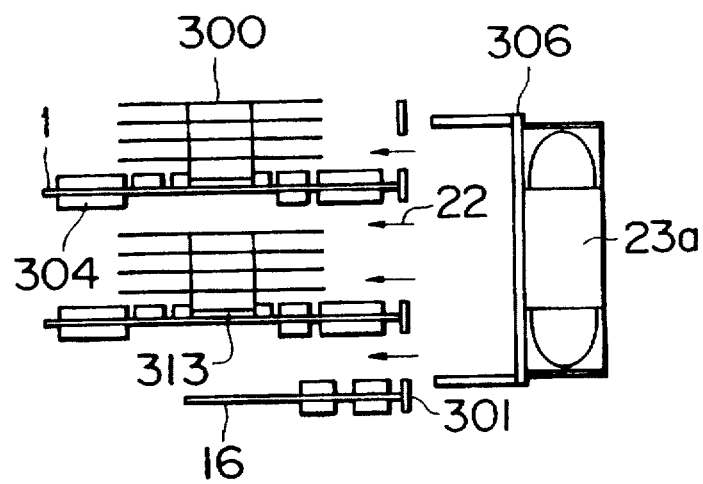
FIGS. 31A and 31B show a sixteenth modification thereof.
Figure 31B:
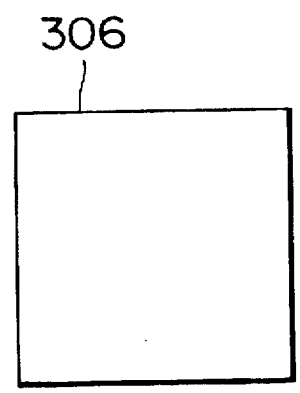

FIG. 31 shows an embodiment in which the duct 303 of the CPUs 313 is box-shaped with opening front thereof. In this embodiment, the amount of cooling air is increased by reducing a pressure loss of the duct 303 at an exit thereof, and the cooling air from the axial fan 23a is applied to the circuit boards 1 without dispersing. This embodiment has advantage of simplification of structure of the duct 303.

In the embodiments shown in FIGS. 18 to 31, the axial fan 23a is connected to the duct 303. However, as described in the embodiment shown in FIG. 17, sufficient cooling ability may be obtained by providing the ducts 303, even when the axial fan 23a is not provided.

Figure 32:
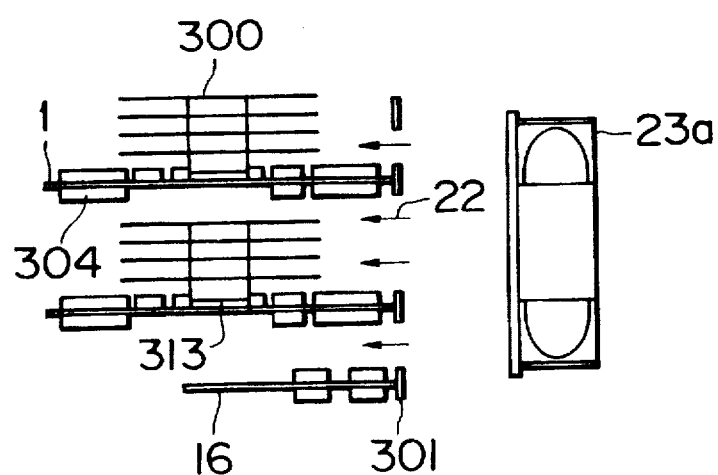
FIGS. 32 shows a seventeenth modification thereof.

FIG. 32 shows an embodiment in which the duct 303 is not provided. The flow of the cooling air from the axial fan 23a is tightened by the guide rails 301 and become an accelerated jet, thereby making it possible to disarray the flow of the cooling air and to perform cooling. This embodiment has advantage of simplification of the cooling structure.

Figure 33A:
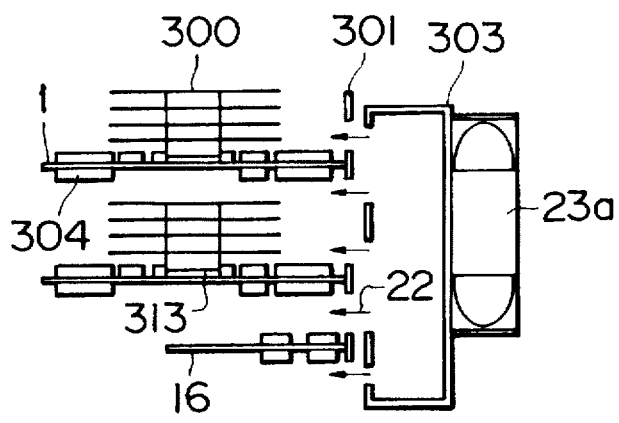
FIGS. 33A and 33B show an eighteenth modification thereof.
Figure 33B:
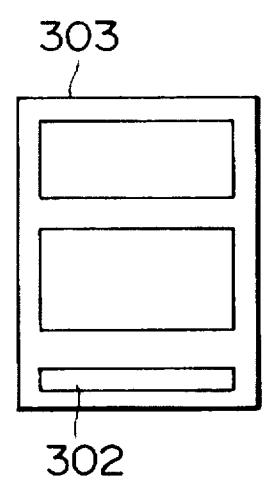

FIGS. 15 and 33 show embodiments in which the duct 303 is elongated to an OSC board 16 controlling the CPU. These embodiments have the advantage that the memories loaded on the OSC board 16 may be sufficiently cooled.

Figure 34A:
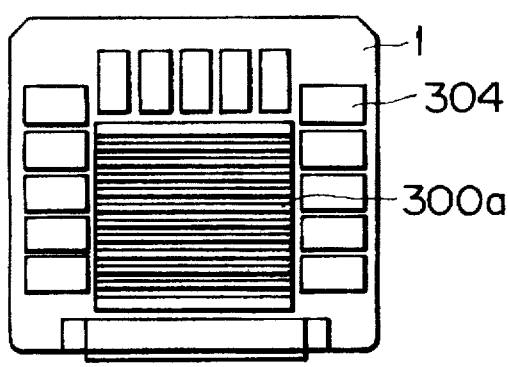
FIGS. 34A and 34B show a nineteenth modification thereof.
Figure 34B:
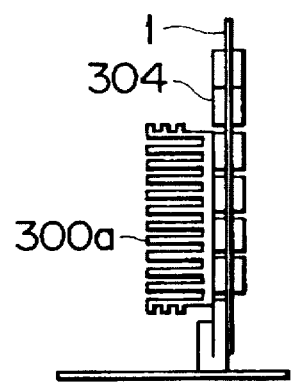
Figure 35A:
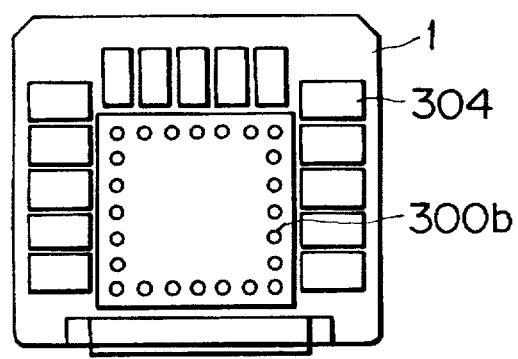
FIGS. 35 and 35B show a twentieth modification thereof.
Figure 35B:
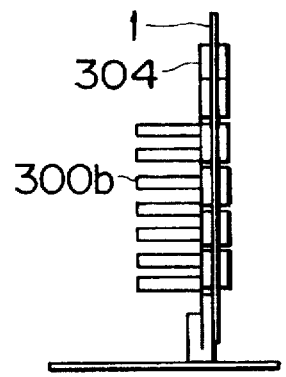

FIGS. 34 and 35 show embodiments in which the disk-like heat sink 300 is replaced by a comb-like flat fin 300a or pin fins 300b. The memories 304 or the like loaded on the circuit boards 1 may be sufficiently cooled even when the heat sink 300 is replaced.

The axial fan 23a is connected to the duct 303 also in the embodiments shown in FIGS. 33 to 35. However, as described in the embodiment shown in FIG. 17, sufficient cooling ability may be obtained by providing the ducts 303 even when the axial fan 23a is not provided.

According to the cooling structure as described above, jet of the cooling air having almost uniform speed may be suitably applied only to the necessary portion in the form of a slit, while corresponding to calorific value or the like of the electric circuit board to be cooled. Thus, the cooling structure may exhibit the considerably excellent effects as follows: sufficient cooling efficiency may be obtained even with a relatively small amount of the cooling air, thereby to compact the cooling device; a space for the electronic units in the casing may be simplified and saved with almost no change of the casing structure; and concentrated cooling of the electric circuit board loading semiconductor elements thereon having large calorific value may be performed.

Figure 65:
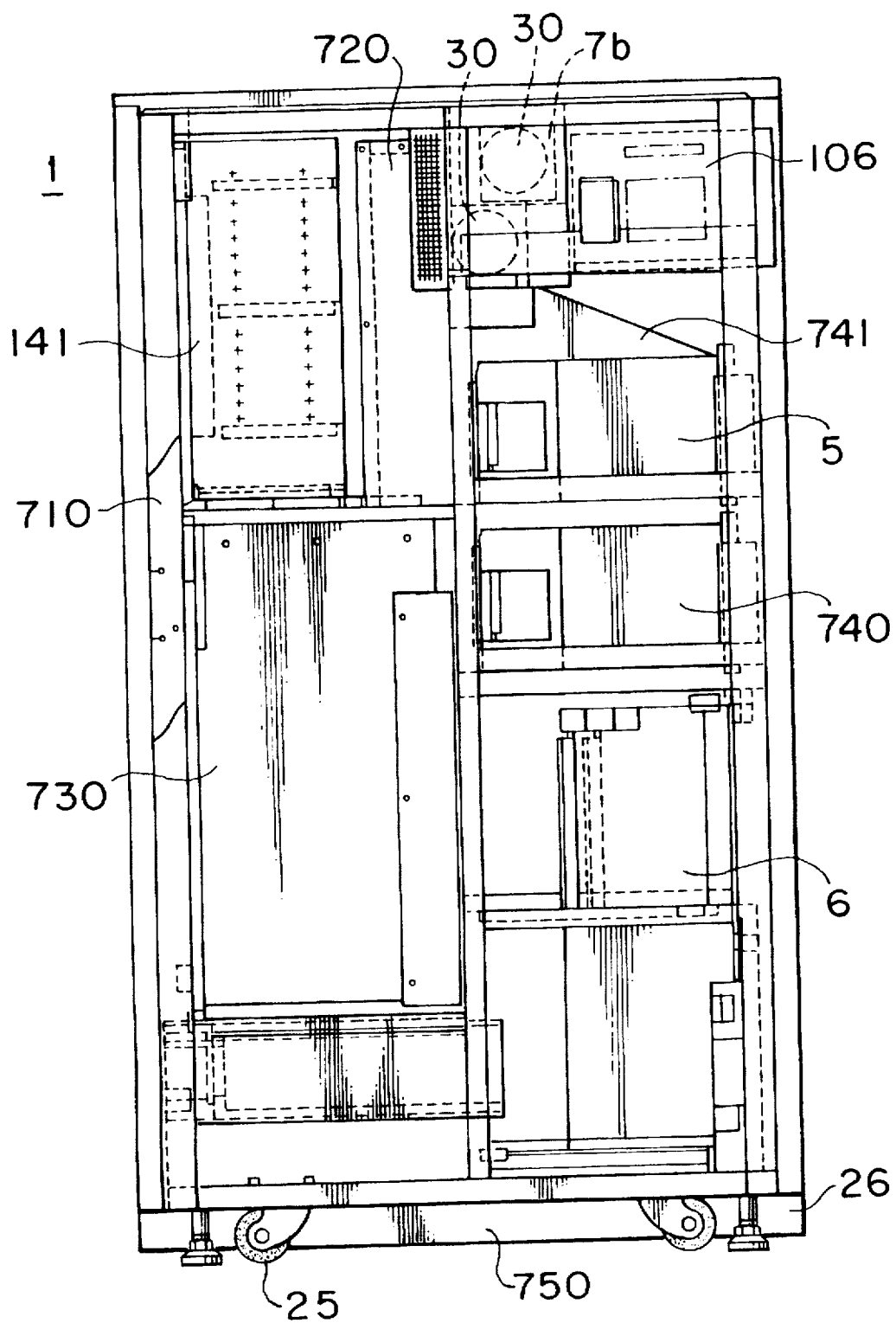
FIG. 65 is a left side view showing a condition in which a panel of a computer of one embodiment of the present invention is removed.
Figure 66:
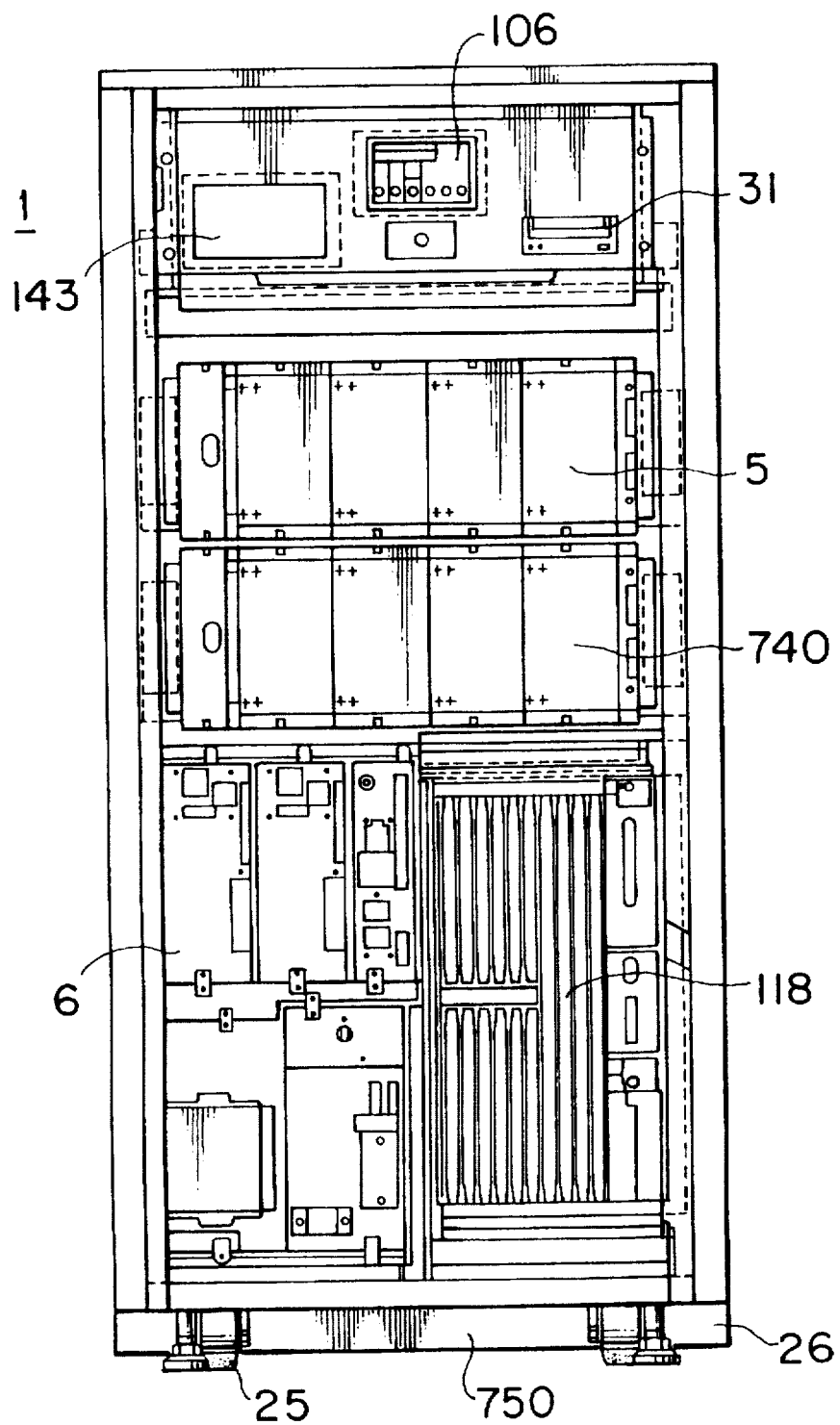
FIG. 66 is a front view showing a condition in which a panel of a computer of one embodiment of the present invention is removed.

In FIGS. 64 and 65, a divergent duct 741 is provided at the exit of the cross-flow fans 30 in the HDD unit 5 for applying the high-speed cooling air discharged from the cross-flow fans 30 uniformly and directly to the respective disks. By this, the respective disks are sufficiently cooled and succeed in obtaining thermal reliability same as that of the disks in a general large computer.

A large amount of cooling air should be flown in the basic DC/DC converters 4a. Thus, as shown in FIG. 36, the duct 33 is formed at the inlet 30b of the cross-flow fans 30, thereby to perform sufficient cooling. That is to say, the duct 33 is formed on the inlet side of the main fan unit 7a for dividing the cross sectional area of the inlet 30b. The duct 33 is formed for securing the amount of the cooling air to the basic DC/DC converters 4a. The duct 33 is arranged along an axial direction of the inlet 30b of the cross-flow fans 30. Thus, the duct 33 divides the inlet 30b of the cross-flow fans 30 with an angle. In this case, the cross-flow fans 30 are not effected by the change of load balance. Therefore, generation of noises at the cross-flow fans 30 may be controlled. Meanwhile, when the axial direction of the cross-flow fans 30 is divided and load balance is changed at the axial direction of the cross-flow fans 30, rotation axes of the cross-flow fans 30 vibrate to generate noises.

1.3.3 Operation of the cooling

In this embodiment, as has been described above, a space in the casing 1 is divided into the first and second flow channels, and these channels are entirely cooled by the main fan unit 7a and 7b, respectively. Also, in this embodiment local and silent cooling is performed on the main processing unit 2, particularly on the RISC processor module 15, the OSC package 16 and the basic DC/DC converter 4a.

The operation of cooling in the first and second flow channels will be described in detail with reference to FIG. 9; FIG. 62; FIG. 36 which is a cross sectional view taken on line XXXVI—XXXVI of FIG. 8; and FIG. 64 which is a cross sectional view taken on line LXIV—LXIV of FIG. 8.

The operation of the cooling in the first flow channel will be described first. The cooling air 22 flows into the casing 1 from the air vents 105 of the inlet portion 710 formed at right half side of the air supply panel 28 (located at this side and not shown in FIG. 36) behind the casing 1 through the left half side of a inner cover provided with a filter (shown by broken lines) as shown in FIG. 9. Then, the cooling air flows through the side faces of the extended I/O package unit 141 and the main processing unit 2, a guide panel 739 covering a part of the basic I/O package unit 3 and the basic DC/DC converter 4a, and a space 719 formed between air supply panel 28 and the inner wall (see FIGS. 62 and 64). Further, a part of the cooling air 22 flows into the right side face of the casing 1 (left side surface seen from the behind). The cooling air flows into the casing 1 and is put in order by the guide panel 739 to flow almost uniformly toward opening portion of the units arranged in parallel. That is to say, by covering the rear sides of the basic I/O package unit 3 and the basic DC/DC converter 4a with the guide panel 739, disordered flow of the cooling air into the basic I/O package unit 3 and the basic DC/DC converter 4a may prevented, thereby making it possible to guide the cooling air to the opening, as described hereinafter and to distribute in a fixed amount in accordance with the predetermined cross sectional area of the opening. Therefore, each of the units may be cooled properly by the fans having the restricted ability.

The cooling air 22 flows to the main processing unit 2 through the punched hole of the opening 733 located at the end portion of the right side surface of the casing 1. Then, the cooling air 22 flows into inside of the main processing unit 2 from the axial fan 23a to flow horizontally along the circuit boards in the main processing unit 2 (see FIG. 12).

The cooling air flowing near the guide panel 739 flows into the basic I/O package unit 3 and the basic DC/DC converter 4a through the punched holes formed in the openings 734, 735 and 737 of the guide panel 739 and the punched hole of the opening 738 formed at the end portion of the basic DC/DC converter 4a, and passes through between the circuit boards.

The cooling air passed through the main processing unit 2, the basic I/O package unit 3 and the basic DC/DC converter 4a joins at a hollow 732 formed above the cross-flow fans 30 and is drawn by the cross-flow fans 30.

After flowing out from the cooling fan unit 7a, the cooling air 22 flows out from the air vent 27a of the punched member 27 formed in the opening portion 160a of the base plate 160 and passes under the skirt 26 and the casters 25. And then, the cooling air 22 is discharged outside of the casing 1.

The amount of the cooling air passing through the main processing unit 2, the basic I/O package unit 3, and the basic DC/DC converter 4a may be substantially determined by the cross sectional areas of the openings. In this embodiment, the amount is determined by the openings 733, 734, 735, 736, 737 and 738. In other words, the size of these openings is decided for determining the amount of the cooling air to be flown into the units arranged in parallel.

Accordingly, when developed cooling ability is required, it is necessary to provide the auxiliary units. In this embodiment, a sub-fan 7c is provided to the main processing unit 2 in order to increase the amount of the cooling air passing in the main processing unit 2, thereby to increase cooling ability. Regarding the basic DC/DC converter 4a, the duct 33 is provided thereto for securing the fixed amount of the cooling air.

The operation of the cooling in the second flow channel will be described.

As shown in FIG. 64, the cooling air 22 flows into the casing 1 from a right half side of the air supply panel 28, flows out from the left half surface of the inner cover provided with the filter 29 (shown by an arrow of a broken line) and flows into the extended I/O package unit 141. After flowing in the extended I/O package unit 141, the cooling air 22 is drawn by the cooling fan unit 7b. Also, after flowing into the casing 1 from the air supply panel 28, the cooling air is drawn by the main fan unit 7b through the bypass 711 (see FIG. 62).

In the former case, the cooling air 22 is introduced from an opening 141x and 141y of the extended I/O package unit 141, flows obliquely or horizontally through the extended I/O package 141, and then is exhausted from an opening 141z formed at the lower side of the extended I/O package unit 141. In order to let the large amount of cooling air flow into the DC/DC converter 4a of the extended I/O package unit 141, inlet of the extended I/O package unit 141 to the DC/DC converter 4b is enlarged.

In the latter case, after flowing out from the air supply panel 28, the cooling air is not introduced directly to the main fan unit 7b having two cross-flow fans 30 but is introduced near the rear portion of the extended I/O package unit 141. That is to say, the inlet portion 720 of the main fan unit 7b is only located near the rear portion of the extended I/O package unit 141, and is opened over the region of the extended I/O package unit 141.

As shown in FIGS. 62 and 36, a silencing material 152 is attached by a double-sided adhesive tape to the region other than the area which overlaps the extension I/O package unit 141, so as to oppose the air supply panel 28.

The flow of the cooling air 22 from the cross-flow fan 30 is deflected and the deflected air is made to pass through the diverging duct 741 and passes the HDD unit 5, AC/DC converter 4 and the circuit unit 118, so as to be discharged through the punched member 27 of the floor plate, as in the case of the first air flow channel 730. The air is then relieved to the exterior of the computer housing 1 via the discharge holes (small holes) in the skirt 26 and also through the space between the skirt 26 and the floor.

The cross-flow fan 30 is speed-controlled in accordance with a control signal given from a control circuit board of the basic I/O package unit 3. Thus, the control circuit on the control circuit board of the basic I/O package unit 3 operates to control the fan motor speed in accordance with the output from a temperature sensor 34 connected to this control circuit.

Figure 67:
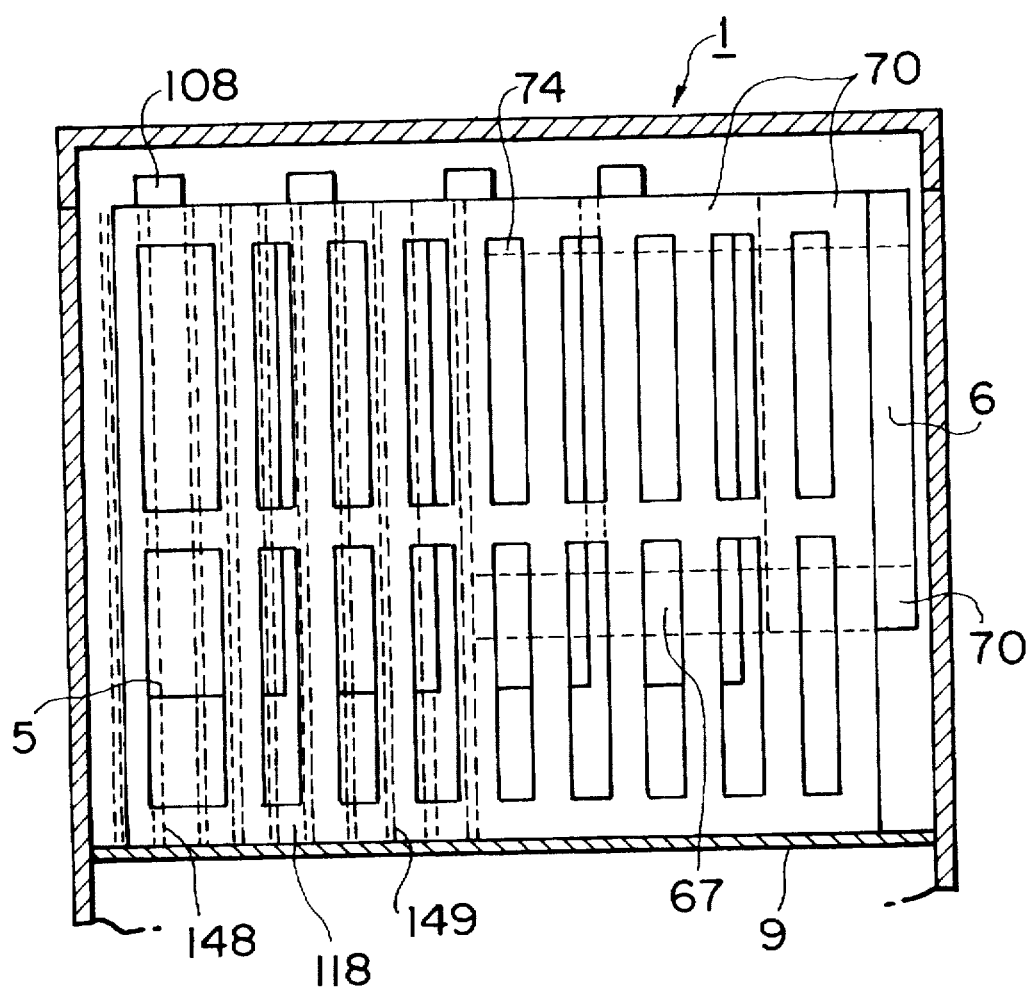
FIG. 67 is a top view showing a portion of HDD unit of a computer of one embodiment of the present invention.

A description will now be given of the flow channel through the HDD unit 5, AC/DC converter 6 and the circuit unit 118, with reference to FIG. 67. FIG. 67 is a top plan view of the front half part of the computer 1 (cut at a portion above the HDD unit 5). The arrangement is such that the cooling air flows through the spaces between adjacent HDDs 108, through the main AC/DC converter 70 which is a part of the AC/DC converter 6, through the INPUT section 67 and through the space between the long package 148 and the half package 149 of the circuit unit 118.

This cooling structure offers the following advantages.

Firstly, by providing a pair of cooling air flow channels in the computer 1, it is possible to lower the temperatures of heat-generating units in the computer, thus realizing more uniform temperature distribution over plural heat-generating units, as compared with the case where only one cooling air flow channel is used.

Secondly, by providing a sub-fan upstream of the heat-generating unit which generates heat at a specific rate, it is possible to supply cooling air to such heat-generating unit at a specifically large flow rate, so that the coefficient of heat transfer between the cooling air and the heat-generating unit is enhanced to effectively lower the temperature of such a heat generating unit. Provision of independent sub-fan also reduces burden on the main fan, thus eliminating necessity for the use of large-capacity fan motor and, hence, averting from problems which are inevitable when large-capacity motor is used, such as increase in the noise, electrical power consumption and production cost.

Thirdly, the installation of a cross-flow fan inside the casing 1 prevents external emission of noise which is generated inside the fan, as well as the noise generated as a result of collision of the air with an obstacle at the fan outlet, thus contributing to the reduction in the noise level emitted to the exterior of the casing 1.

As the fourth point, it is to be noted that the skirt 26 provided on the bottom of the casing 1 remarkably reduces the noise which is generated when the cooling air 22 impinges upon the floor, while preventing dust and other matters from being scattered in the room. When discharge openings 119 are provided in the skirt 26, air can be discharged not only from the bottom of the skirt 26 but also from such discharge openings. In other words, total cross-sectional area of the air discharge passage is increased, so that the pressure loss is reduced to enhance the cooling air flow rate.

As the fifth point, the basic DC/DC converter 4a is supplied with cooling air at a sufficiently large rate, by virtue of the duct 33 provided in the discharge portion of the basic DC/DC converter 4a.

As the sixth point, it is to be understood that the cooling air introduced into the second cooling air flow channel shuts into a portion which flows into the extension I/O package unit 141 and then into main fan unit 7b and a portion which is sucked into the main fan unit 7b composed of the pair of cross-flow fans 30 after being supplied from the air supply panel 28. This arrangement prevents excessive cooling air from being introduced into the extension I/O package unit 141. Consequently, pressure drop of the cooling air, as well as noise, can be reduced as compared with the case where all of the cooling air through the second channel is introduced into the extension I/O package unit 141.

A seventh advantage resides in that the suction of the main fan unit 7b opens only at a region which confronts the extension I/O package unit 141, so that a large distance can be preserved from the air supply opening, while another region produces silencing effect by the provision of the silencing member 152.

As the eighth point, it is to be appreciated that the duct 106 provided at the outlet portion of the main fan unit 7b produces a uniform pressure distribution of the air discharged from the fan, so that cooling air 22 is equally distributed to all HDDs 108, thus attaining uniform temperature distribution over the HDDs 108. In addition, reduction in the cooling air flow rate is diminished because the air is allowed to flow through the gaps between adjacent HDDs 108, through the main AC/DC converter 70, through the INPUT 67, and through the gap between the long and half packages 148, 149 of the circuit unit 118.

Temperatures were measured at various portions of the apparatus in order to confirm the effect produced by the invention. As a result, it was confirmed that, when the temperature of the cooling air supplied is 30° C. or so, surface temperatures of the HDDs 108 around the bearings are generally 45° to 47° C., thus proving substantially temperature distribution over these HDDs 108. Meanwhile, the main processing unit 2 and the I/O package unit 3, which receive cooling air in parallel manner, exhibit a substantially uniform distribution ranging between 70° and 80° C. The temperature of the basic DC/DC converter is about 65° C. which is sufficiently lower than the upper limit temperature.

As the ninth point, it is to be noted that the rate of supply of the cooling air can be varied optimumly, since the speed of the motor for driving the cross-flow fan 30 can be changed in accordance with a change in the temperature of the cooling air, by virtue of the operation of the control circuit board of the basic I/O package unit 3. More specifically, when the temperature of the cooling air is high, the difference between the air temperature and the maximum allowable temperature of the unit such as semiconductor device on a circuit board is so small that increase in the flow velocity, i.e., flow rate, of air 22 is necessary in order to enhance the rate of heat transfer from the unit to the cooling air. Conversely, when the cooling air temperature is low, the above-mentioned difference in temperature is comparatively large, so that the flow velocity and, hence, the flow rate of the cooling air 22 can be set low. It is therefore not necessary to drive the fan motor at high speed when the cooling air temperature is low. Consequently, the motor 35 can sustain a longer use and the consumption of electrical power by the motor 35 also is reduced, resulting in reduced power consumption of the computer 1. This also eliminates the supply of wasteful or unnecessary supply of cooling air. At the same time, the noise of the computer 1000 also is reduced.

As the tenth point, the air supply panel 28 on the rear side of the apparatus has a double-walled structure, and the air inlets formed in both walls are disposed so as not to overlap each other when viewed in the direction normal to these inlets. Consequently, the cooling air flow channel is bent or deflected to have increased length, thus producing silencing effect. A further silencing effect is achieved by attaching a silencing material 152 to the double-walled air supply panel 28 and the region other than the air inlet. The silencing material can be attached by mans of a double-sided adhesive tape so that it can be detached easily.

A description will now be given of a practical example of the silencing effect produced by the invention. In general, it is known that information processing apparatuses of the same class as that of the invention exhibits a noise level of about 60 dB (A). The noise level is as high as about 55 dB (A) even in rather "quiet" apparatuses. Even this low level of noise is annoying in an office and disturbs working environment in the office. It is to be appreciated that the invention achieves a considerable reduction in the noise level under such circumstance, as will be realized from the following description of the results of noise measurement.

The measurement was conducted at a level which is half the height (height of casing plus 1 meter) at positions 1 meter apart from the respective walls of the casing and also at a position which is 1 meter above the top wall of the casing. The casing used in this embodiment had a height of 1.4 meter, so that measurement was conducted at a level of 1.2 meter from the floor level, at four points which are 1 meter from the four walls of the casing. The measurement was first conducted without using the silencing material 152. In this case, the highest noise level of 48 dB (A) was obtained at the measuring point facing the air supply panel 28. The measurement was conducted again by charging the silencing material 152 at the position shown in FIG. 62. The highest noise level wa observed at the measuring point facing the air supply panel 28 also in this case, but the noise level was as low as 43 dB(A). The lowest noise level was obtained at the measuring point above the top wall, and the level of the noise at this point was as low as 40 dB. Noise levels at other measuring points were intermediate between these maximum and minimum levels.

From these results of measurement, it is understood that the noise level can significantly be reduced in the embodiment as compared with the conventional arrangement, by virtue of the effect produced by the double-wall structure of the inlet portion 710 of the air supply panel 28 with the inlet openings offset from each other so as to avoid direct emission of noise and by the effect of minimization of the number of the fans which are the sources of noise. It was also confirmed that the noise level can further be reduced by charging the silencing material.

2 Constructions of Units

Constructions of the units will now be described with reference to the accompanying drawings. Features mentioned in the foregoing description may be omitted from the following description in order to avoid duplication of explanation.

2.1 Main Processing Unit

Figure 37:
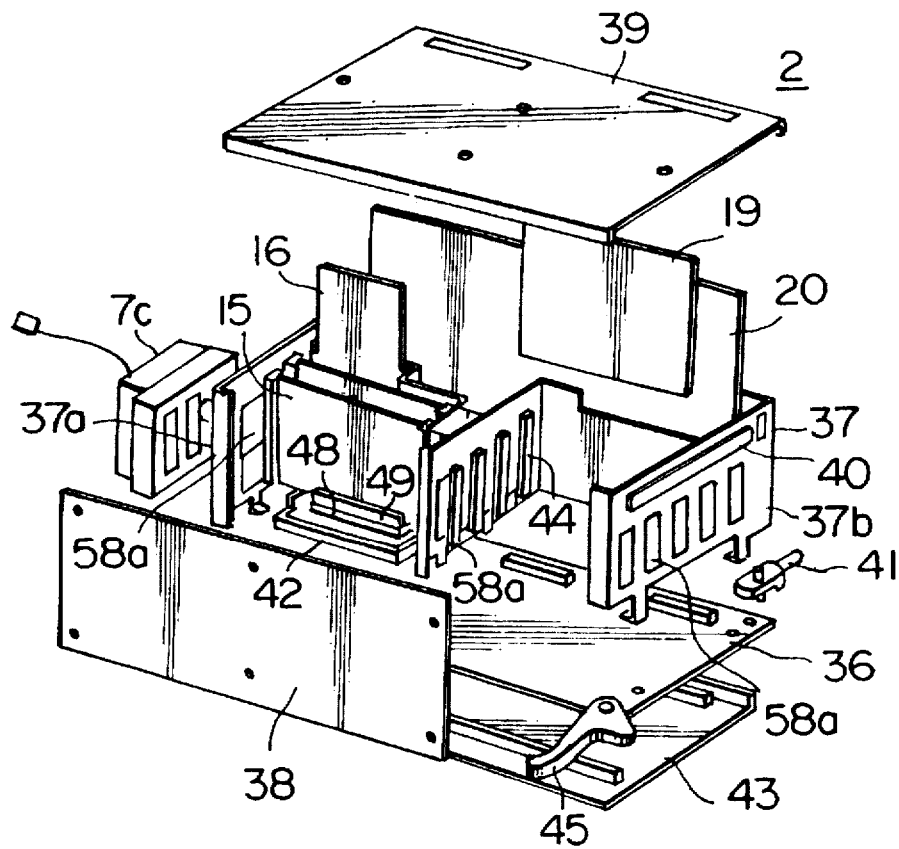
FIG. 37 is an assembling view in perspective of a main processing unit to be used in one embodiment of the present invention.
Figure 38:
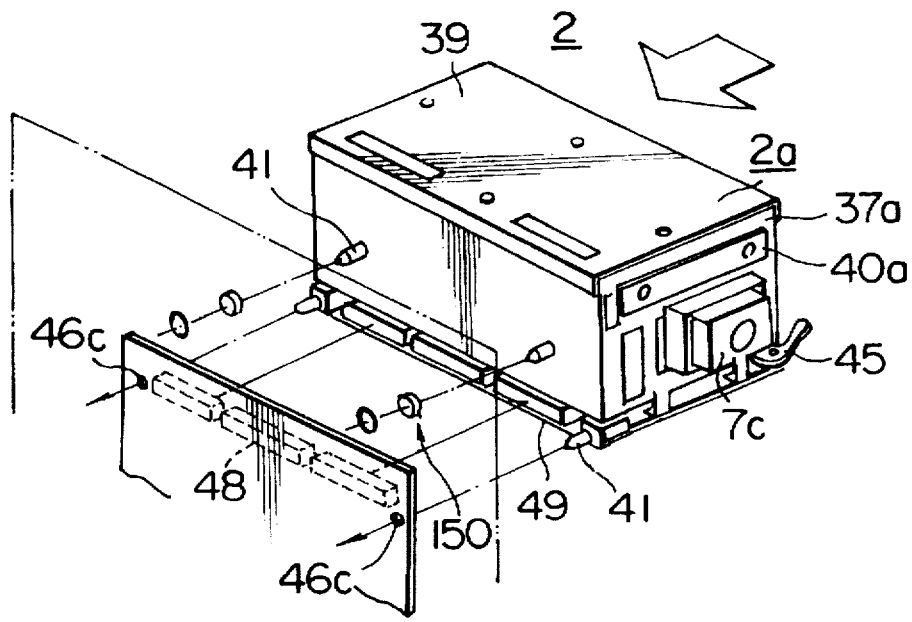
FIG. 38 is a perspective view of a main processing unit showing one embodiment of the present invention.

FIG. 37 is an exploded perspective view and FIG. 38 is a perspective view of the main processing unit 2 of the computer 1000 embodying the present invention, illustrative of the manner in which the main processing unit 2 is assembled, while FIG. 12 is a top plan view of the main processing unit 2.

The main processing unit 2 includes a CPU package as the main board, RISC processor modules 15 (two modules are used in this embodiment), OSC package 16, four MS middle cards 19, BA package 20, main case 37, front bracket 38, upper cover 39, slide rail 40, guide pin 41, setting guide 42, reinforcement plate 43, guide rail 44 and the lever 45.

The main case 37 provides the back portion 37c and both side portions 37a, 37b. A rectangular parallelopiped case 2a is formed by mounting, on the case 37, the main CPU package 36, the front bracket 38 and the upper cover 39. That is to say, the main CPU package 36 and the main case 37 are fastened together by means of screws, and the front bracket 38 is screwed to the main case 37. After mounting the respective packages, the upper cover 39 is fastened to the front bracket 38 and the main case 37 by means of screws.

Both side portions 37a, 37b of the main case 37 are constructed as to permit ventilation therethrough. Consequently, the case serves as a duct which has means of ventilation at its both sides. A local cooling fan unit 7c is disposed on the side 37 of the main case 37, i.e., upstream of the outer RISC processor module 15 of the processing unit 2. The main processing unit 2 is provided with a multiplicity of guide rails 44 which are intended to facilitate insertion of the RISC processor modules 15, OSC package 16 and the MS middle card 19 into the main CPU package 36. In addition, as will be seen from FIG. 12, a rack member 37d for mounting the RISC processor modules 15, OSC package 16 and the MS middle card 19 is provided inside the main case 37. Guide rails 44 are laid between the rack member 37d and both sides 37a, 37b of the main case 37. The arrangement may be such that small holes are formed in both sides 37a, 37b and the rack member 37d so as to receive and retain lugs formed on both ends of the guide rails 44, thereby fixing the guide rails 44.

As shown in FIGS. 38 and 12, a pair of guide pins 41 are secured to the back portion 37c of the main case 37 at the same level as each other by means of screws.

Figure 39:
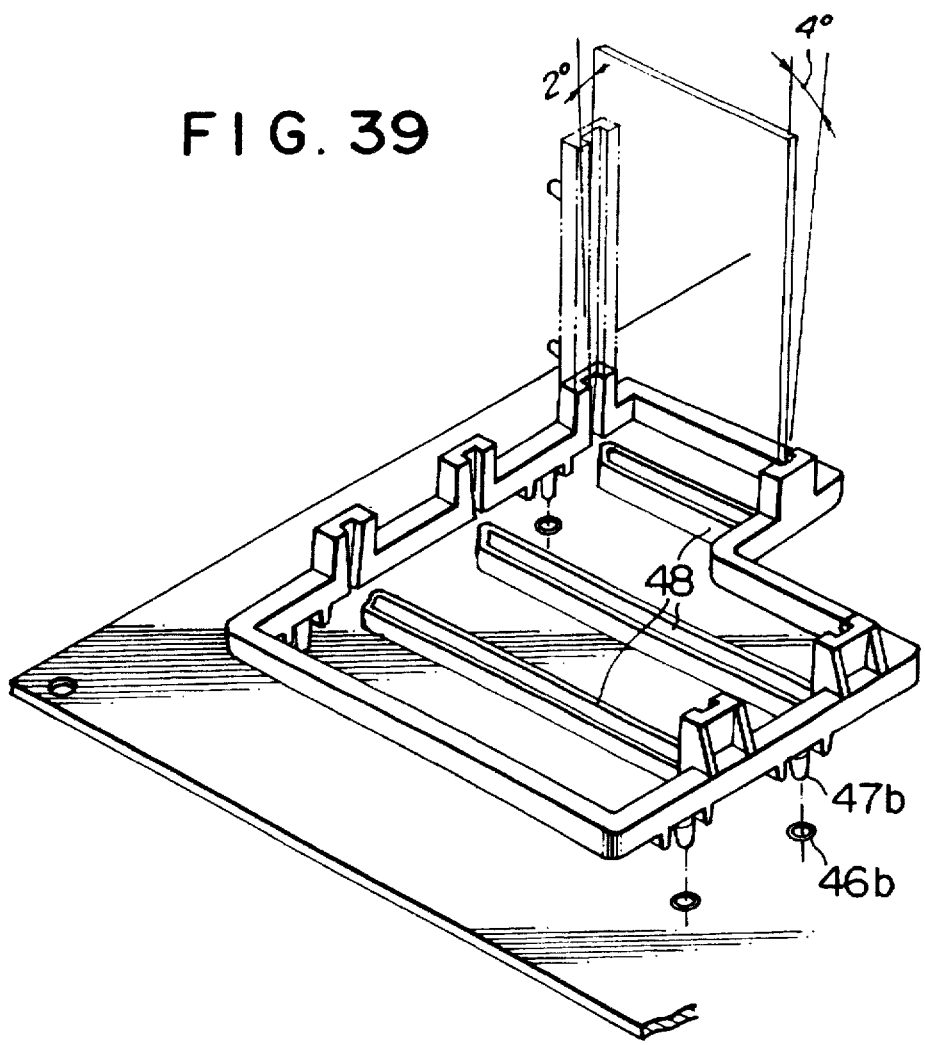
FIG. 39 is a perspective view of a cutting guide showing one embodiment of the present invention.

The CPU package 36 has, as shown in FIG. 39, a setting guide 42 which is secured thereto. More specifically, a projection 47b on the setting guide 42 is received in a small hole 46b formed in the main CPU package 36, thereby fixing the setting guide 42.

The CPU package 36 also has levers 45 as shown in FIG. 37. These levers 45 are rotatably mounted on both ends of the front bracket 38 of the main CPU package 36.

Figure 40:
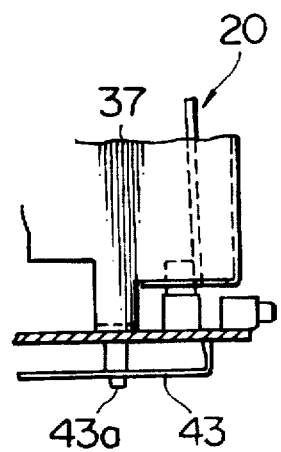
FIG. 40 is a plan view of a reinforcing plate showing one embodiment of the present invention.

Referring also to FIG. 40, a reinforcement plate 43 is attached to the back side of the CPU package 36 by means of screws 43a. In the illustrated embodiment, the screws 43a also serve to fix the main CPU package 36 and the main case 37, as will be seen from FIG. 40.

Figure 41:
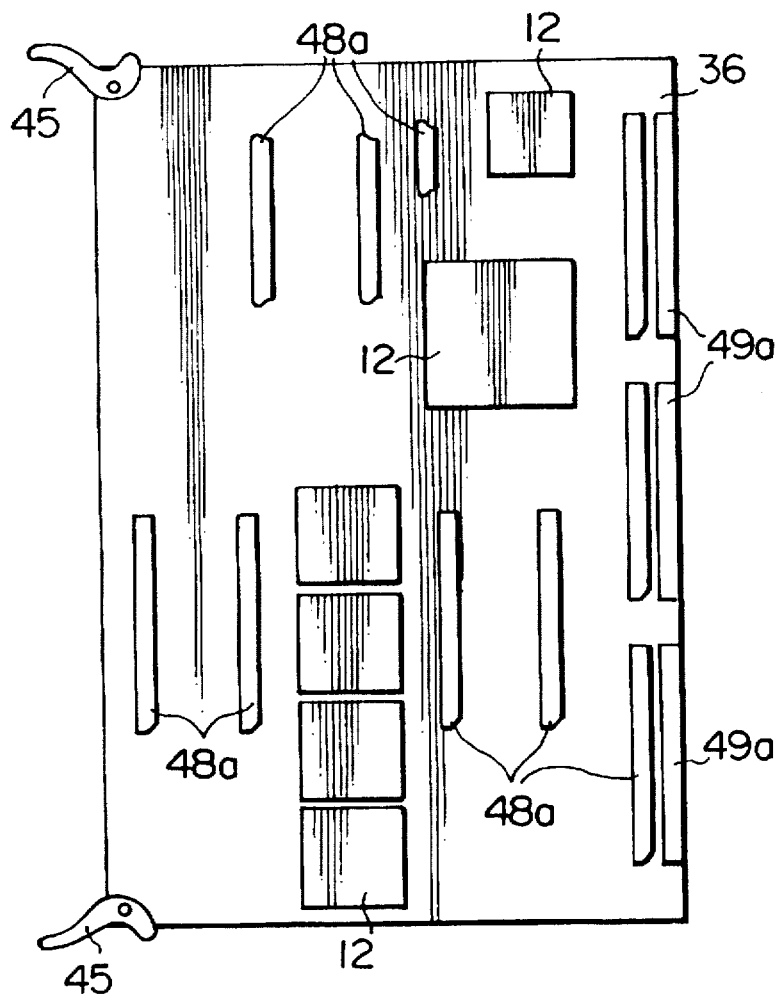
FIG. 41 is a plan view of CPU package of a main processing unit to be used in one embodiment of the present invention.

FIG. 41 illustrates the manner in which units or devices are mounted on the CPU package 36. Units or devices such as an LSI package 12 for data exchange between the CPU and the memory are mounted on the CPU package 36. Female connectors 48a for connecting RISC processor modules 15, OSC package 16, MS middle card 19 and the BA package 20 are fixed by means of pins. The CPU package 36 has a board thickness of 2.7 mm and is composed of 12 layers. There are two levers 45 attached to both longitudinal ends of the CPU package 36. Male connectors 49a for connecting the CPU package 36 to a CPU back board 8 are provided on other pair of longitudinal ends of the CPU package 36. Female connectors 48a have a multiplicity of signal pins, while the male connectors 49a are provided with holes for receiving these pins.

FIGS. 11A and 11B show the manner in which elements are packaged on the RISC processor module 15. The RISC processor module 15 carries an RISC chip package 13 serving as the brain of the computer 1, and cache memories 14 which serve as means for temporarily storing data. There are 13 cache memories on each side of the module 15. In order to increase the heat dissipation area, disk-like fins 62a are mounted on the RISC package 13 through the intermediary of grease. Furthermore, male connectors 49a for connection to the main CPU package 30 are provided. In the illustrated embodiment an RISC processor module PA-RISC produced by Hewlett Packard is used as the RISC processor module 15.

Figure 42:
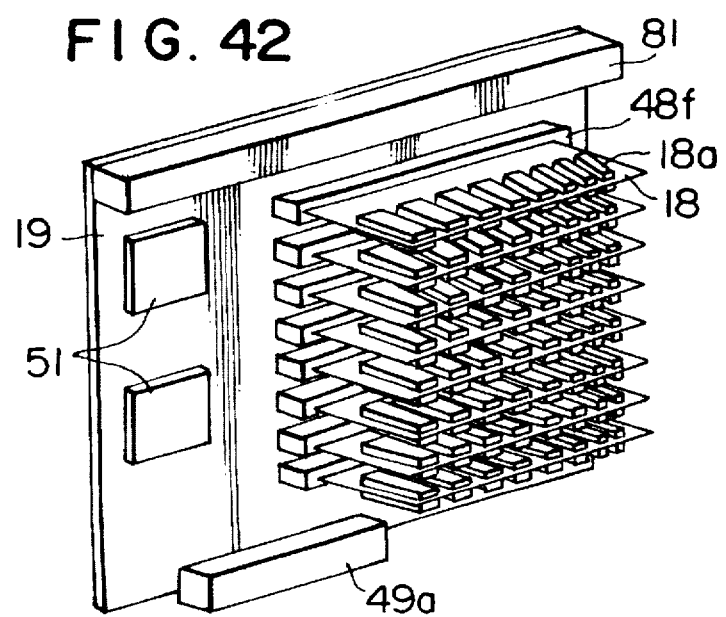
FIG. 42 is a perspective view of MS middle card to be used in one embodiment of the present invention.

FIG. 42 illustrates elements or parts mounted on the MS package 18 and the MS middle card 19. There are eight female connectors 48f, two LSI chips 51 and one male connector 49a on the MS middle card 19. To enable mounting and demounting, a pillar of a square cross-section of 5 mm wide/long is fastened by means of screws to the MS middle card 19 so as to be flush with the top edge of the MS middle card 19. The MS package 18 carries about 10 memory elements 18a on each side thereof. The MS package 18 has a male connector adapted to engage with the female connector 48f of the aforementioned MS middle card 19 so as to provide connection between the MS package 18 and the MS middle card 19. The MS package 18 serves as data storage means. Eight MS packages at the maximum can be mounted. This arrangement realizes a high-density three-dimensional packaging, allowing the cooling air 22 to flow through gaps between adjacent MS packages. It is therefore possible to make an efficient use of cooling air, thus achieving high cooling efficiency.

Figure 43:
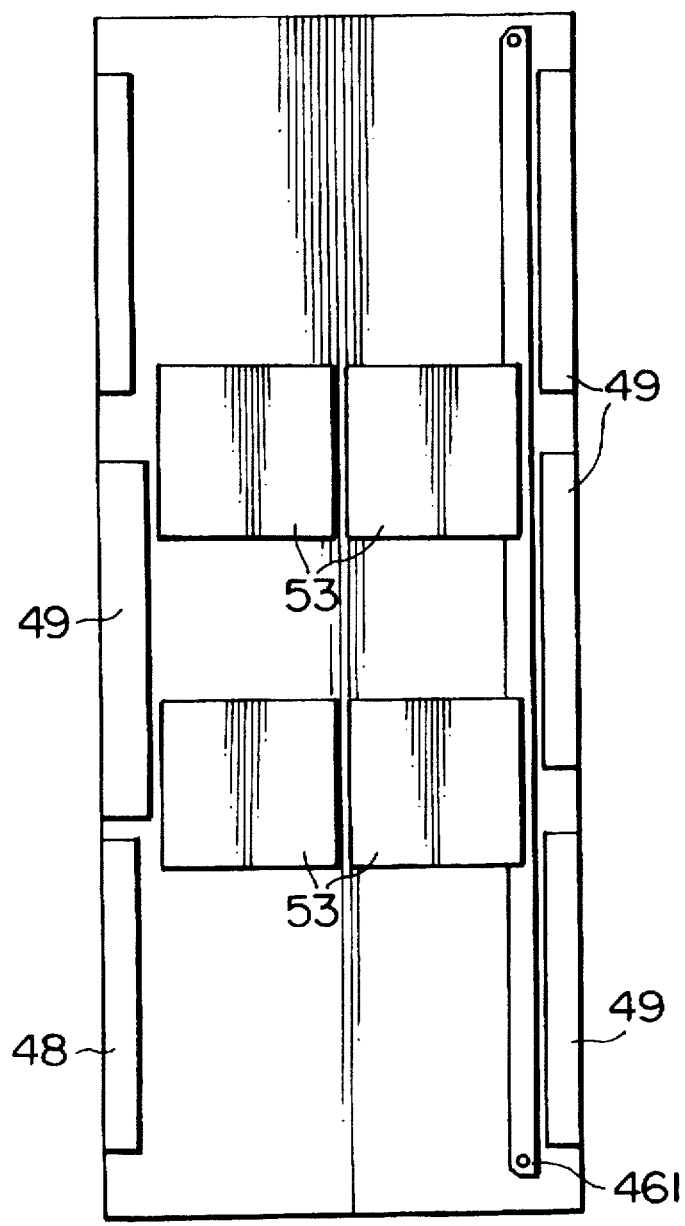
FIG. 43 is a plan view of BA package to be used in one embodiment of the present invention.

FIG. 43 illustrates the manner of packaging of the BA package 20. The BA package 20 carries four LSI chips 53, and has four male connectors 49d and two female connectors 48. Three out of four male connector are used for mounting the BA package on the main CPU package 36, while the remaining one male connector and both female connectors are used for external control. The function of the BA package 20 is to relay different signal lines. In order to enable transfer of high-speed signals to other packages without reducing the signal speed, the central one 49d of the three male connectors 49d for connection to the main CPU package 36 is used as an input terminal, while two outer male connectors 49d are used as output terminals. The signals entering to the BA package are transmitted separately through four LSI chips 53. In order to prevent retardation of signal transmission, two LSI chips 53 on the left side and two LSI chips 53 on the right side are mounted with 180° inversion from each other. The BA package 20 is detachably mountable by using a lever action, with projections 47c of a hand lever 54 (see FIG. 44) inserted into small holes 46i formed in the BA package 20.

A description will now be given of the manner in which the RISC processor modules 15, OSC package 16, MS middle card 19 and the BA package 20 are mounted on the main CPU package 36. Referring to FIG. 37, these packages are inserted into guide rails 44 secured to the main case 37. Then, male connectors 49 attached to the bottoms of the packages are inserted into female connectors 48 of the main CPU package 36 provided on the bottom of the CPU unit. Each female connector has a multiplicity of signal pins, while mating male connectors have holes for receiving these pins, thus providing electrical connection. The RISC processor modules 15 and the OSC package 16 are held by means of the guide rails 44, female connectors 48, male connectors 49 and the setting guides 42, while the MS middle card 19 and the BA package 20 are held by means of the guide rails 44, female connector 48 and the male connector 49.

Figure 44A:
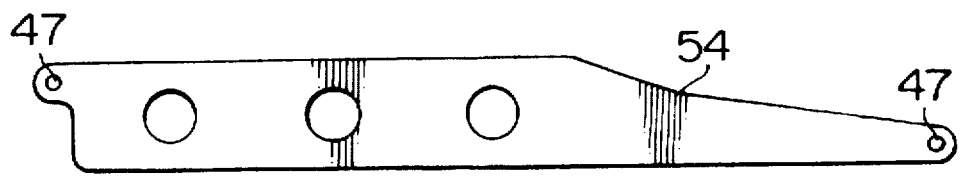
FIGS. 44A and 44B are bottom view and front view of a hand lever for removing a package to be used in one embodiment of the present invention.
Figure 44B:

FIG. 44 illustrates the construction of the hand lever 54. Mounting and demounting of the package is effected by lever action caused by the hand lever 54 which is brought into engagement with small holes formed in both ends of each package. A considerably high level of stress is generated in the CPU package 36 during mounting and demounting of the package. Such a stress, however, is effectively relieved by the reinforcement plate which backs up the CPU package 36, whereby the main CPU package 36 is freed from warp, thus ensuring high degree of reliability, as well as ease of maintenance.

Figure 45A:
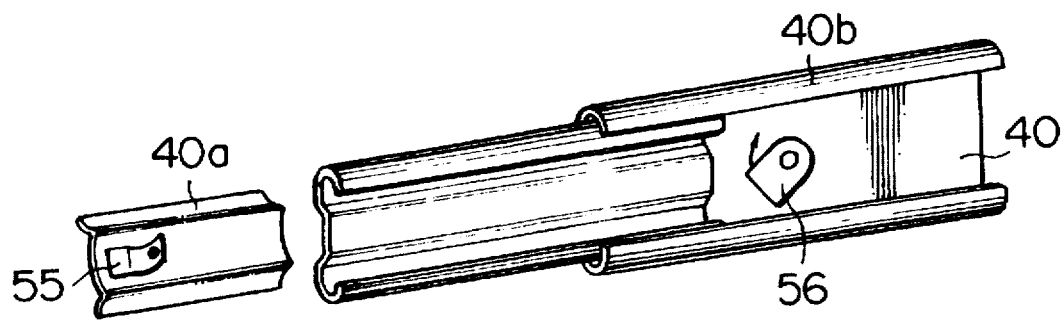
FIG. 45A is a perspective view showing a structure of a slide rail to be used in one embodiment of the present invention.

FIG. 45A shows the detail of the slide rail 40 illustrated in FIG. 37. The slide rail 40 has a male part 40a and a female part 40b. In order to ensure safety and reliability during attaching and detaching, a stopper 55 is provided on the male part 40a. The female part 40b is provided with a hinge 56, in order to ensure safety and reliability of insertion of the male part 40a into the female part 40b.

Figure 45B:
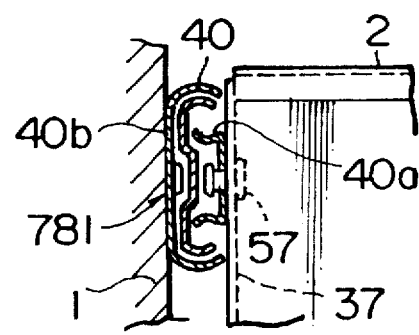
FIG. 45B is a sectional view thereof.

FIG. 45B shows an example of the mounting of the main processing unit 2 in the casing 1. A pair of the female parts 40b of the slide rails 40 are horizontally laid on a plate member inside the casing 1 and are fastened thereto by means of screws 781. A pair of male parts 40a of slide rails 40 are laid horizontally on the main processing unit 2 and are fastened thereto by means of decorative screws 57. The mounting of the main processing unit 2 is conducted as follows. As the first step, the male parts 40a of two slide rails 40 are inserted into mating female parts 40b of the slide rails 40. The hinges 56 act so as not to allow the female parts 40b to be pushed back into the casing 1 until the male parts 40a are inserted into mating female parts 40b. When the male parts 40a have been inserted to midway, the stoppers on the male parts 40a start to act. Thereafter, the stoppers 55 are pushed so that the main processing unit 2 can be inserted into the position of the CPU back board 8.

Referring again to FIGS. 37 and 38, as the means for ensuring safety and reliability during mounting and demounting, as well as maintenance, of the main processing unit 2, a pair of tapered guide pins 41 are provided on the main case 37 substantially at the same level as each other, besides the slide rails 40 described above. The casing 1 is provided with small holes 46c at positions corresponding to the guide pins 41. The small holes 46c have a size which is about 4 to 5 mm greater than the pins. These pins 41 are received in the small holes 46c, whereby the main processing unit 2 is held. Levers 45 are provided for the purpose of ensuring that the main processing unit 2 completely engages with the CPU back board 8. These levers 45 are rotatable in small holes 46d which are provided in both ends of the main CPU package 36 opposite to the ends which have the male connectors 49e. According to this arrangement, when the levers 45 are rotated until they are stopped by the plate member inside the casing 1, the male connectors 49e of the main processing unit 2 are brought into complete engagement with the female connectors 48e on the CPU back board 48e, by the lever action of thee levers 45, thus achieving perfect connection between the main processing unit 2 and the CPU back board 8. Conversely, demounting of the main processing unit 2 from the casing 1 is conducted by rotating the levers 45 so as to disconnect the male connectors 49e from the female connectors 48e, so that the main processing unit 2 becomes extractable from the casing 1. When the main processing unit 2 has been extracted to midway, the user pushes the stoppers on the male parts 40a of the slide rails 40, so that the main processing unit 2 can be detached from the casing 1.

It will be understood that the described arrangement enables safe and reliable maintenance work. The male parts 40a of the slide rails 40 are secured by means of decorative screws 57 so that they can deviate 2 or 3 mm, which facilitates insertion of the main processing unit 2.

The main processing unit 2 has a duct-like structure, and the packages are arrayed in the same direction so as to enable cooling air to easily flow through the main processing unit 2. The CPU package 36 also forms part of this duct. The guide rails 44 for holding the packages and the metal plates are disposed at the air inlet and outlet of this duct. The side portions 37a, 37b of the main case 37 and the rack member 37d are provided with rectangular openings 58a which have shapes corresponding to the shapes of the respective packages. These shapes of the openings 58a are adopted so that the packages may be provided with cooling air 22 at different flow rates corresponding to the rates of generation of heat from the respective packages. In addition, the inlet area of the air of the duct is restricted to eliminate any wasteful portion of the cooling air 22, while increasing the flow velocity of the cooling air 22, with the result that the rate of transfer of heat is increased to suppress temperature rise of the semiconductor elements on the package, thus improving reliability and performance of the computer.

2.2 I/O Package

FIG. 46 shows the detail of the basic I/O package unit 3 which is illustrated in FIGS. 8 and 9 and which embodies the present invention.

The computer 1000 of this embodiment mounts 12 (twelve) basic I/O package units 3a in total. Seven out of the twelve are used for control of I/O device, while the remaining five are adaptable to BUS specification. An RPC (remote power on control) package is mounted as an option part. This package has a function of turning the power supply on and off through communication from the exterior. A power control package 3b and a package 3c having the function of service processor are disposed under the basic I/O package 3a. The package 3c is provided with a temperature sensor 34 and a control circuit which is not shown. This circuit board functions as a control circuit for controlling the motor which drives the cross-flow fan 30. Thus, the package 3c constitutes a control circuit board. It is possible to construct such that the sub-fan unit 7c also is controlled by this sensor and the control circuit.

The four circuit boards positioned under the package 3c constitute the DC/DC converter 4a which will be described later.

For mounting these packages, guide plates 59 of the packages are inserted into the guide rails 44. The guide rails 44 have projections inserted into the small holes in a metal plate inside the casing 1, whereby the guide rails 44 are fixed in the casing 1. The guide plates 59 are on lateral sides of the casing 1. After the insertion, the aforementioned hand lever 54 is brought into engagement with the small holes 46f formed in both ends of upper part of each package, thereby driving the package into mount position by the lever action. After the mounting, the package is fixed at its both ends by screws to the metal plate inside the casing 1. In this state, the male connector on one side of the package is coupled to the female connector 48 on the back board, thereby enabling supply of electrical signals. A female connector 48 for GP-1B and RS232C for receiving signals from the exterior is provided on the portion of the package adjacent to the guide plate 59.

A guide panel 73 (see FIG. 9) is disposed on the proximal side of the basic I/O package unit 3 and the basic DC/DC converter 4a as viewed in FIG. 46, so as to cover this side of the basic package unit 3 and the basic DC/DC converter 4a when they are mounted.

The cooling air 22 passes through a constant-size chamber until it is sucked into the cross-flow fan 30 after flowing out of the basic I/O package unit 3. That is to say, the basic I/O package unit 3 forms a duct.

Many semiconductor chips are mounted on each package. An I/O cover is mounted in the casing 1 so that the cooling air 22 is supplied from one side of the package and then through the package. The air discharge portion of each package has a rectangular opening 58b having a width equal to the width of the package, at a location other than a location where the guide rail 44b is provided. This arrangement ensures that whole cooling air 22 is supplied into the spaces between the packages,without being used wastefully. Consequently, the semiconductor chips mounted on the package can be effectively cooled to ensure high reliability of the apparatus.

2.3 DC/DC Converter

Figures 48A, 48B:
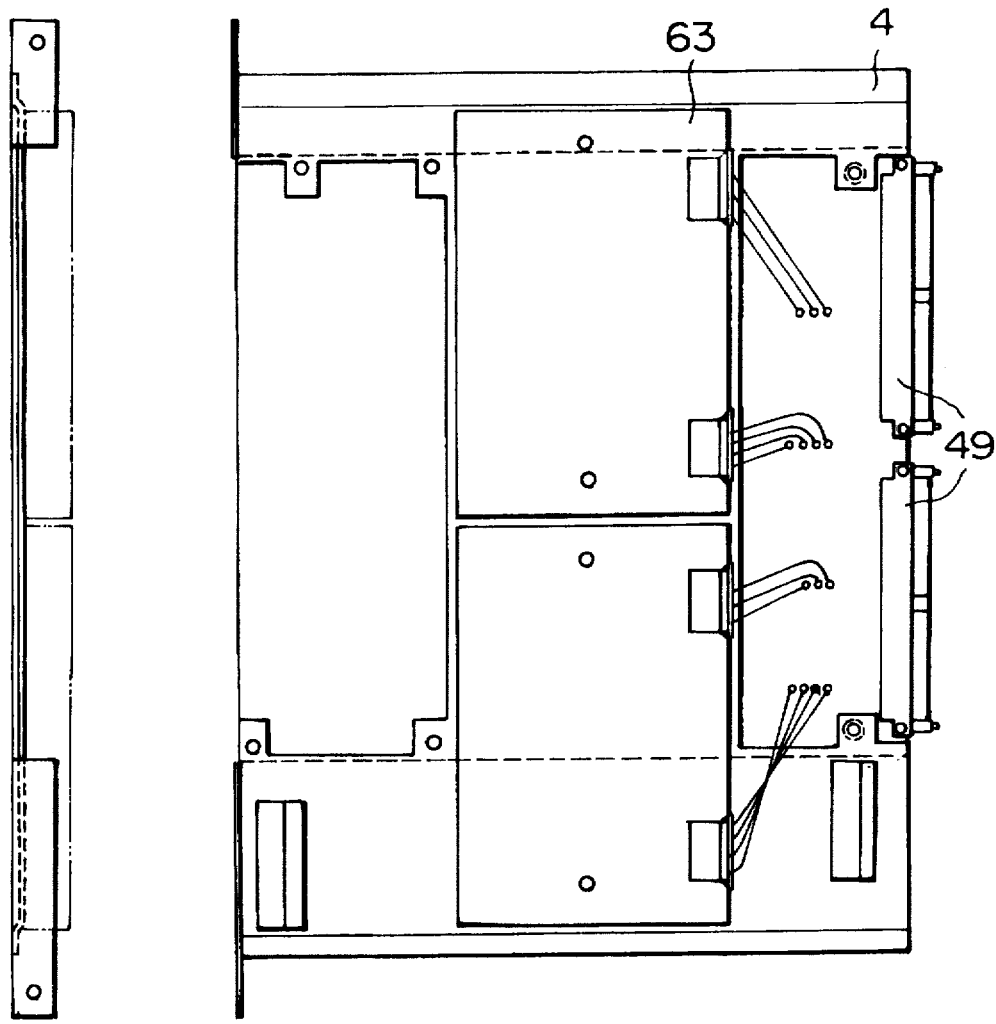
FIG. 48A is a plan view of a package constituting one part of DC/DC converter to be used in one embodiment of the present invention.
FIG. 48B is a side view thereof and FIG. 48C is a front view thereof.
Figure 48C:
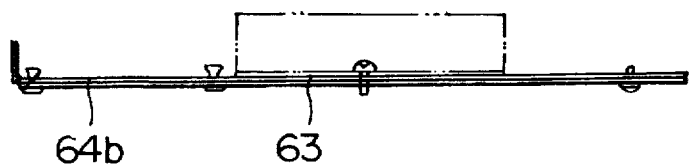

The basic DC/DC converter 4a used in the described embodiment is composed of a plurality of packages stacked in layers. The first and second packages as counted from the top are illustrated in FIGS. 47A, 47B and 47C, while the third and fourth packages are shown in FIGS. 48A, 48B and 48C. The conversion efficiency of the DC/DC converter 4a is 78%. Converter circuit boards are mounted on the packages of the basic DC/DC converter 4a. More specifically, the first, second, third and fourth packages as counted from the top respectively mount two, two, one and two converter circuit boards 63. The upper three packages are formed of aluminum sheets 64 so as to improve heat dissipation. In addition, the first and second packages as counted from the top have heat radiating fins 62a for increasing the area of heat dissipation, in consideration of the rates of dissipation of heat from the converter circuit boards 63. The heat radiating fins 62a have a length of 280 mm which is equal to that of the basic DC/DC converter 4a. The heat radiating fins 62a are constructed as a plate fin having seven fins integrally formed on a fin base plate. The width of this plate is 48 mm, fin height is 23 mm (base plate thickness 8 mm) and the fin thickness is 3 mm. This fin plate can be formed by extrusion. In order to reduce contact heat resistance, a grease 65 having high heat conductivity is applied between the fins 62a and the aluminum sheet 64a, between the converter circuit board 63 and the aluminum sheet 64a and between the aluminum sheet 64a and an aluminum sheet 64b which is secured to a metal plate inside the casing 1. The converter circuit board 63, aluminum plates 64a, 64b and the heat radiating fins 62a are integrated by means of screws 64c.

Figure 49:
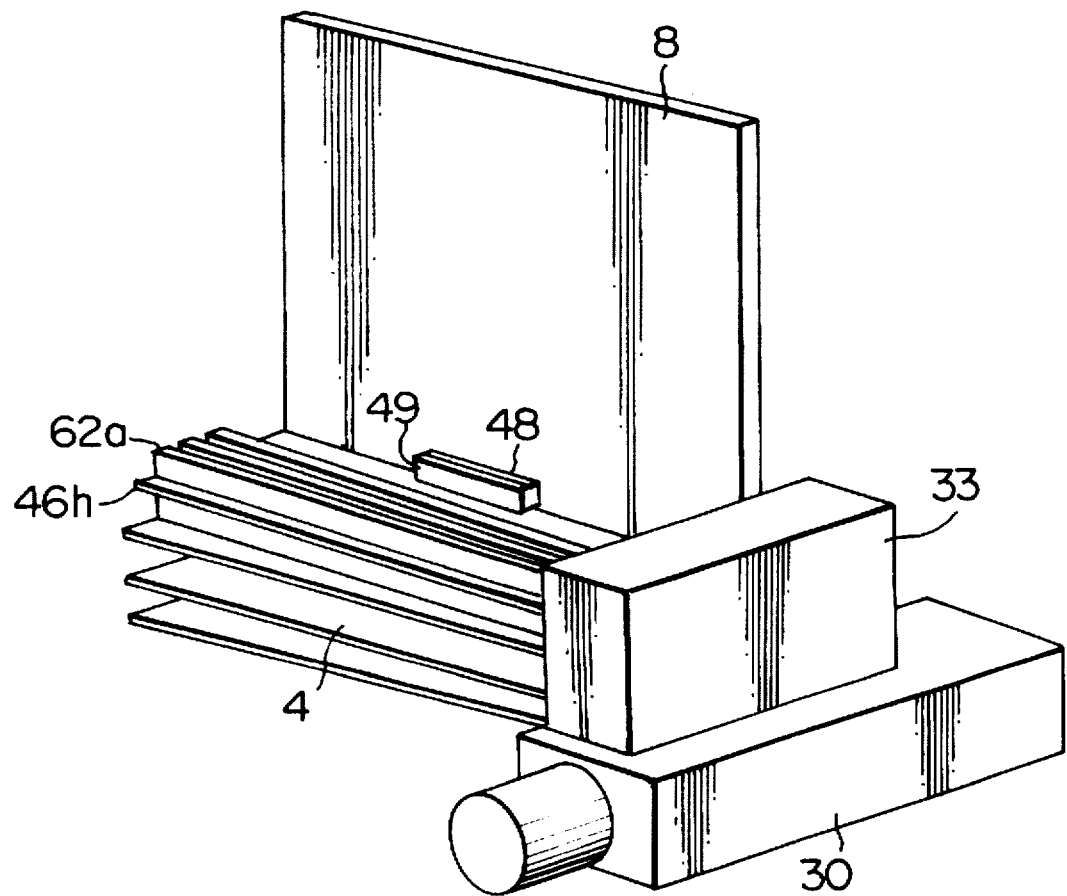
FIG. 49 is a perspective view of DC/DC converter to be used in one embodiment of the present invention.

FIG. 49 illustrates the detail of an example of the practical construction in which the basic DC/DC converter 4a is mounted on the casing 1. The basic DC/DC converter 4a is inserted along the guide rails 44 so that the male connector 49 on one end of the basic DC/DC converter 4a is coupled to the female connector 48 on the CPU back board 8. Mounting and demounting of the basic DC/DC converter 4a is conducted in the same manner as those for the packages on the main processing unit 2 and the basic I/O package unit 3, using a hand lever 54 which is engageable with small holes 46h which are provided on both ends opposite to the connector. After the mounting, each package is fastened at its both ends to a metal plate in the computer 1 by means of screws.

In order to effectively supply the basic DC/DC converter 4a with cooling air efficiently at a large rate, a duct 33 is provided to extend between the discharge opening of the basic DC/DC converter 4a and the suction side of the cross-flow fan 30. Since the base plate of the heat radiating fins 62a extends in the same direction as the cooling air 22, it is possible to make an efficient use of the flow of cooling air 22, thus reducing the temperatures of the semiconductors and coils on the converter circuit boards 63a, 63b. The use of aluminum as the material of the converter structure improves heat conduction, thus contributing to improvement in the cooling performance, as well as to reduction in the weight of the computer 1000.

2.4 Extension I/O Package

FIG. 50 shows the packaging structure of the extension I/O package 141. The I/O package 141 carries, as is the case of the basic I/O package unit 3, 12 (twelve) I/O packages and a DC/DC converter 4b which supplies power to the extension I/O package 141. The flow channel of the cooling air 22 is so set that the cooling air is taken from the left front side of the extension I/O package 141 and is discharged from the right rear side of the same so as to be sucked into the main fan unit. Packaging is conducted from the upper side and the power supplying DC/DC converter 4b is mounted on the uppermost stage. Heat radiating fins are provided on the reverse side of the DC/DC converter 4b. In order to increase the flow rate of the cooling air 22 into the power supplying DC/DC converter 4b, air supply opening is provided also on the left side, thus increasing the total cross-sectional area of the air inlet.

According to the described arrangement, cooling air 22 is taken from the left front side of the extension I/O package 141 and is discharged from the right rear side of the same so as to be sucked into the cooling fan unit 7b, thus producing substantial cooling effect on the extension I/O package 141 which is provided with components such as connectors on both sides thereof. Since the packaging is commenced with the uppermost stage, and since this uppermost stage carries the power supplying DC/DC converter 4b, it is possible to make an efficient and maximum use of the cooling air 22 supplied by the cooling fan unit 7b. The power supplying DC/DC converter 4b exhibits improved heat dissipation by virtue of the heat radiating fins provided on the reverse side thereof, so that the temperature rise of this converter is minimized.

2.5 Storage Unit (HDD Unit)

Figure 51:
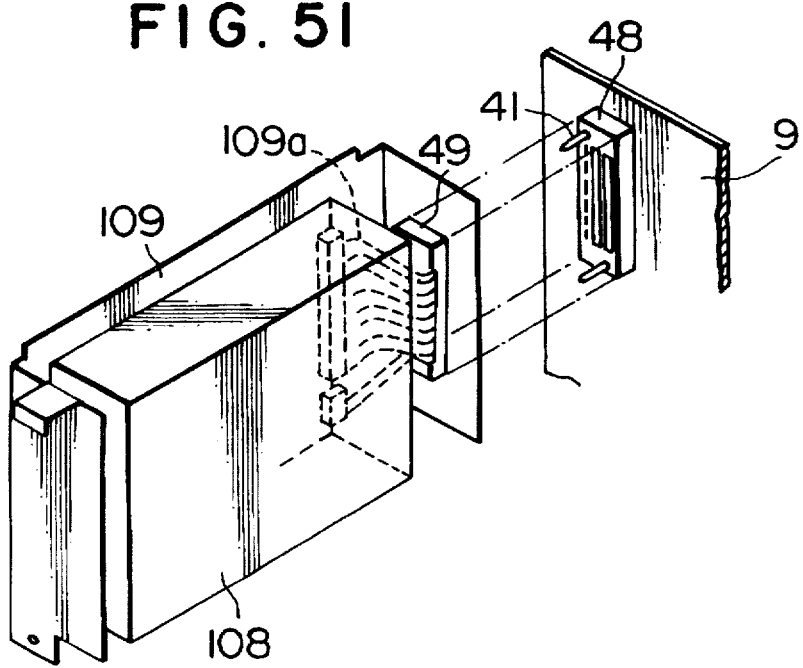
FIG. 51 is a perspective view showing a mounting condition of HDD to be used in one embodiment of the present invention.
Figure 52:
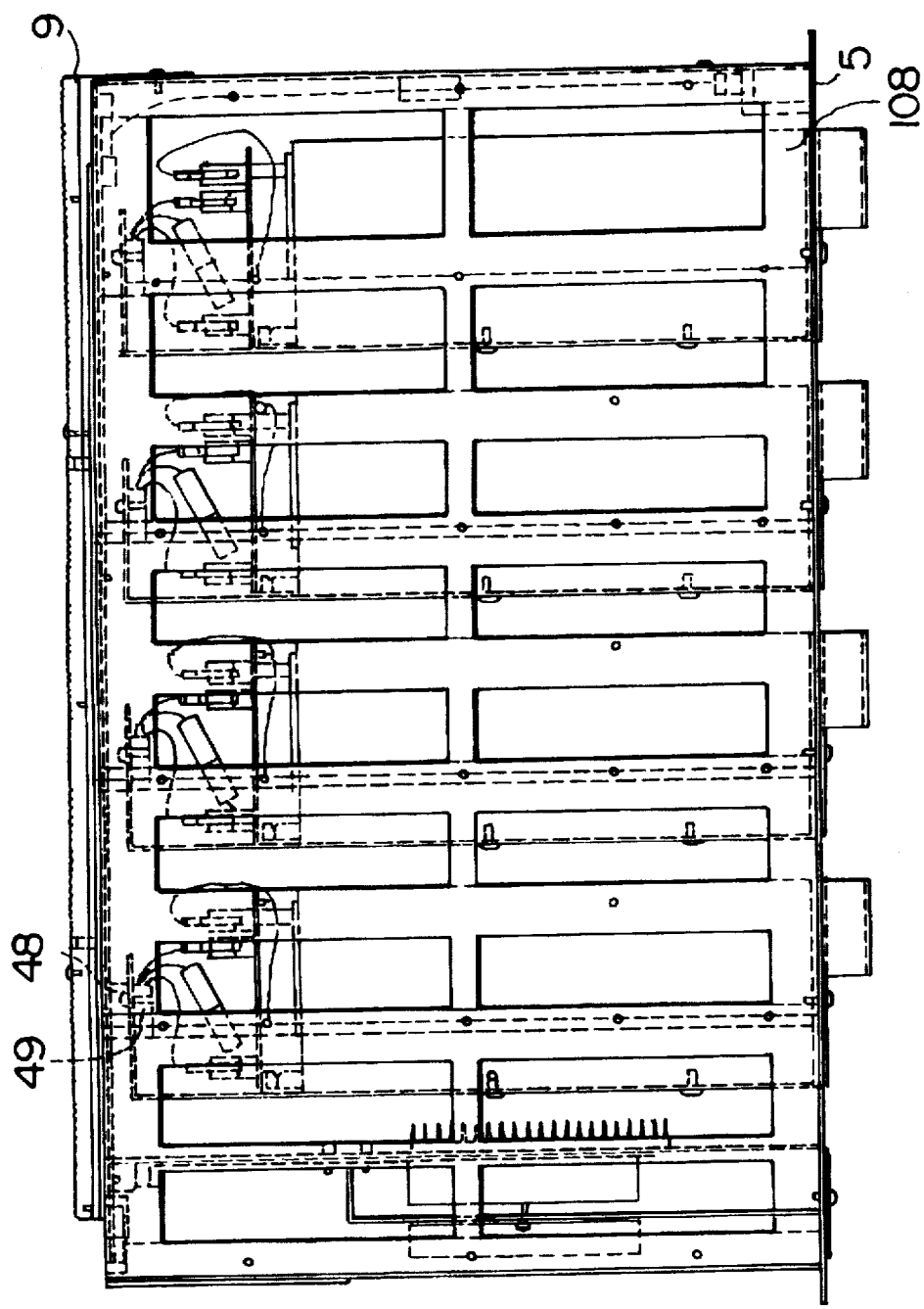
FIG. 52 is a top view showing a mounting condition of HDD unit to be used in one embodiment of the present invention.

FIGS. 51 and 52 show the detail of the HDD unit 5 in the computer 1000 which was describe before in connection with FIGS. 8 and 9 as an embodiment. HDD 108 is fastened to an HDD plate 109 by means of screws, and the control signals and the power are connected to an HDD back board 9 through a cable 109 between an HDD 108 and the plate 109. The male connector 49 fixed to the HDD plate 109 is fastened by means of screws and is supported by a floating type structure so as to be movable several mm to facilitate connection to the HDD back board 9. This floating type structure also produces an effect to prevent destruction of the HDD 108 due to vibration. The male connector 49 is introduced while being guided by a guide pin 41 of a female connector 48 on the HDD back board 9. The HDD unit 5 is fixed to the casing by means of screws.

According to the described arrangement, it is possible to smoothly load the HDD 108 and to improve reliability of the solder portion of the male connector 49 on the HDD 108 because the vibration of the HDD is sufficiently damped before transmitted to the HDD back board 9.

FIG. 52 is a top plan view of the HDD unit 5. As will be seen from the drawings, the clearances 100 between the HDDs 108 are almost equal. By providing a diverging duct on the discharge side of the cooling fan unit, i.e., the air inlet of the HDD unit 5, it is possible to uniformly distribute the cooling air over the entire part of the HDD unit 5. Provision of an HDD back board 9 eliminates the necessity for the cable which is to be used for the purpose of signal transmission, whereby the construction is simplified considerably. In addition, since the disks are incorporated in the form of a unit, it is possible to replace the disks with smaller ones, e.g., to replace 5 inch disks with 3.5 inch disks, according to the user's specification. Thus, the described embodiment is effective also as an enhancing means. In addition, the described arrangement permits connection and disconnection of alive lines even during operation of the computer 1000.

2.6 AC/DC Converter

The AC/DC converter 6 has a single INPUT section 67, three main AC/DC converters 70 and a single auxiliary AC/DC converter. Two AC/DC converters 70 are arranged on the upper stage, and one AC/DC converter 70 is set on the lower stage, as viewed from the direction normal to the plane of FIG. 8. The power factor is 85%. The auxiliary AC/DC converter 74 is installed on the center of the lower stage as viewed in the above-mentioned direction.

Figure 53A:
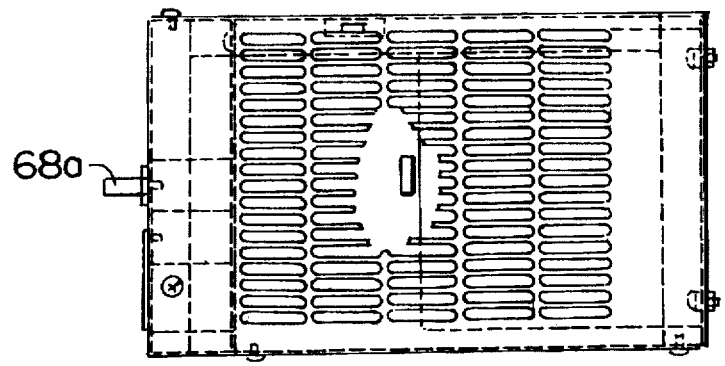
FIG. 53A is a top view of INPUT to be used in one embodiment of the present invention.
Figure 53B:
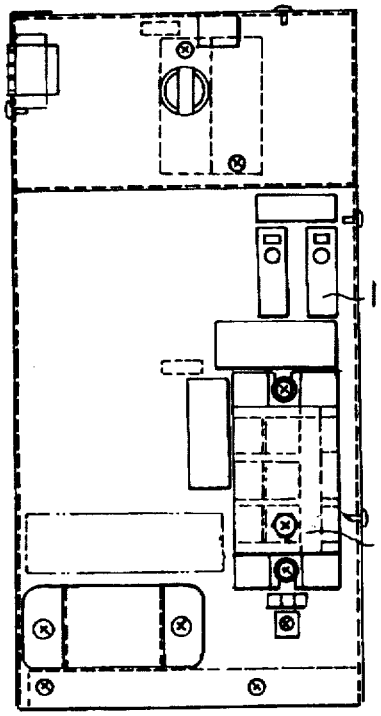
FIG. 53B is a front view thereof and FIG. 53C is a side view thereof.
Figure 53C:
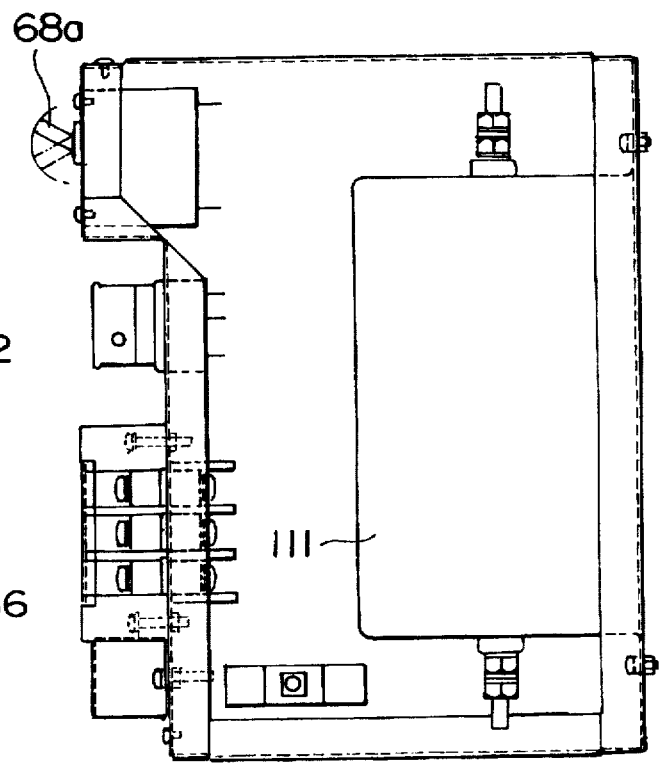

The construction of the INPUT section 67 is shown in FIGS. 53A, 53B and 53C. The INPUT section 67 is disposed on the central lower stage as viewed in the direction normal to the plane of FIG. 8. The INPUT section 67 is supplied with electrical power of A.C. 200 V through a three-layered power supply cable connector. A breaker 68a is provided on an upper part of the INPUT section 67 to protect the system against leakage of current and to enable cut-off of the power when the computer is not used. Overvoltage protection circuit 112 against thunder and a noise filter circuit 111 also are included. In view of the fact that high voltage and large current are used in the computer, ventilation of the INPUT section 67 is conducted through a multiplicity of tiny slits 145 of 4 mm wide and 20 mm long which prevents small foreign matters from coming into the INPUT section 67.

Figure 54A:
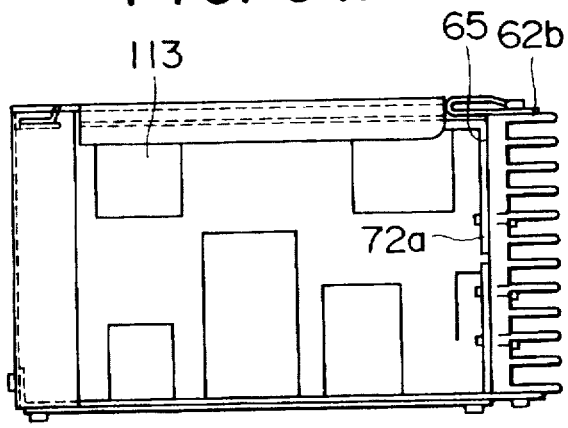
FIG. 54A is a top view of a main AC/DC converter to be used in one embodiment of the present invention.
Figure 54B:
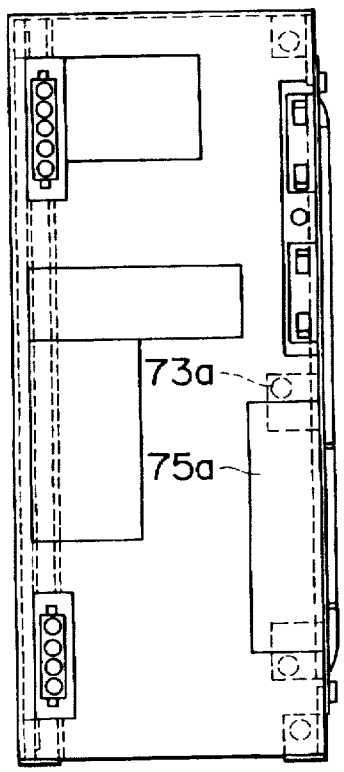
FIG. 54B is a front view thereof and FIG. 54C is a side view thereof.
Figure 54C:
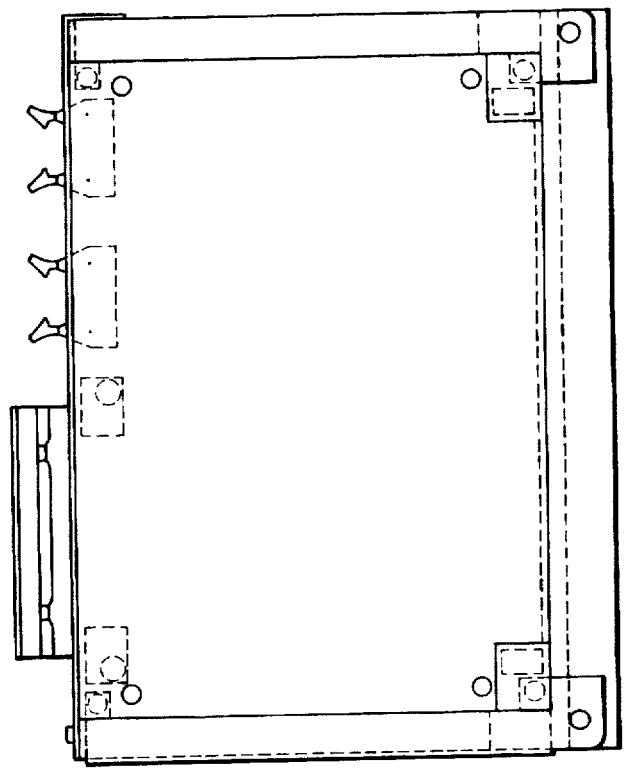

FIGS. 54A, 54B and 54C show the construction of the main AC/DC converter 70. DC power supply terminals 75a are disposed on the front side, while, at the rear side, an aluminum hat dissipation fin unit 62b is attached to a heat radiation plate 72a of the main AC/DC converter 70 by means of screws. A grease having high heat conductivity is charged between the fin unit 62b and the heat radiation plate 72a of the main AC/DC converter 70. Both the heat dissipators are made of aluminum. The heat dissipation fin unit 62b is 23 mm wide, 85 mm long and 20 mm (4 mm) in fin height, and has 12 (twelve) fins formed on a fin bade plate of 3 mm thick. Thus, the heat dissipation fin unit 62b can be formed by extrusion. The cooling air 2 flows in the direction parallel to the plane of the base plate of this heat dissipation fin unit 62b.

A light emitting diode is disposed on the front side of the main AC/DC converter 70. Lighting up of this light-emitting diode on the front side of the main AC/DC converter 70 indicates that breaker 68a of the INPUT section 67 is on so that the computer 1000 is being supplied with electrical power, thus ensuring safety in the protective maintenance work of the computer 1000. A pair of epoxy-type circuit boards are incorporated in the main AC/DC converter 70 such that they face each other at their surfaces carrying the circuit components. Such circuit components include those having large sizes, such as coils 113.

Figure 55:
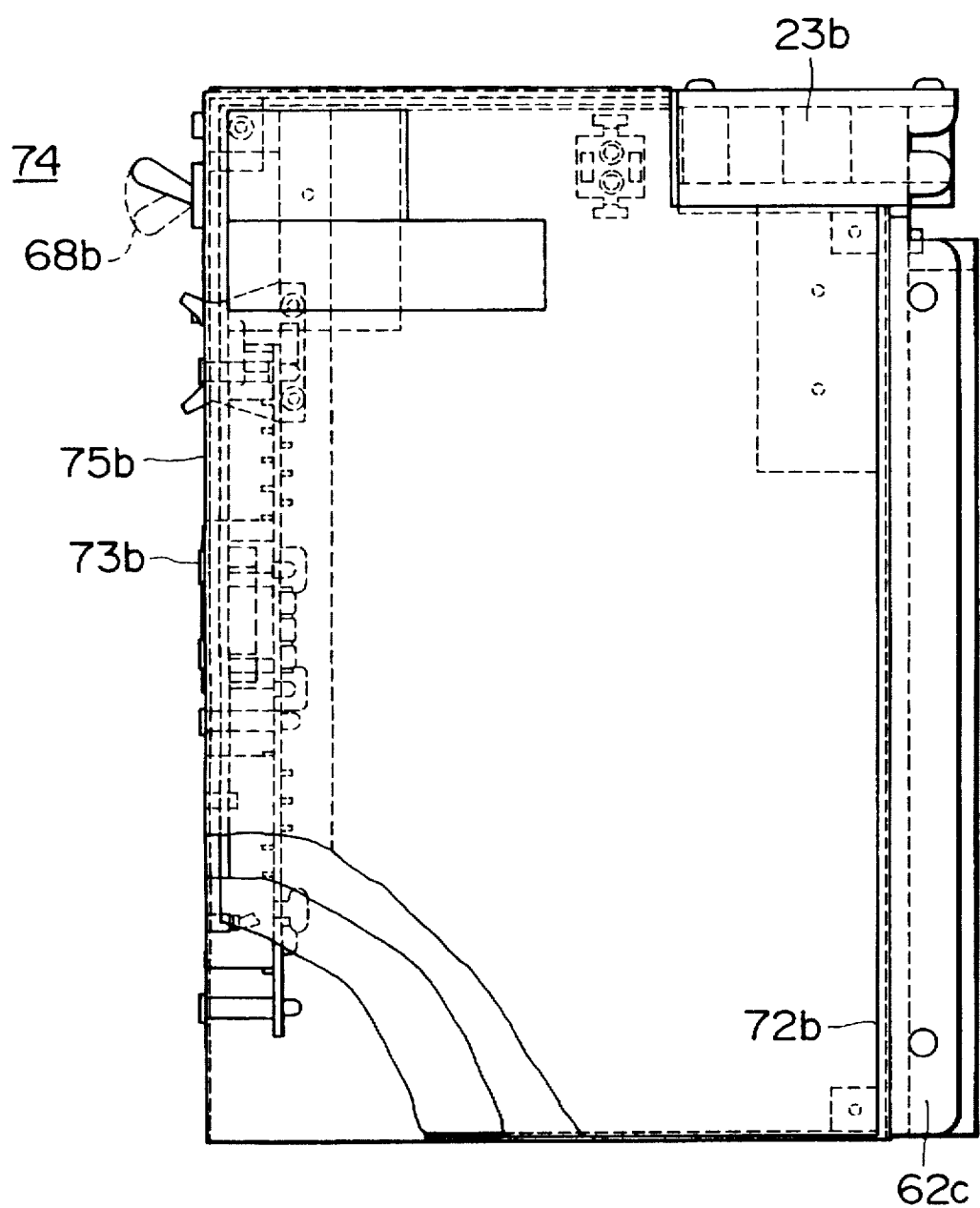
FIG. 55 is a plan view of an auxiliary AC/DC converter to be used in one embodiment of the present invention.

FIG. 55 shows the construction of an auxiliary AC/DC converter 74. A breaker 68b for power storage circuit is disposed on an upper part of the front side of the AC/DC converter 74. When this breaker 68b is in the on state, the auxiliary AC/DC converter 74 is supplied with electrical power even when the breaker 68a of the INPUT section 67 is off, so that the auxiliary AC/DC converter 74 is supplied with electrical power, whereby the battery 11 is charged through the terminals 75b on the front side. Supply of electrical power to the auxiliary AC/DC converter 74 drastically decreases when the storage of the battery is completed. The purpose of the auxiliary AC/DC converter 74 is to provide a back-up which ensures supply of electrical power to the main processing unit 2, I/O package 3 and HDD unit 5, in the event of a failure of commercial power or an accidental tripping of the power supply.

The auxiliary AC/DC converter 74 has heat dissipation fin unit 62c on the rear side thereof, as in the case of the main AC/DC converter 70. The heat-dissipation fin unit 72b is secured to the heat radiation plate 72b of the auxiliary AC/DC converter 74 by means of screws.

The auxiliary AC/DC converter 74 is supplied with electrical power even when the breaker 68a of the INPUT section 67 is off. It is therefore necessary that an independent cooling means is provided for the auxiliary AC/DC converter 74. To this end, an axial fan 23b is mounted on the upper part of the rear face of the AC/DC converter 74 and is secured thereto by means of screws. An axial fan having an outside dimensions of 60×60×25 mm³, produced by Sanyo Denki Kabushiki Kaisha, is used as the axial fan 23b. This fan is driven by a full-speed type motor. As shown in FIG. 55, the cooling air forced by this fan flows along the heat dissipation fin unit 62c.

As in the case of the main AC/DC converter 70, the auxiliary AC/DC converter has a light-emitting diode 73b which is lit on when power is being supplied. This eliminates the danger of electrical shock which otherwise may be caused to the user when the user turns to maintenance work without knowing that the computer is alive.

The AC/DC converter 6 is fixed by screws to a metal plate in the casing 1 by means of screws. In particular, the main AC/DC converter 70 shown in FIG. 54 is mounted at a rearward offset of about 50 mm, in order to make common use of the upstream portion of the flow of cooling air and the mounting fixtures.

2.7 Main Fan Unit

Figure 56:
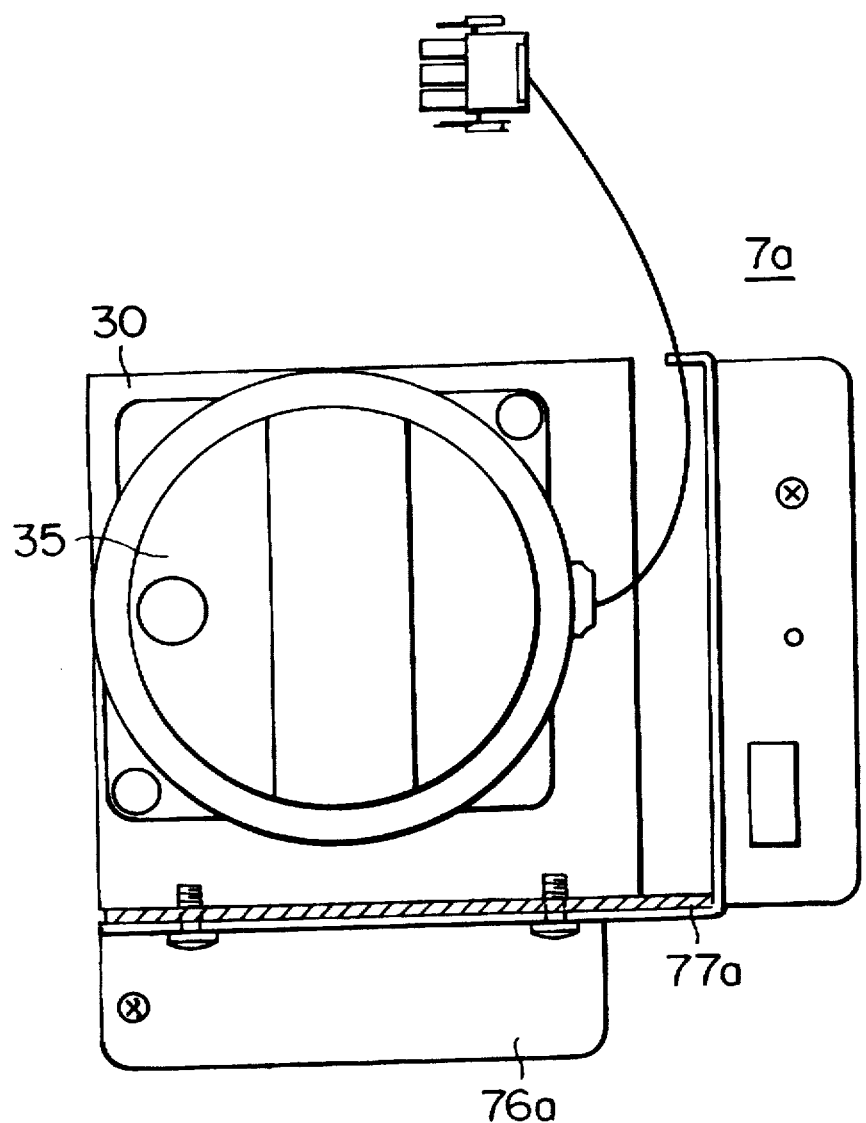
FIG. 56 is a side view of a main fan unit to be used in one embodiment of the present invention.

FIG. 56 shows the construction of a main fan unit 7a which is disposed between the main processing unit 2 and the HDD unit 5 of the computer 1000 which is an embodiment of the invention and which is shown in FIGS. 7 and 8. The fan used in this main fan unit 7a is a variable-speed cross-flow fan 30 produced by Oriental Motor Kabushiki Kaisha. The rated voltage is DC 24V. The dimensions of the fan motor are 76φ and 60 mm³, while the dimensions of the impeller are 90×90×340 mm³. Vibration damping rubber members 77a are provided between the cross-flow fan 30 and the bed 76a in support of the fan. As shown in FIG. 35, a duct 33 is provided in the suction side of the fan.

Figure 58A:
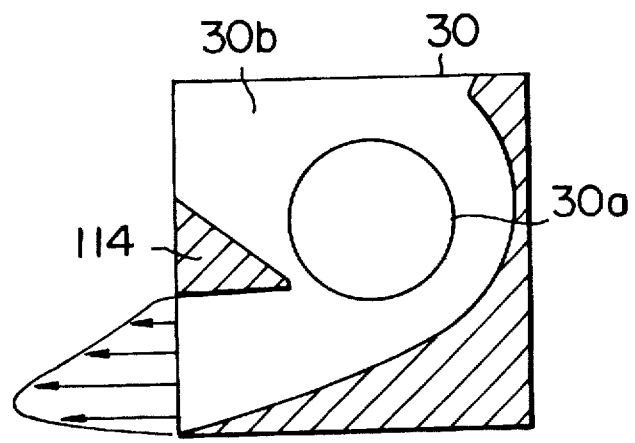
FIG. 58A is a sectional view showing a structure and a speed distribution of a cross flow fan to be used in one embodiment of the present invention and FIG. 58B is a plan view thereof.
Figure 58B:
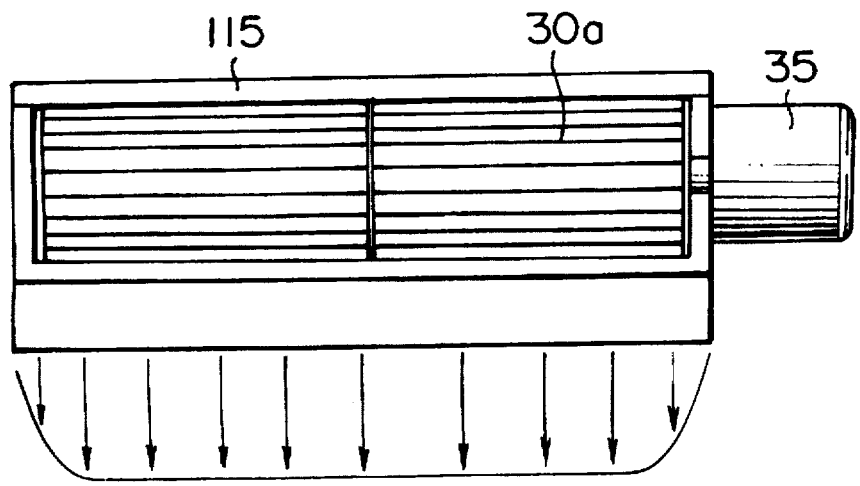

As will be seen from FIGS. 58A and 58B, the cross-flow fan 30 includes an impeller 30a, a casing 115 which encases the impeller 30a, motor 35 and the nose 114.

According to the described arrangement, it is possible to induce cooling air 22 from the bottom region of the main processing unit 2, so that it is possible to increase the velocity of cooling air 22 directed to the LSI packages 12, IV chips and circuit boards in the CPU package 36, and to eliminate any wasteful supply of cooling air 22.

Furthermore, since the speed of the motor 35 of the cross-flow fan 30 is variable, it is possible to avoid supply of excessive cooling air, while improving reliability of the bearing and grease of the motor 35. For instance, a temperature sensor 34 and a control circuit (not shown) are provided on the control circuit board 3c of the basic I/O package unit 3, so that the speed of the cooling fan is controlled by the control circuit in accordance with the temperature sensed by the temperature sensor 34. When the cooling air temperature is 30° C. or below, 17V is supplied as the driving voltage, whereas, when the air temperature exceeds 30°, 24V is supplied as the driving voltage, thus causing a change in the rate of discharge of air from the cross-flow fan 30. More specifically, when the cooling air temperature is high, the difference in the temperature between the cooling air and the maximum allowable temperature between the unit to be cooled is small, so that the flow velocity and, hence, flow rate of the cooling air must be increased in order to enhance heat transfer. Conversely, when the cooling air temperature is low, the above-mentioned difference in temperature is comparatively large, so that the flow velocity and, hence, the flow rate of the cooling air can be set low. This control commonly applies also to the case of the cross-flow fans 30, 30 of the main fan unit 7b which will be mentioned later.

Vibration damping rubber members 77a exist between the bed 76a and the cross-flow fan 30, so that the vibration of the cross-flow fan is never transmitted to the computer 1000 and the level of the noise is significantly reduced. The duct provided in the air supply portion makes it possible to effectively maximize the rate of supply of cooling air to the basic DC/DC converter 4a, thus suppressing rise in the temperature.

Figure 57:
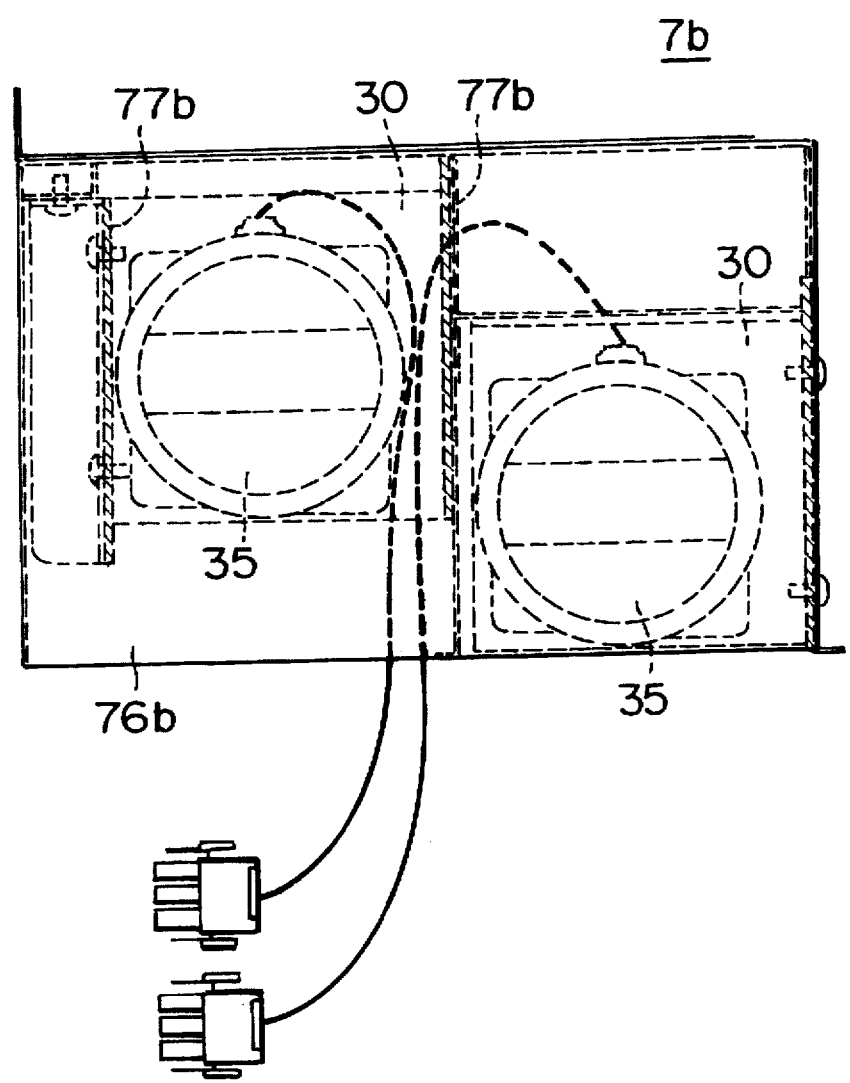
FIG. 57 is a side view of a main fan unit to be used in one embodiment of the present invention.

FIG. 57 shows a main fan unit 7b which is different from the main fan unit 7a and which is disposed upstream of the HDD unit 5. This unit 7b has a pair of cross-flow fans 30, 30 disposed at an offset from each other. A duct 741 (see FIG. 9) constituting a chamber is provided in the discharge portion. Vibration damping rubbers 77b are disposed between the bed 76b and the cross-flow fan 30.

The speed of the motor 35 driving the cross-flow fan 30 is variable as in the case of the main fan unit 7a, so that wasteful supply of the cooling air 22, is avoided while improving reliability of the bearing and grease of the motor 35. The vibration damping rubber members 77b between the bed 76b and the cross-flow fan 30 prevent vibration of the cross-flow fan 30 from being transmitted to the computer 1000, while reducing the noise. In addition, since the pair of cross-flow fans 30, 30 are arranged at an offset, it is possible to reduce the interference between these fans, thus maximizing the air flow rate and the silencing effect. The duct 741 which forms a chamber at the discharge portion ensures that the cooling air is uniformly distributed to all HDDs downstream of the fan unit.

As shown in FIGS. 58A and 58B, the flow velocity of the air at the outlet of the cross-flow fan 30 is substantially uniform in the longitudinal direction of the impeller 30a but has an offset in the radial direction. Such an offset, however, progressively decreases as the air gets farther from the fan. The pressure loss of the fan due to flow resistance has a certain relation to the velocity. More specifically, in order that the pressure loss is reduced, it is preferred that the flow velocity is reduced. It is therefore necessary to set the velocity of the cooling air to a level which is minimum but high enough to ensure safe cooling of the heat source disposed downstream of the fan output. The adjustment of the velocity of the air at the fan outlet requires an adjustment of the distance between the fan outlet and the heat source. The duct 741 performs this function.

2.8 Back Board

Back boards are used in this embodiment for the purpose of connecting various units.

2.8.1 Main Processing Unit Back Board

Figure 59:
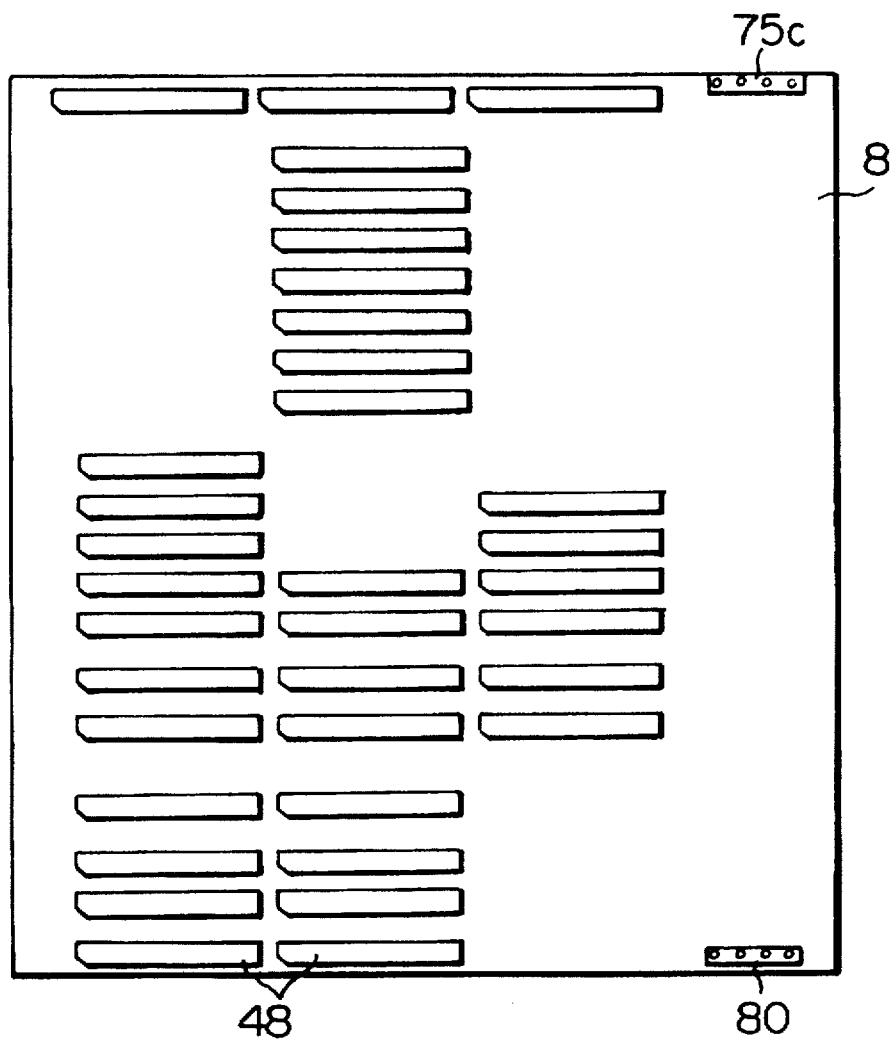
FIG. 59 is a plan view of CPU backboard to be used in one embodiment of the present invention.

FIG. 59 illustrates the manner of packaging on the CPU back board 8 of the computer 1000 shown in FIGS. 8 and 9. The CPU back board 8 carries 35 female connectors 48, terminals 75c for supplying power and signals, and a grounding terminal 80. According to this arrangement, the main processing unit 2, basic I/P package unit 3 and the DC/DC converter 4 are supplied with power and signals through the female connectors 48, while supply of the electrical power and the signals to the HDD unit 5 and the AC/DC converter 6 is conducted via the terminals 75c. This back board is fixed to the casing 1 by means of screws. The use of CPU back board 8 is advantageous in that it makes it possible to adopt a cable-less structure, thus realizing high-density of packaging.

2.8.2 HDD Back Board

Figure 60:
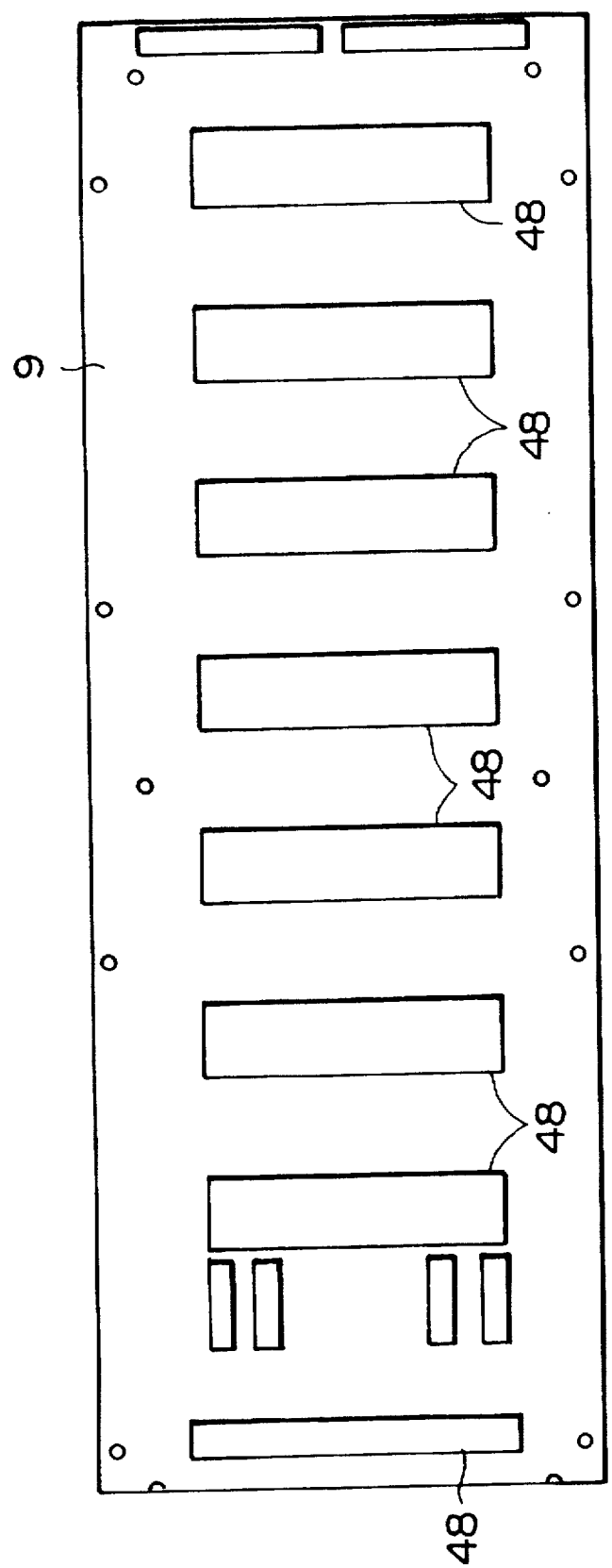
FIG. 60 is a plan view of HDD backboard showing one embodiment of the present invention.

FIG. 60 illustrates the construction of the storage device unit back board (HDD back board) 9 of the computer 1000 shown in FIGS. 8 and 9. The HDD back board 9 has 8 female connectors 48 with pins. The leftmost one of these connectors is used for supplying electrical power to the DC/DC converter. Among the seven remaining female connectors, the first, third, fifth and seventh connectors as counted from the right are used for 5-inch HDDs, while the first and sixth connectors are used for 3.5-inch HDDs. Thus, the HDD back board corresponds to two types of HDDs 108. The pitch of the female connectors 48 are substantially constant. This arrangement is adopted in order to adapt to a variety of types of HDD 108 and to ensure uniform distribution of cooling air 22 to the spaces between adjacent HDDs 108 which is offered by the duct 741 which forms a chamber an the air supply portion of the HDD. In order that the HDD 108 can be inserted and withdrawn in a live state, the HDD back board 9 has a structure which provides sufficient strength, i.e., a sufficiently large thickness of the package.

2.9 Circuit Unit

Figure 61:
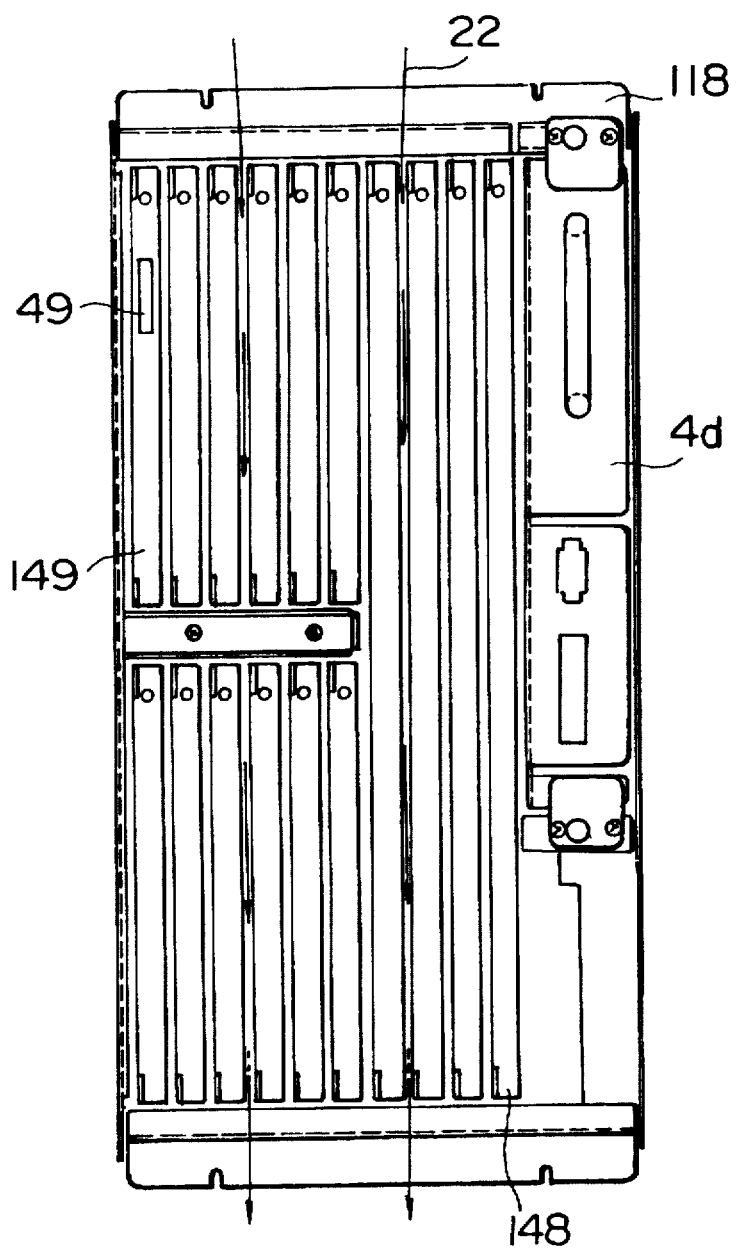
FIG. 61 is a mounting view of a circuit unit to be used in one embodiment of the present invention.

FIG. 61 shows the construction of a circuit unit 118 of the computer 1000 shown in FIGS. 8 and 9. There are two types of circuit packages: long type circuit package 148 and half-type circuit package 149. This unit further has a power supply DC/DC converter 4d. At the front side of the unit, the long type circuit package 148 has four male connectors 48, while the half-type circuit package has eight male connectors 48. The packages are arranged in the direction of flow of the cooling air 22. This arrangement permits an efficient cooling, and the unit-type circuits can easily be added or removed according to the user's specifications. The unit is closed so as not to emit interference electric wave.

2.10 Cover

FIG. 62 is a sectional view of the cover 10 of the computer 1000 embodying the present invention, in a state in which the cover is attached to the top side of the casing. FIG. 62 illustrates the cover 10 which is used also as an air supply panel 28. In order to prevent direct emission of noise to the exterior through the air supply portion where the cooling air 22 enters, the portion of the cover 10 in the air supply portion 710 is double-walled to have an outer wall 712 and an inner wall 713. A first air inlet 714 of the cover 10 for the cooling air 22 is disposed at a right position as viewed in the direction facing the cover, while a second air inlet 715 formed in the inner wall is deviated in the direction opposite to the first inlet 714. The gap between the outer cover and the inner cover is reduced without causing reduction in the flow rate of the cooling air 22. A filter 29 is provided in the inner inlet for the cooling air 22. By maximizing the length of the flow path between the ambient air and the interior of the housing, and by reducing the gap between the outer cover and the inner cover to minimize the reduction in the cooling air flow rate, it is possible to reduce external leak of the noise. Provision of the filter in the inner air inlet traps foreign matter so as to prevent clogging, thus facilitating maintenance. In this embodiment, a silencing material is charged in the inner wall 713.

2.11 Battery

Figure 63A:
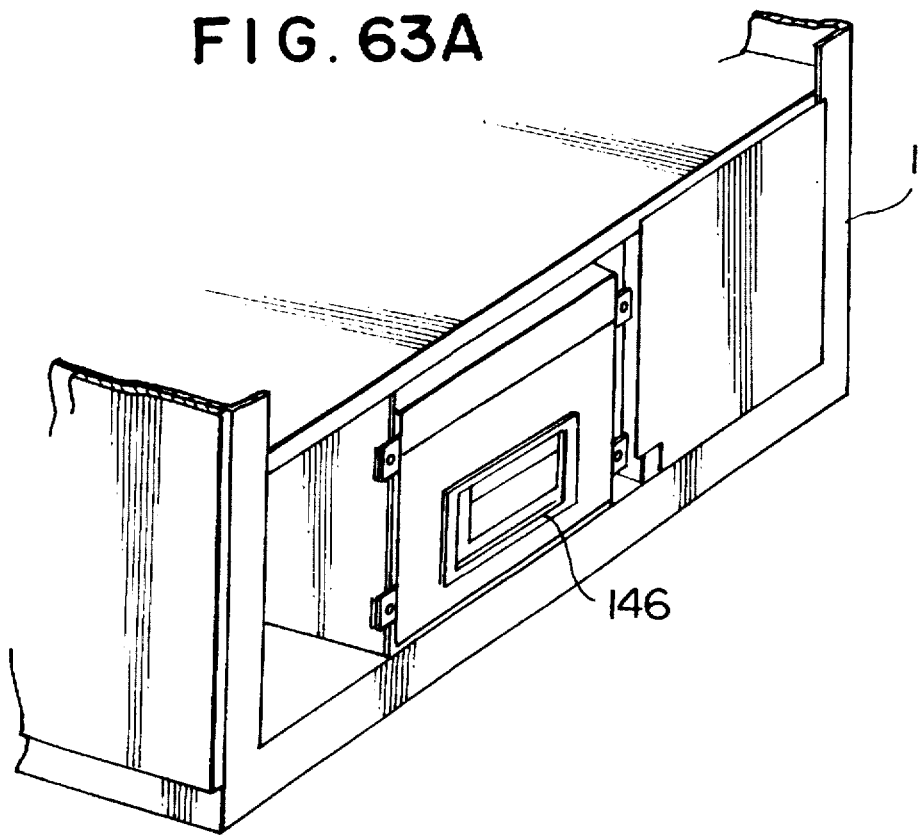
FIG. 63A is a perspective view showing a condition in which a battery to be used in one embodiment of the present invention is mounted on a casing and FIG. 63B is an exterior perspective view of the battery.
Figure 63B:
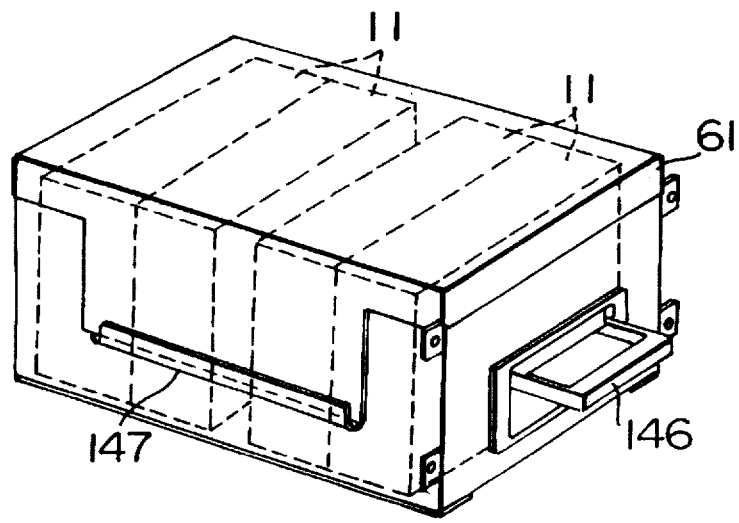

FIGS. 63A and 63B are perspective views of the mounted batteries 11 of the computer 1000 embodying the present invention. Batteries 11 are used as backup members acting in a case where the external power supply is interrupted. The batteries 11 are, by a battery cover 61, insulated from other structures so as to be free from the flow of cooling air. Four batteries 11 are disposed in the battery cover 61, the batteries 11 being disposed on the floor of the computer 1000 in consideration of the center of gravity of the computer 1000. Since the batteries 11 have considerably heavy weight, a handle 146 and rails 147 are provided for the battery cover 61 in order to safely and assuredly perform maintenance. When the batteries 11 are inserted into the computer 1000, they can automatically be introduced into the battery cover 61.

The structure, operation and effects of this embodiment of the present invention will now be described.

In the foregoing embodiment, the space in the casing has two or more systems of flow channels comprising a first flow channel 710 in which the main processing unit 2, the basic I/O package unit 3 and the basic DC/DC converter 4 are disposed in parallel so that each unit is supplied with outer air. As a result, each unit can be cooled with cooling air having relatively low temperature. In a second flow channel which is the residual flow channel, the HDD unit 5 is disposed at the most upstream position and other units are disposed downstream of the HDD unit 5. Thus, the units can be supplied with the cooling air in a necessary and sufficient quantity. Furthermore, the HDD unit 5 can be supplied with outer air, the temperature of which is low and the quantity of which is necessary and sufficient. As a result, the HDD 108, which is used in severe temperature conditions, can be operated with excellent performance exhibited.

If a sub-fan unit is individually attached to, for example, the main processing unit 2 in case of necessity, the cooling performance can be improved. Even if the main supply of cooling air is interrupted, the units can be cooled to a minimum degree required.

A duct 33 is disposed on the air-suction side of the main fan unit 7a so as to maintain the quantity of the cooling air. Thus, required cooling of the units can be performed regardless of the cross sectional area of the opening. As a result, the reliability of the main processing unit and the like can be improved.

By forming the flow channels as described above, the units in the casing 1 can be cooled to their optimum temperatures without a necessity of mounting many fans or using powerful fans. Therefore, this embodiment is able to reduce the power of the fans and to decrease the total noise generated in the casing. Thus, the cost of the product and power consumption can be reduced.

The main processing unit that considerably generates heat is formed into the duct structure and is mounted in a 3D manner so that the cooling air can efficiently be used and the size of the casing can be reduced.

Furthermore, a plurality of hard disk drives are formed into a unit so that a great storage capacity is realized. The slide rails disposed in a portion of the structure of the unit and on the surface of the casing enable the unit to be easily mounted or demounted. The same applies to the main processing unit. An employed jig for mounting and demounting facilitates the mounting and demounting operation. As a result, the working efficiency at the time of performing the maintenance and enhancement of the system can be improved.

In this embodiment, the inlet portion 710 has the panel formed into a double-panel structure and the openings shifted mutually so that direct radiation of noise generated in the casing is prevented and the lengthened radiation channel decreases the noise radiation toward the outside of the casing.

In the exhaust portion 750 employing the punched member having a multiplicity of the punched holes, the velocity of the exhaust flow is decreased and collision of the exhaust with the floor is moderated so that the noise generation is prevented.

In addition, the weights of the batteries are considered, thus resulting in that the batteries are disposed in the bottom of the casing in order to make the computer stable.

Since the resin-molded part is attached to the central recessed portion of the front panel in order to prevent distortion in the direction of the diagonal lines, the rigidity can be improved even if the weight of the front panel is reduced. Since the size of the resin-molded part, that can be designed variously, can be reduced and therefore the size of the mold can be reduced, a variety of designs can be employed at a low cost.

As described above, the arrangement of this embodiment is such that the number of the fans is decreased to reduce the cooling air discharged from the casing. Therefore, noise generation can be prevented, and therefore the appearance can be improved, thus resulting in that the office environment can be ameliorated.

In the aforesaid embodiments, the example has been described in which the portion in the casing is divided into the two systems of the flow channels. However, the present invention is not limited to this. For example, the portion may be divided into three or more systems. In a flow channel in which units are disposed serially, a bypass channel bypassing upstream units may be formed in parallel to the units. As a result, the temperature of cooling air to be supplied to the downstream units can be lowered.

As described above, this embodiment produces an effect that each mounted unit can adequately be cooled in a forced manner with limited cooling units. At this time, noise, hot exhaust air and power consumption can be prevented and the cost of the product can be reduced.

Another embodiment of the air-cooled information processing apparatus according to the present invention will now be described. Also the system structure according to this embodiment is formed similarly to that according to the embodiment shown in FIGS. 1 and 2. Although the exterior view of this embodiment is the same as that of the embodiment shown in FIGS. 3 to 5, air vents 105 are formed in the side surface of the air-supply panel 28 so that access to the computer 1 can be given through the front panel 82 which can be opened/closed.

Figure 69:
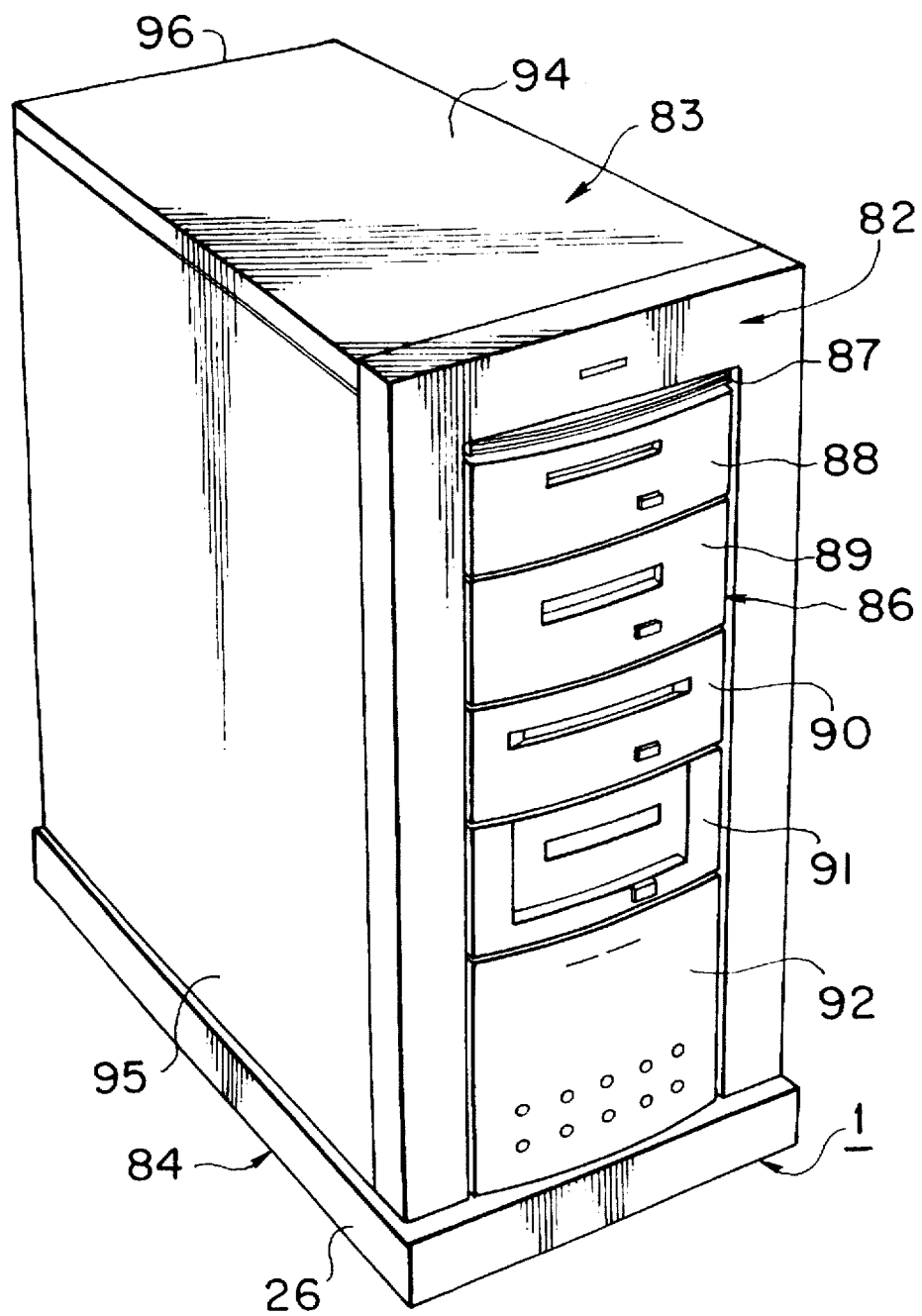
FIG. 69 is an exterior perspective view of a computer showing another embodiment of the present invention.
Figure 70:
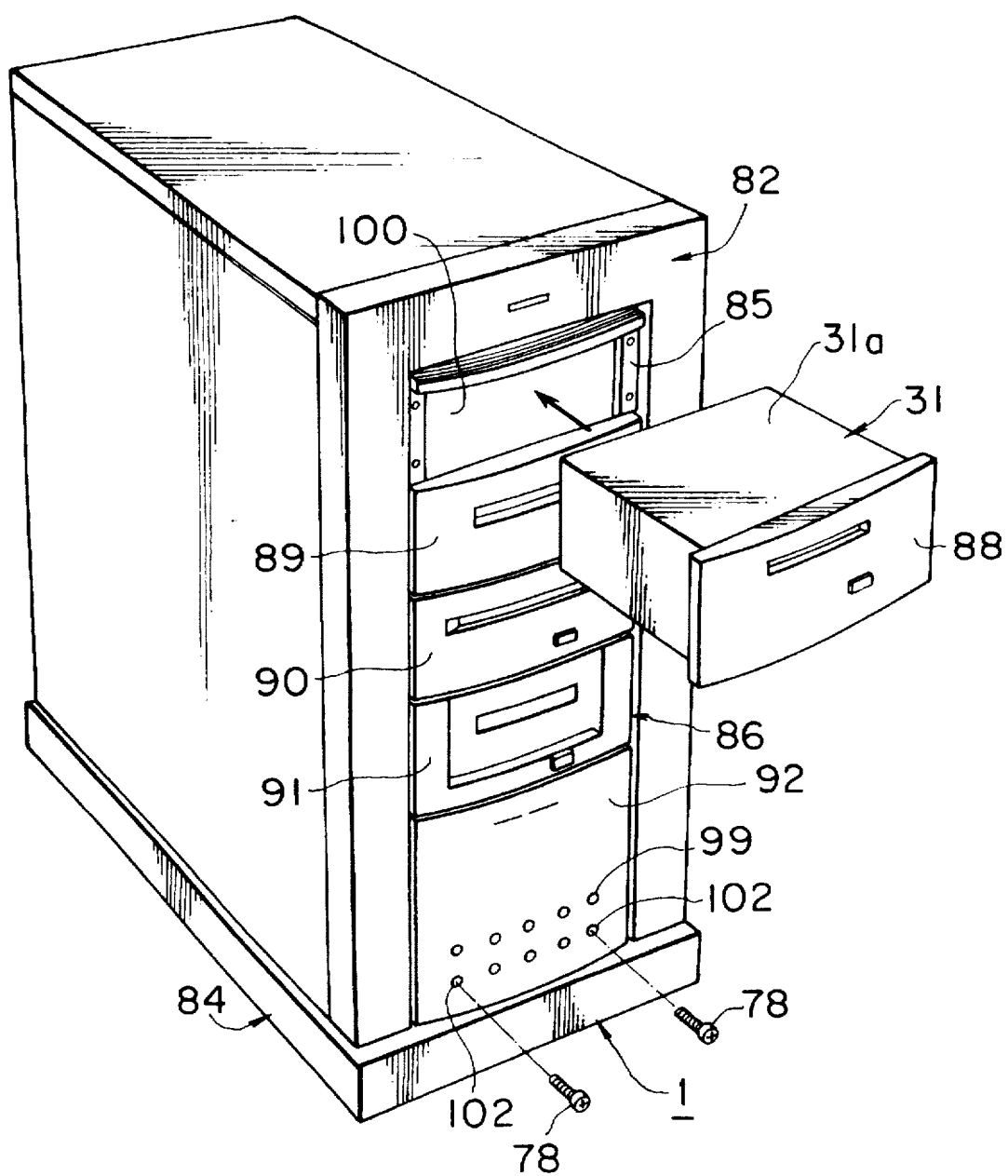
FIG. 70 is an exterior perspective view of a condition in which a computer is mounted showing another embodiment of the present invention.
Figure 71:
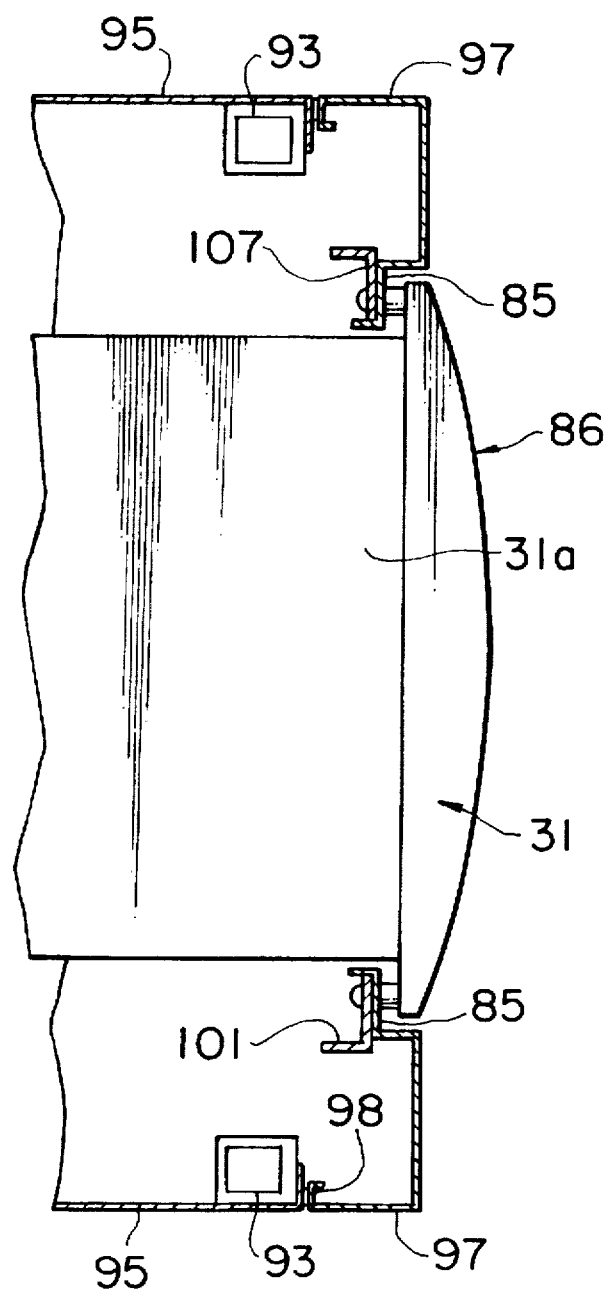
FIG. 71 is a partial sectional view of a computer showing another embodiment of the present invention.

FIGS. 69 to 71 show a computer 1 according to this embodiment. FIG. 69 is an exterior view of the computer 1, FIG. 70 is an exterior view of a condition in which the computer 1 is mounted, and FIG. 71 is a partial sectional view of the computer. This embodiment has an arrangement that the resin-molded portion 86 to be received in the recessed portion 85 of the front panel 82 is divided into a plurality of small panels 87 to 92 and that the recessed portion 85 corresponding to the small panels 87 to 92 has an opening so that a function portion is added to the resin-molded portion 86.

Referring to FIG. 69, reference numeral 1 collectively represents a main body of the computer 1 including a control processing apparatus, the main body being formed into an elongated box-like shape in the longitudinal direction. The computer 1 is composed of a front panel 82 forming the front surface of the computer 1 and made of a steel plate, a main box 83 forming the rear portion of the computer 1 and a base portion 84 forming the bottom portion of the computer 1.

The front panel 82 has a flat portion in the form of a gate-like shape connected to the two sides in the lengthwise direction and to the upper portion, a recessed portion 85 (shown in FIGS. 70 and 71) formed in this way that the flat portion is left, and a resin-molded portion 86 received in the recessed portion 85. The resin-molded portion 86 is formed by small panels 87 to 92 stacked vertically and has two longitudinal ends that coincide with the front panel 82, the resin-molded portion 86 being formed by a curved surface having a projecting central portion. In this embodiment, the small panels 88 to 91 are formed into magnetically-shielded bezels (a front panel 82) for various recording/reproducing apparatuses. The detailed description of the bezels will be made later.

The main box 83 is composed of a ceiling plate 94, two side plates 95 and a back plate 96 attached to a frame 93 (shown in FIG. 71) of the computer 1. Although omitted from the illustration in this embodiment, portions for establishing connections with various units and heat-radiating portions are concentrically disposed on the back plate 96.

The base portion 84 has a skirt portion 26 made of plain portions and formed in the periphery thereof, the skirt portion 26 having casters (not shown) therein to hide the casters from outside. The base portion 84 is so disposed as to accommodate units to be disposed on the base portion 84 within an area to which the base portion 84 is projected so that the base portion 84 serves as a bumper acting when the computer 1 is moved.

In FIGS. 70 and 71, the end of the periphery of the front panel 82 has a bent frame 97 formed by bending the front panel 82. At an end of the bent frame 97, a U-shape mounting portion 98 is formed. Each of the two side plates 95 of the computer 1 is bent to be formed into an L-shape at the end thereof so that the two side plates 95 reach the frame 83 of the computer 1. The front panel 82 is attached such that the bent frame 97 in the upper portion of the front panel 82 is hooked on a frame 93 (not shown) of the computer 1 so that the mounting portion 98 abuts against the L-shape portion of the two side plates 95. The lower portion of the front panel 82 is secured to the frame 93 with screws 78.

As described above, the resin-molded portion 86 is composed of the plural small panels 87 to 92 which are stacked up, the small panels 87 to 92 being received in the recessed portion 85 of the front panel 82 and attached from inside by attaching means, such as screws, so that the upper and lower members continue to each other.

In this embodiment, the uppermost small panel 87 is formed into a sash portion serving to locate the top end of the resin-molded portion 86 and to improve the appearance. The lowermost small panel 92 is formed into a decoration panel having a pattern 99 having projections and recesses. The small panel 88 disposed between the small panel 87 and the small panel 92 is formed into a bezel forming the front panel 82 of the DAT device 31. The small panel 89 is formed into a bezel for the magnetic tape cassette unit, the small panel 90 is formed into a bezel for the compact disk device, and the small panel 91 is formed into a bezel for the 8 mm magnetic tape device. The recessed portion 85 in the front panel 82 corresponding to the small panels 88 to 91 has an opening portion 100 into which the body of the recording/reproducing apparatus (the body 31a of the DAT device 31) is inserted. The opening portion 100 is so formed as to leave a flat portion formed into a square-frame shape in the recessed portion 85 in the periphery of the opening portion 100. Thus, the recording/reproducing apparatus (the DAT device 31) is mounted in this way that the flat portion in the form of the square-frame shape is surrounded by the bezels 88 to 91 by means of a rein-forming member 101. The small bezel 92 employs, on the outer surface thereof, the projecting curved surface which has the pattern 99 having projections and recesses thereon so that its rigidity is improved to serve as a bumper. Since the structure is arranged such that the screw 78 for securing the front panel 82 is inserted into a through hole 102 formed in the pattern 99 having the projections and recesses and formed in the small panel 92, adverse influence upon the design due to the appearance of the screw 78 can be prevented.

In this embodiment, the exterior color of the computer 1 is made achromatic mainly composed of gray to be matched to the environment of the computer 1. Furthermore, color of coating the front panel 82 and the main frame 83 is different in the color tone from that of the resin-molded portion 86 disposed adjacently to the front panel 82. Therefore, the computer 1 matches the achromatic color employed in many office floors from a distance so that the computer 1 harmonizes with the floor of the office. The difference in the color tone employed in this embodiment eliminates a necessity of considering color mismatch occurring due to the difference in the materials taking place in a case where the steel plate and the resin are disposed adjacently and that due to the difference in the aging speed of the materials.

As described above, this embodiment enables the overall body of the computer 1 to be covered with the steel plate so that the magnetic shield effect is produced. Since the resin-molded portion 86 is received in the recessed portion 85 formed in the central portion of the front panel 82, the distortion in the diagonal direction of the front panel 82 can be prevented, thus resulting in that the front panel 82 can be lightened and its rigidity can be enhanced. Since the size of the resin-molded part 86, that can be designed variously, can be reduced and therefore the size of its mold can be reduced, a variety of designs can be employed at a low cost.

Since the resin-molded part 86 is made to project, the resin-molded part 86 is able to have the bumper function. Furthermore, the pattern 99 having projections and recesses and formed in the resin-molded portion 86 further strengthens the resin-molded portion 86 and the front panel 82.

Since the resin-molded portion 86 is formed by the plural small panels 87 to 97 disposed in line in the lengthwise direction, the size of the resin-molded part 86 can further be reduced. Since the small panels 88 to 91 are formed into the bezels for the storage units, minor changes of the small panels 88 to 91 enable a series of products having a variety of functions to be realized.

Although this embodiment has the arrangement that the small panels 88 to 91 are formed into the bezels, some small panels may be formed into simple decoration covers if necessary for the employed arrangement of the series of the models of the computers. In this case, steel plates are attached on the inside of the decoration panels so that the computer 1 is magnetically shielded.

Figure 72:
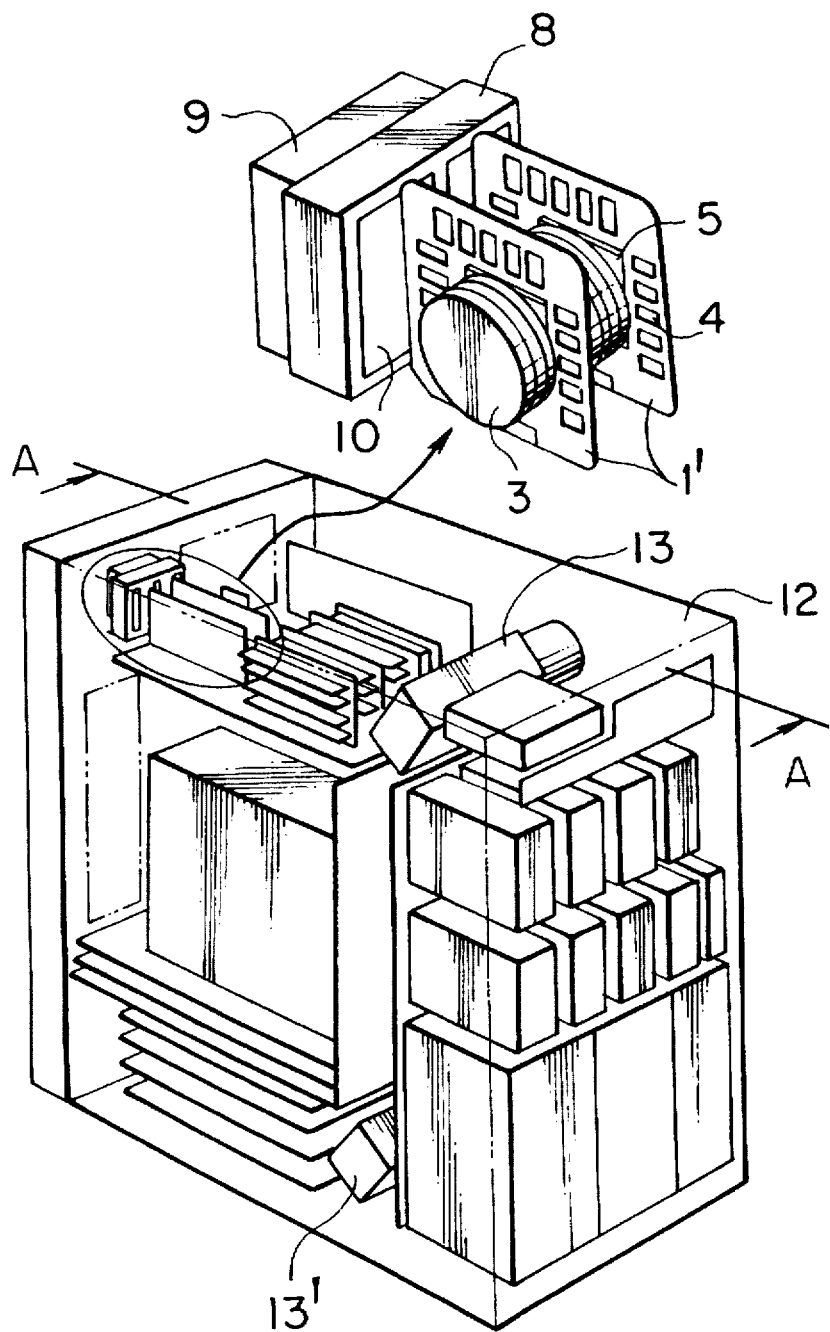
FIG. 72 is a right side perspective view of a computer showing another embodiment of the present invention.
Figure 73:
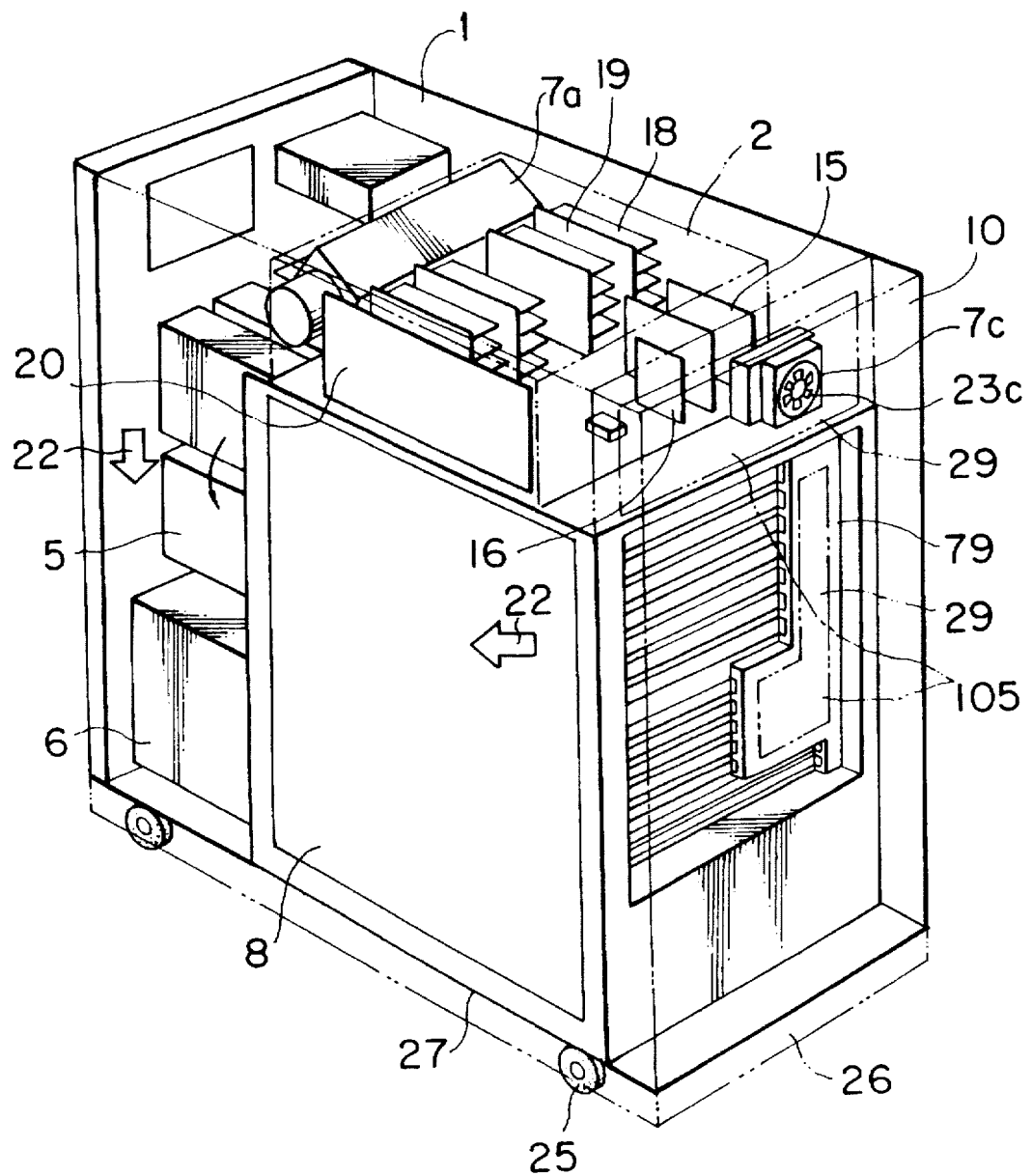
FIG. 73 is a rear side perspective view of a computer showing another embodiment of the present invention.

The arrangement of the mounted structure is made as shown in FIGS. 72 to 74.

An embodiment shown in FIG. 72 has an arrangement that two systems of flow channels are formed, the overall body of the casing is cooled by two once-through fan 13, and a slitted duct 8 is formed upstream of the upper once-through fan 13. As a result of the thus-made structure, the circuit board 1, the OSC board 2 and another circuit board 1 and devices mounted on the electronic equipment can satisfactorily be cooled.

In this embodiment, the CPU portion generating great heat is cooled by the duct 8 having an axial fan 23a. Namely, the flows of the air in front of and in the rear of the fan are controlled to cool the heat-generating portions (the heat spots) with minimum air quantity, resulting in that the overall body of the casing can be cooled even if the performance of the fan is limited. The OSC board 2 adjacent to the CPU portion is cooled in this way that its one side is cooled by jet stream from the axial fan 23a and the residual side is cooled by parallel flows created by the once-through fan 13. As compared with a case where the two sides are cooled by parallel flows created by the once-through fan 13, the devices on the circuit board 1 can be cooled satisfactorily. Since also the OSC board 2 is cooled on the two sides thereof by the jet streams, sufficient cooling performance can be obtained. Although the duct 8 is, in this embodiment, connected to the casing 12, the duct 8 may be formed into a detachable structure. In this case, conversion to a structure corresponding to the heating value of the memory 4 and the like can be realized to enhance the cooling effect. Moreover, there can be made structure to cope with trend of generating larger heat values involved in the version-up of the model of the computer.

The size of the foregoing electronic unit 12 is 300 mm wide, 700 mm high and 800 mm deep.

Although the mounted structure is made to be similar to that of the embodiment shown in FIGS. 8 to 10, a locally-cooling fun unit 7c has: an axial fun 23a: $(80 \times 80 \times 25) m^3$ manufactured by Sanyo Electric; and a jetting-out port 24 which is a port through which cooling air 22 jets out. There are disposed casters 25 and a skirt 26 in the bottom portion of the computer 1. The punched member 27 having the punched holes having a diameter of 2 mm and 4 mm is disposed in the air-exhaust portion of the computer 1. An air-supply panel is attached on the rear side serving as the air intake portion for the computer 1, the air-supply panel also serving as a cable cover 10. The air-supply panel includes a filter for preventing suction of dust or the like, the filter being attached to the air vents 105 with a magic tape.

Although the structure for local cooling is arranged similarly to that of the embodiment shown in FIGS. 11 to 12, the CPU portion 2 has, therein, a multiplicity of guide rails 44 for facilitating insertions of the RISC processor module 15, the OSC package 16 and the MS middle card 19 into the main CPU package 36. Incidentally, even if the rotations of the cross-flow fan 30 for cooling the overall body of the computer 1 are stopped, cooling of the RISC-T package 15 can be performed continuously so far as the axial fan 23a is operated.

Figure 75:
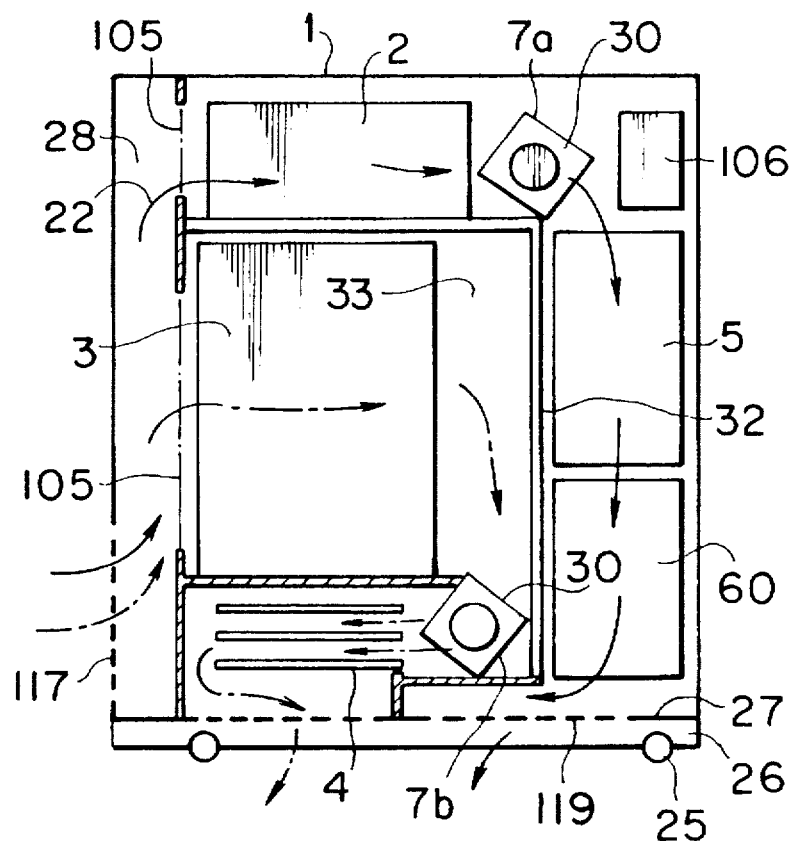
FIG. 75 is a sectional view taken on line LXXV—LXXV of FIG. 72 showing one embodiment of the present invention.

As shown in FIGS. 72 to 74, the computer 1 includes the two flow channels through which the cooling air 22 flows. FIG. 75 is a cross sectional view taken along line LXXV—LXXV of FIG. 72. Referring to FIG. 75, the cooling air 22 in the first flow channel is introduced through the air-supply panel 28 disposed on the rear side of the computer 1, allowed to horizontally pass through the CPU portion 2, sucked through the bottom portion of the CPU portion 2 by the cooling fan unit 7a comprising the cross-flow fan 30, and discharged from the cross-flow fan 30 having an angle of 45° so that the direction of the cooling air 22 is perpendicularly bent downwards. Then, the cooling air 22 is allowed to pass through the portions of the DAT 31, the HDD unit portion 5 and the AC/DC converter portion 6, and then it is discharged through the punched member 27 on the floor plate. Then, the cooling air 22 is allowed to pass through a portion below the skirt 26 and discharged to the outside portion the computer 1. In particular, the locally-cooling fan unit composed of the axial fan and the rectangular jetting-out port is disposed upstream of the RISC processor module in the CPU portion 2 on which the RISC chip package generating great heat and the cache memory (for details, see FIG. 12) for temporarily storing data are mounted. The hard disk drives in the HDD unit portion 5 are disposed at different intervals in order to improve the cooling efficiency. As for this arrangement, it will be described later with reference to FIG. 79.

The second flow channel for the cooling air 22 is so arranged that the cooling air 22 is introduced through the air-supply panel 28 serving as an air vent, that is the same as that for the first flow channel, allowed to horizontally pass through the I/O package portion 3, allowed to downwards pass through the duct 33 formed by insulating walls 32 of the first flow channel and the second flow channel, and then sucked by the cooling fan unit 7b comprising a cross-flow fan 30 on a market. After the cooling air 22 is discharged from the cross-flow fan 30 having an angle of 20°, it is bent, allowed to pass through the DC/DC converter portion 4, discharged through the punched member 27 of the floor plate similarly to that in the first flow channel, allowed to pass through a portion below the skirt 26 and discharged to the outside portion of the computer 1.

Since the cross-flow fan 30 is mounted while being angled by 20°, the cross-flow fan which is a mass-produced product on the market can be employed, thus resulting in that the cost to manufacture the computer 1 can be reduced.

The cross-flow fan 30 has a signal line to receive a signal from the temperature sensor attached to a control circuit board of the I/O package portion 3 disposed adjacent to the inlet portion so that the speed of the revolutions of the motor is varied in response to the signal supplied from the temperature sensor in order to improve the cooling efficiency. The foregoing effect can be realized by preparing a table of the temperatures and the speed of the revolutions and by supplying a signal for controlling the speed of the revolution in accordance with the table from the I/O package portion 3 to the cross-flow fan 30.

The provision of the two systems of the cooling flow channels in the computer 1 prevents the rise in the temperature of the air in each flow channel, lowers the temperature level at each heating generating member, and makes uniform the temperature distribution among the heating generating members as compared with a case in which a single flow channel is provided. Further, the cooling fan disposed upstream of the heat generating members enables high-speed cooling air to be supplied to the heat-generating units, raising the heat transfer from the cooling air and thus lowering the temperature of the heat generating members.

Further, the cooling flow channel is so formed into the two systems as to make the required flow quantity to be the same for the two flow channels. The aforesaid arrangement can be realized by determining the configuration of the modules in consideration of the capacity of each flow channel and the average value of the heating values of the heat generating members.

The reason why the heating value of each flow channel and the required quantity of the cooling air are uniformly distributed is that the loads on the fans must be equally divided to prevent offset of the quantity of noise generated in the air flow channels. If the flow quantity of either of the cooling air flow channels is set to a large quantity resulting in that the offset of the noise takes place, noise insulation by means of the casing becomes a necessity of taking vibration and noise preventive countermeasures capable of preventing the noise generated in either of the cooling air channels that generates noise of higher level, that is, a countermeasure of thickening the wall of the casing. Thus, wasteful countermeasure must be taken. This embodiment employs the two systems of the flow channels in consideration of the quantity of the cooling air required for each portion so that a design for silent structure is realized.

The method of cooling the computer 1 according to this embodiment has the arrangement that the cross-flow fan 30, which is the noise source, is disposed apart from the air vents 105 and the exhaust holes 119 so that an effect of preventing noise leakage is produced. With the foregoing cooling structure, it is effective to dispose the cross-flow fan 30 which is suitable to widely and uniformly form air flows. Since the cross-flow fan 30 generally employs accelerating wing cascade, a high flow velocity is obtained at the outlet port of the fan. Therefore, the cooling structure is employed in which the HDD unit portion 5 and the DC/DC converter portion 4, which are heat sources of a type generating a great heat quantity and which are effective to be supplied with the high-speed cooling air 22, are disposed adjacently to the outlet port of the cross-flow fan 30. As a result, the structure of the casing is achieved which is capable of realizing efficient cooling and preventing generation of noise.

Since the hard disk drives are disposed at different intervals, the distribution of the cooling air to the AC/DC converters 6 downstream of the HDD units can be made to be sufficient to cope with the heating value of each of the AC/DC converters 6. Therefore, the temperature of the AC/DC converters 6 can be made to be uniform.

Since the cross-flow fan 30 is disposed in the computer 1, there can be prevented leakage, to the outside of the computer 1, of noise generated due to the rotations of the cross-flow fan 30 and collision noise generated due to collision with the substance at the outlet port of the cross-flow fan 30, thus resulting in a satisfactory effect of eliminating noise. The disposition of the skirt 26 in the bottom portion of the computer 1 significantly prevents noise generated when the cooling air 22 collides with the floor and prevents flying of dust and the like in the room in which the computer 1 is installed.

Figure 76:
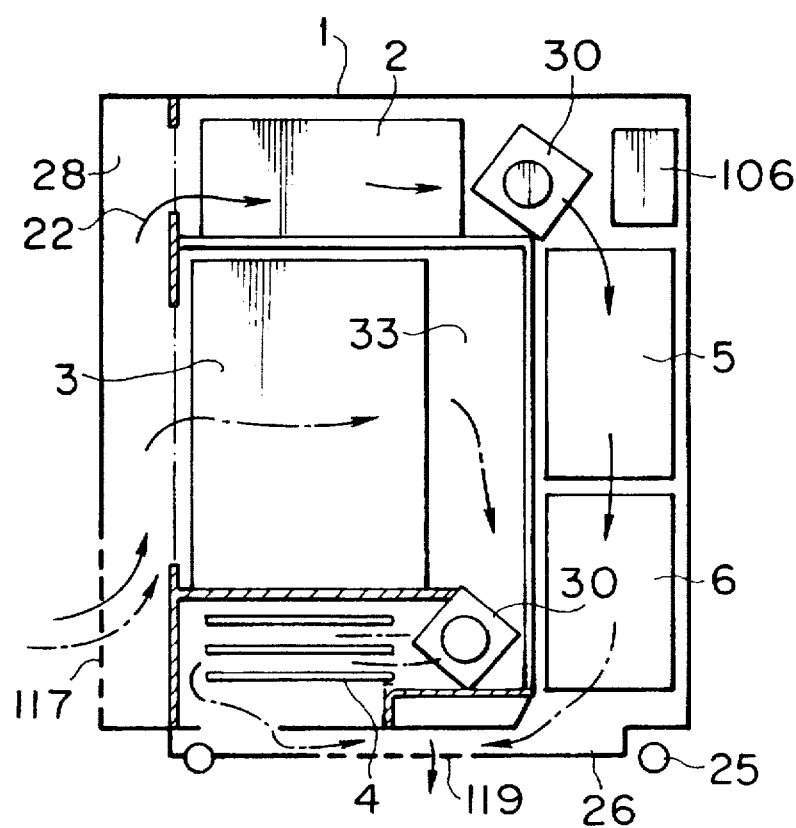
FIG. 76 is a sectional view taken on line LXXV—LXXV of FIG. 72 showing another embodiment of the present invention.

Further, the exhaust port for the cooling air is disposed in the lower portion of the computer 1 so as to be disposed apart from the cross-flow fan 30. In the portion below the HDD unit 5 and the like which are the heat sources, the punched member 27, the diameter of which is 2 mm or less, is used to form the surface of the portion below the heat source in order to prevent start of a fire due to accidental fall of sparks from the heat source onto the floor. The disposition of the punched member 27 having the diameter of 2 mm and 4 mm to form the exhaust surface of the UL standard enables the flow velocity in the exhaust portion to be decreased and noise and the like generated when the cooling air 22 collides with the floor to be significantly eliminated. If the exhaust port for the cooling air 22 is disposed below the heat source, the flow of the cooling air 22 must be exhausted to the outside portion of the computer 1 through the punched member 22 having the diameter of about 2 mm or less. If the cooling air 22 is exhausted through such small holes, the pressure loss is enlarged and the static pressure of the fan must be raised. Thus, the load for the cooling fan is made to be heavy and a tendency arises in that the noise is enlarged. In order to overcome the problems, another embodiment of section LXXV—LXXV of FIG. 72 is shown in FIG. 76. As shown in FIG. 76, a bent duct 103 is attached to a portion below the heat source to prevent the fall of sparks from the position immediately below the heat source. An exhaust port formed in the leading portion of the bent duct 103 prevents the pressure loss in the flow channel. The bent duct 103 in the exhaust portion collects the cooling air 22 into the central portion of the lower portion of the computer 1 and then exhausts the same to the outside portion of the computer 1. Since the effect of eliminating the noise is in proportion to the distance for which the noise is transmitted from the inside portion of the computer 1 to the outside portion of the same, the disposition of the bent duct 103 produces an effect of eliminating the noise.

The capability of varying the speed of the revolutions of a motor 35 through the signal line of the motor 35 for the cross-flow fan 30 connected to the temperature sensor 24 attached to the control circuit board in the I/O package portion 3 adjacent to the inlet portion enables the life of the motor to be lengthened, the power consumption for the motor 35 to be reduced and also the power consumption of the computer 1 to be reduced. In addition, another effect can be produced to eliminate the noise in the computer 1.

The foregoing effect is obtained from a structure in which the control circuit board is disposed in, for example, the I/O package portion 3, the control circuit board controlling the speed of the revolutions of the motor 35 for the cross-flow fan 30. If the temperature of the supplied air is 30 degrees or lower, the drive voltage is set to 17V. If it is 30 degree or higher, the drive voltage is set to 24V. Thus, the quantity of the supplied cooling air 22 from the cross-flow fan 30 can be varied. That is, if the temperature of the supplied air is high, the difference between the allowable temperature for the semiconductor and the like mounted on the circuit board and the temperature of the air is decreased, resulting in a necessity to arise in the quantity of the cooling air 22 and the velocity of the same is raised in order to enhance the heat transfer with air. If the temperature of the cooling air 22 is low, the foregoing difference in the temperature is permitted to be enlarged. Therefore, the quantity of the cooling air 22 can be enlarged and the velocity of the same can be decreased. Since the speed of the revolutions of the motor 35 for the cross-flow fan 30 can be varied to a low speed, another effect of eliminating the noise of the computer 1 can be obtained. Furthermore, the provision of the air-supply panel 28 and mounting of the filter on the inlet portion prevent the leakage of the noise toward the outside portion of the computer 1, thus resulting in an effect of noise elimination.

Figure 92:
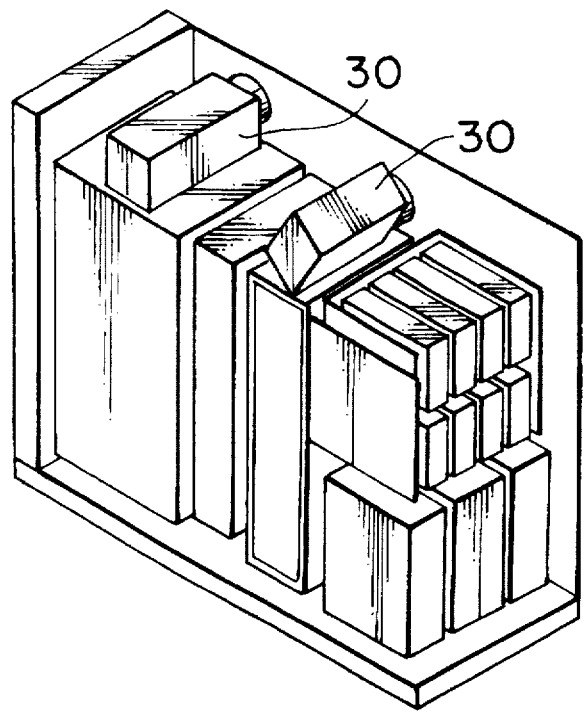
FIG. 92 is a front perspective view of a computer showing another embodiment of the present invention.
Figure 93:
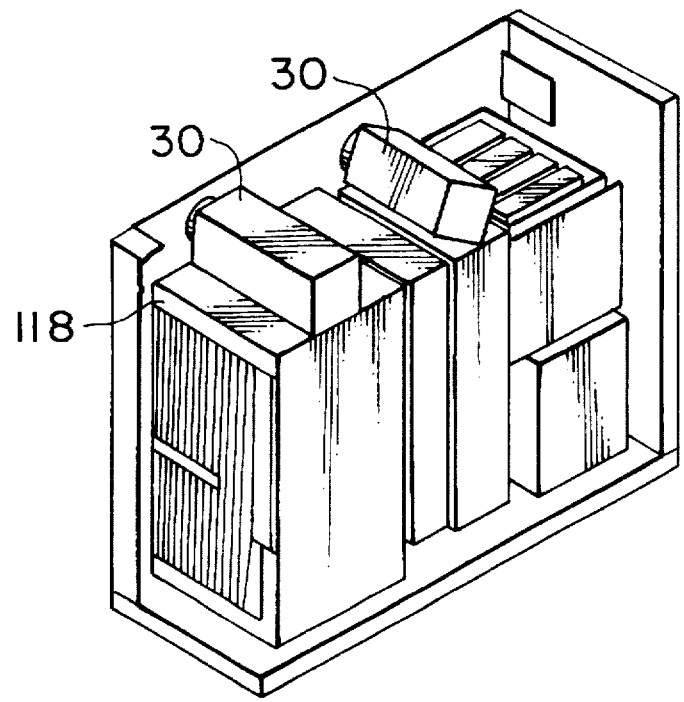
FIG. 93 is a rear perspective view of a computer showing another embodiment of the present invention.
Figure 94:
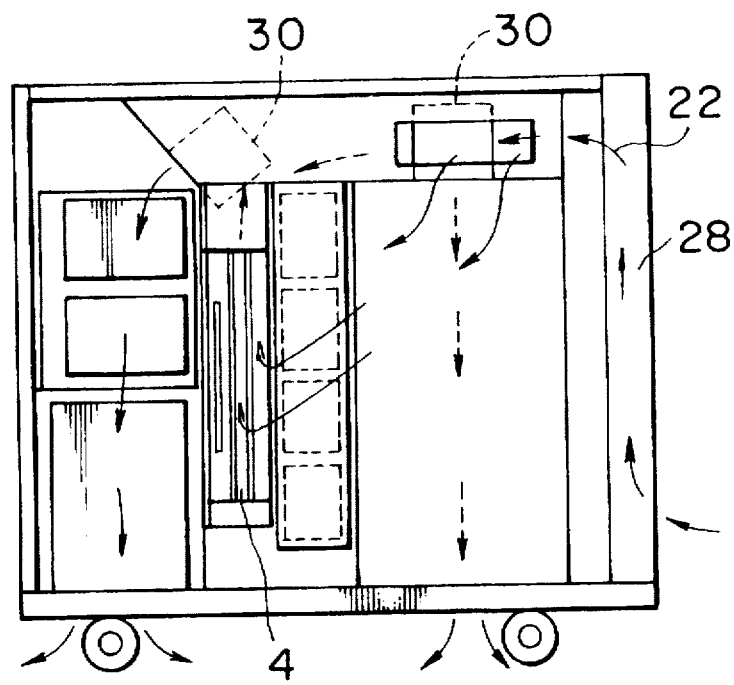
FIG. 94 is a left side view of a computer showing another embodiment of the present invention.
Figure 95:
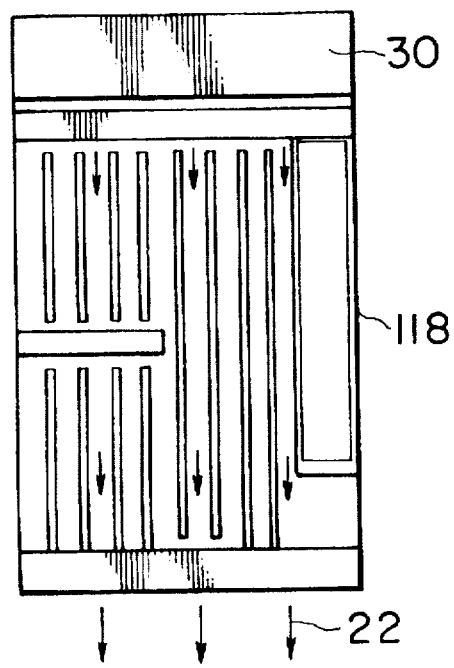
FIG. 95 is a plan view of a circuit package portion showing another embodiment of the present invention.
Figure 96:
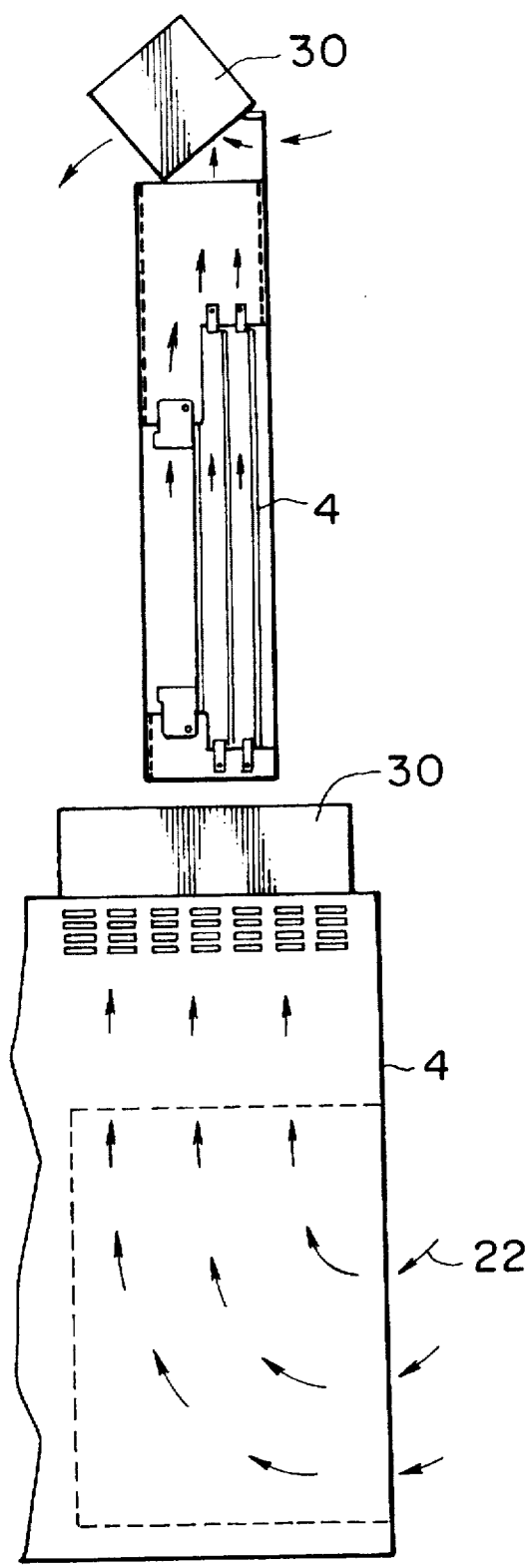
FIG. 96 is a plan view of DC/DC converter portion showing another embodiment of the present invention.

Another embodiment is shown in FIGS. 92 to 94. This embodiment provides an extension casing for the computer 1 according to the foregoing embodiments. Similarly to the foregoing embodiments, two systems of cooling flow channels are formed. One of the flow channels is so formed that cooling air is introduced through the air-supply panel 28, allowed to pass through the cross-flow fan 30 on the market and a line unit 118 and then discharged outside through the bottom portion of the computer 1. As shown in FIG. 95, the line unit 118 is mounted in the same direction as the direction in which the cooling air 22 flows at the outlet port of the cross-flow fan 30 in order not to go against the flow of the cooling air 22. Another flow channel is so arranged that cooling air is, similarly to the first flow channel, sucked through the air-supply panel 28, allowed to pass through the DC/DC converter 4, discharged from the cross-flow fan 30, allowed to pass through the HDD unit portion 5 and the AC/DC converter portion 6 similarly to the first embodiment, and then discharged outside through the floor of the computer 1. In this case, the cross-flow fan 30 is mounted while being inclined similarly to the foregoing embodiments. FIG. 96 is a detailed view of the DC/DC converter portion 4 and the cross-flow fan 30 in the second flow channel. In order to make cooling air flow through the circuit board for the DC/DC converter 4, the DC/DC converter portion 4 is disposed in parallel to the direction in which the cooling air flows. In order to efficiently use the cooling air 22, the cross-flow fan 30 is angled so as to suck the cooling air 22 from portions except the DC/DC converter portion 4. As a result, the air quantity obtainable from the cross-flow fan 30 can be used most efficiently. Furthermore, the package 36 forms a portion of the duct.

Incidentally, the CPU unit portion has the structure shown in FIGS. 37 and 38.

The packaging structure of the main CPU package 36, packaging structure of the RISC processor module 15 and the packaging structure of the MS package 18 and the MS middle card 19 are as shown in FIGS. 41, 11 and 42, respectively.

Figure 77:
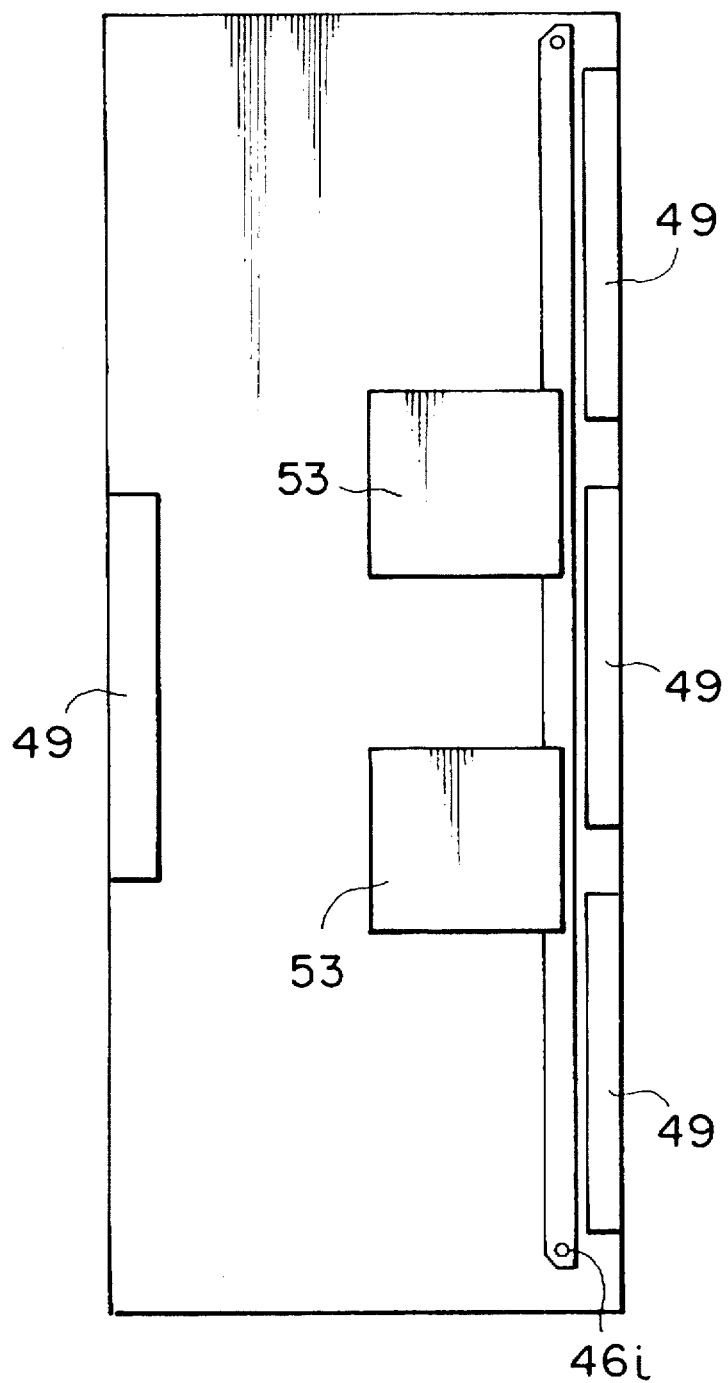
FIG. 77 is a plan view of BA package showing one embodiment of the present invention.
Figure 78:
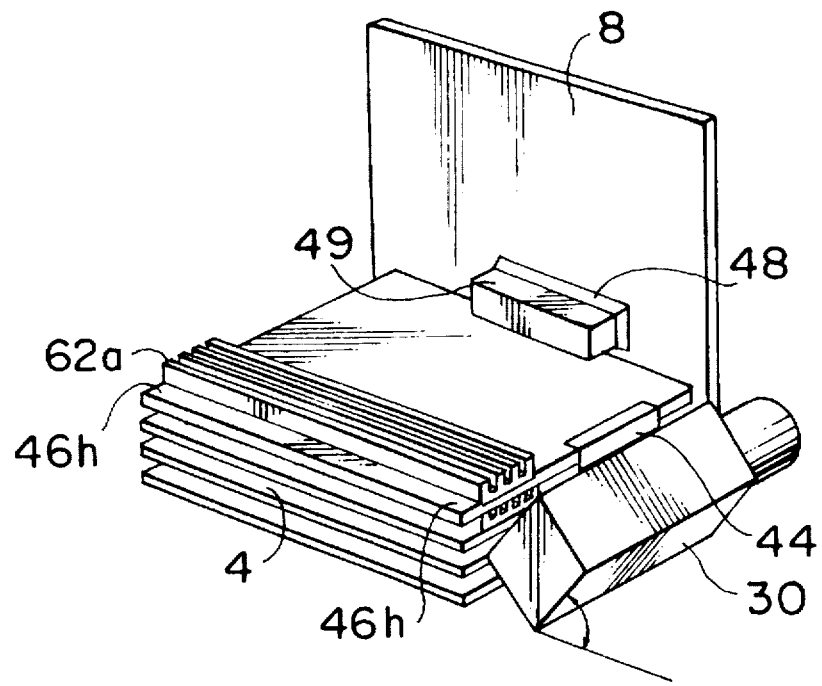
FIG. 78 is a perspective view of DC/DC converter portion showing one embodiment of the present invention.

FIG. 77 shows the manner of packaging of the BA package 20. The BA package has a pair of LSI chips 53 and four male connectors 49d. Three of these male connectors 49d are for mounting on the main CPU package 36, while the remaining one is used for external control. The role of the BA package 20 is to act as a relay between different signal lines. In order to transfer high speed signals to other packages without reducing the signal rate, the central male connector 49d among the above-mentioned three male connectors 49d functions as an input terminal, while the pair of male connectors 49d on both sides serve as output terminals. The entered signals are shared to the above-mentioned two LSI tips 53. The LSI chips 53 are mounted in 180° reverse to each other so as not to retard the signal transmission. The mounting and demounting of the BA package 20 is conducted by means of a hand lever 54 (see FIG. 48) having projections 47c engageable with small holes 46i formed in the BA package 20.

The RISC processor modules 15, OSC package 16, MS middle card 19 and the BA package 20 are mounted on the main CPU package 36 in the manner shown in FIG. 37. The handle lever 54 used as a separate jig has a construction as shown in FIG. 44. The slide rails 40 and the CPU unit are mounted in the computer in the manners shown in FIGS. 45A, 45B, 37 and 38.

The mating connectors, male and female, are constructed such that a multiplicity of electrical signal pins provided in the female connector 48e are received in corresponding holes formed in the male connector 49e, thus achieving the electrical connection.

The CPU unit 2 has a duct-like construction and all the packages in this unit are arranged in the same direction so as to allow the cooling air to easily flow through this duct. Part of this duct is constituted by the main CPU package 36. The air supply and discharge portions of this duct have guide rails 44 and metal plates which are used for supporting the aforementioned packages. The portion of the duct upstream of each package has a rectangular opening 58a shaped and sized so as to correspond to the package. Through these openings 58a, cooling air 22 is supplied to the respective packages at flow rates corresponding to the rates of generation of heat from the respective packages. In addition, restriction of the supply or inlet portion of the duct eliminates the supply of wasteful cooling air 22, while enhancing the flow velocity of the cooling air. At the same time, temperatures of the semiconductor elements in the respective packages are cooled down to improve the reliability and computing performance.

The construction of the I/O package is the same as that shown in FIG. 46.

Each package carries a multiplicity of semiconductor chips. A battery cover 61 is so mounted that the cooling air 22 is supplied from one lateral side of each package and then flows through the package.

FIG. 72 shows a computer as an embodiment of the present invention. This computer 1 has a DC/DC converter unit 4 having four stages or layers. These stages are the first and second stages from the top, having constructions as shown in FIG. 47, and third and fourth stages having constructions as shown in FIG. 48. The first stage is capable of supplying 5V×36 A power and 3.3V×3 A power, the second stage is capable of supplying 5V×17 A power and 12V×11 A power, the third stage is capable of supplying −12V×3 A power and the fourth stage is capable of supplying auxiliary power supply 12V×2 A and 5V×7 A power. The conversion efficiency of the DC/DC converter 4 is 78%. The heat dissipation rates of the first, second, third and fourth stages are respectively 53 W, 59 W, 9 W and 14 W.

The velocity of the cooling air discharged from the cross-flow fan 30 is high. A commercially available cross-flow fan made of Oriental is suitably used as the cross-flow fan. Since this cross-flow fan is installed at an inclination angle of 20°, the first and the second stages of the DC/DC converter, which are circuit boards generating heat at large rates, are supplied with the cooling air 22 of high velocity.

Figure 79:
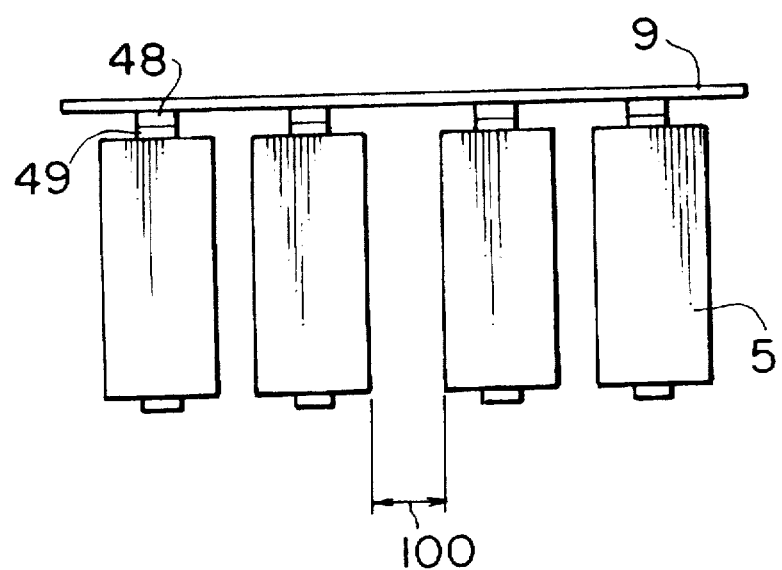
FIG. 79 is a top view of HDD unit portion showing one embodiment of the present invention.

The HDD unit has a construction as shown in FIGS. 51 and 71, and the top plan view of the HDD unit 5 of the computer of FIG. 72 is shown in FIG. 79. It will be seen that the spacing between adjacent HDDs 108 is large in the central region of the HDD unit 5. This large space is intended to supply cooling air 22 at a sufficiently large rate to the main AC/AC converter 70 which is at the center of the AC/DC converter 6 located downstream of the HDD unit 5. This contributes to improvement in the reliability of the AC/DC converter 6.

Figure 80A:
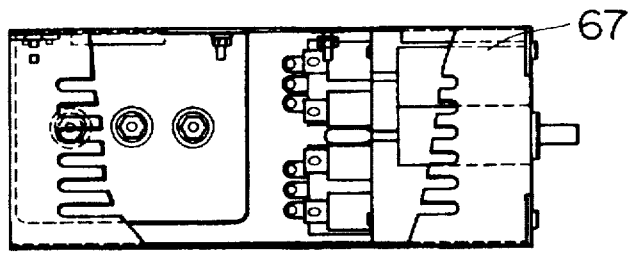
FIGS. 80A–80C are plan, front and side views of INPUT portion showing one embodiment of the present invention.
Figure 80B:
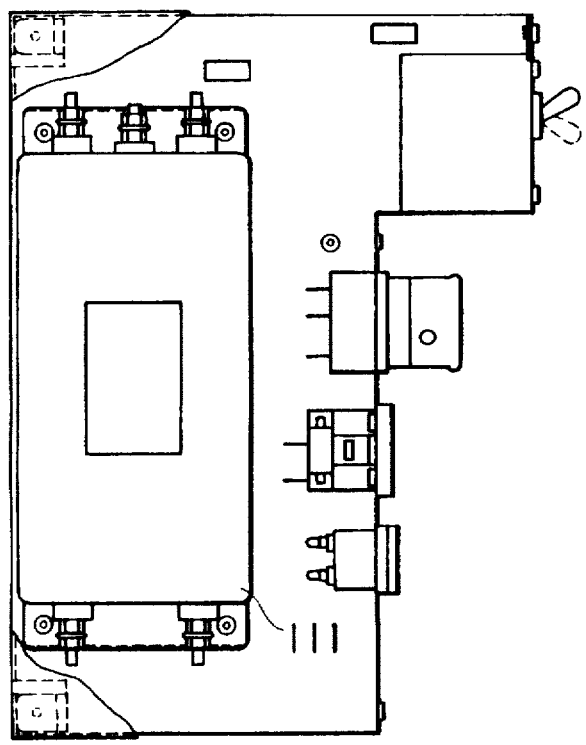
Figure 80C:
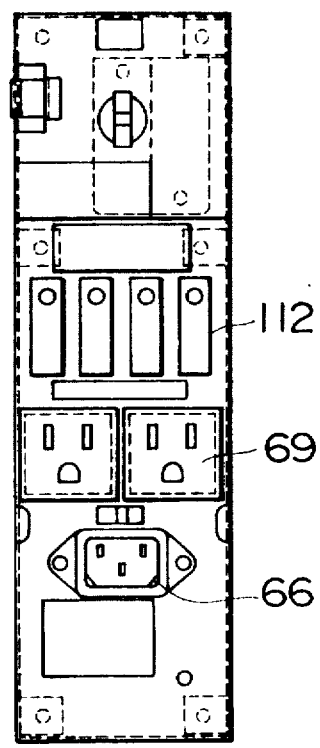

FIG. 80 shows the construction of the INPUT section 67. The INPUT section 67 is located at right side as viewed in the direction normal to FIG. 11 and is supplied with A.C. 100V through a power supply cable connector 66. A breaker 68a is mounted in upper part of the INPUT unit 67 to provide protection against leakage of current and to provide means for cutting off the power when the computer is not used. A pair of service receptacles 69 are provided to enable supply of power when the system it to be expanded. The receptacles 69 become operative only when the computer 1 is operating. Anti-thunder overvoltage protection circuit 112 and a noise filter circuit 111 also are incorporated.

The construction of the main AC/DC converter unit 70 has a construction as shown in FIG. 54. The AC/DC converter 70 is located at a central portion as viewed in the Figure. The specifications of this converter are 52V, 11 A and 580 W. The power factor is 85%.

Figure 81A:
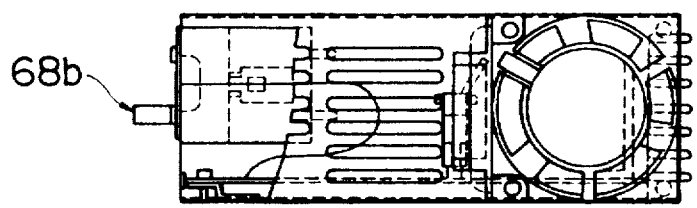
FIGS. 81A–81C are plan, front and side views of an auxiliary AC/DC converter portion showing one embodiment of the present invention.
Figure 81B:
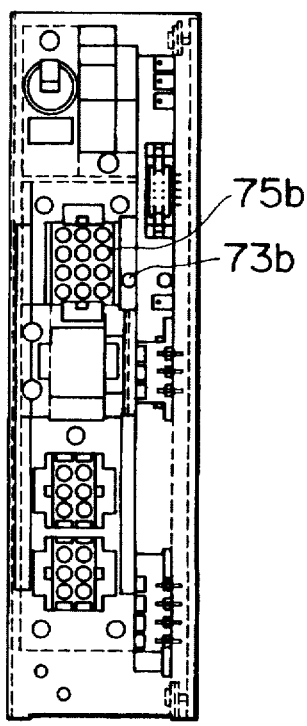
Figure 81C:
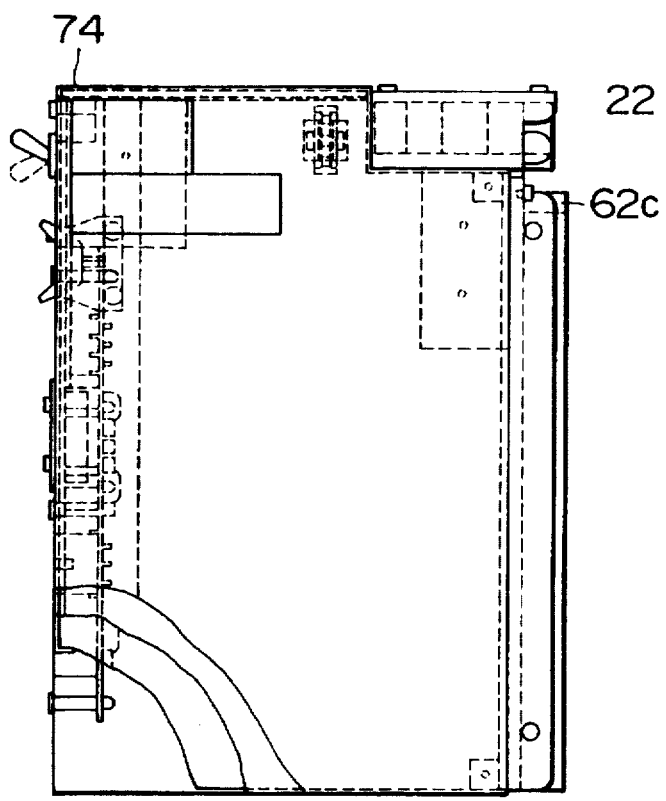

FIG. 81 shows the construction of the auxiliary AC/DC converter 74. The auxiliary AC/DC converter 74 is disposed at the left side as viewed in FIG. 72. Other portions are materially the same as those shown in FIG. 55.

Figure 82A:
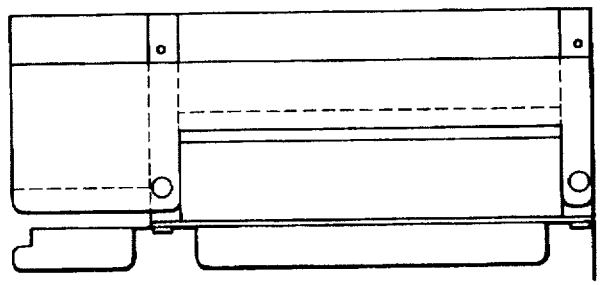
FIGS. 82A–82C are plan, front and end views of a cooling fan unit showing one embodiment of the present invention.
Figure 82B:
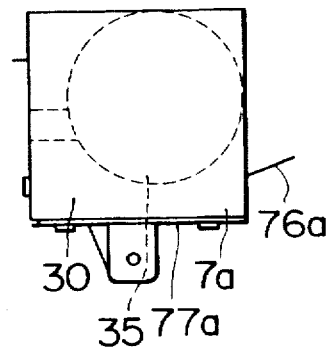
Figure 82C:
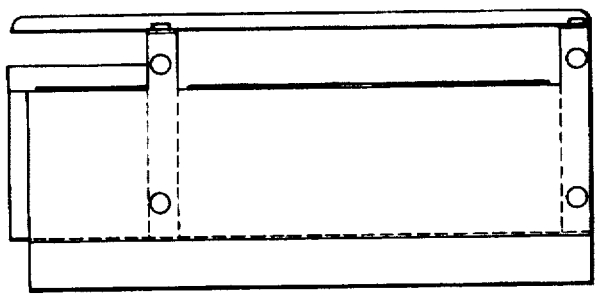
Figure 83A:
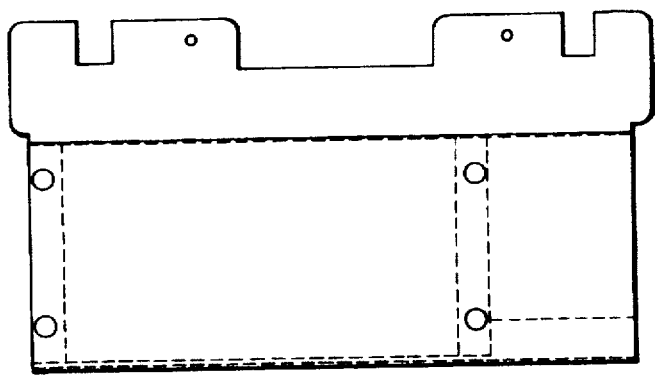
FIGS. 83A–83D are plan, front and end views of another cooling fan unit showing one embodiment of the present invention.
Figure 83B:
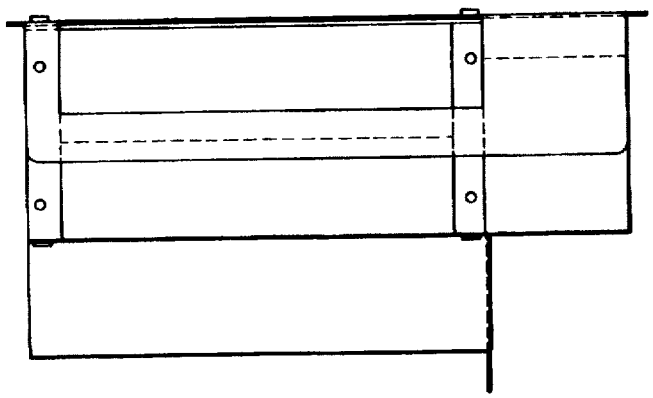
Figure 83C:
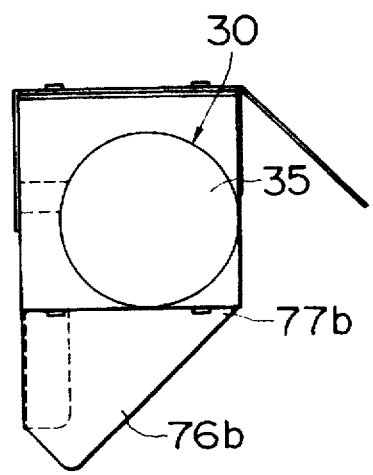
Figure 83D:
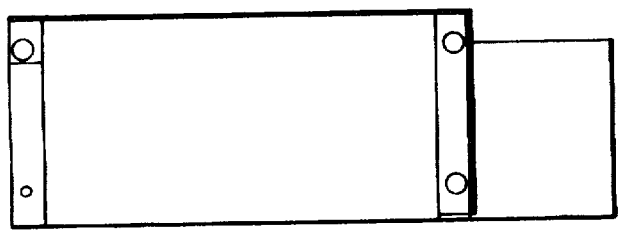

The cooling fan unit has a construction as shown in FIG. 82. This construction is substantially the same as that shown in FIG. 56.

When the temperature of the cooling air is low, the difference between the air temperature and the maximum allowable temperature is comparatively large, so that the flow velocity and, hence, the flow rate of the cooling air can be set low. In addition, vibration damping rubber members 77a between the support plate 76 and the cross-flow fan 30 prevent the vibration of the cross-flow fan 30 from being transmitted to the computer 1, thus contributing to reduction in the noise level.

FIG. 83 shows another arrangement in which a fan different from the fan 7a is disposed upstream of the DC/DC converter 4. In order to uniformalize the velocity of the air passing through the I/O package 3, ducts are formed at the outlet side of the I/O package 3 and the suction side of a cross-flow fan 30. As staged before, the first, second, third and fourth layers or stages of the DC/DC converter 4 have electrical power capacities of 190 W, 220 W, 40 W and 60 W, and generate heat at rates corresponding to the power capacities. Thus, the first, second, third and fourth stages produce heat at rate of 53 W, 59 W, 9 W and 14 W. In order to develop uniform temperature distribution over the LSI packages 12, IC chips and other elements on the circuit board of the DC/DC converter 4, it is necessary to suitably determine the velocities and flow rates of the air to be supplied to respective stages of the DC/DC converter 4 in accordance with the rates of heat generation. More particularly, it is necessary that the cooling air 22 is supplied at specifically large rates to the first and second stages of the DC/DC converter 4 which produce heat a large rates. To realize such cooling conditions, a commercially available cross-flow fan 30 is used in such a posture that the fan 30 has been rotated through 20° in the same horizontal direction. To this end, a support plate 76b is attached to the cross-flow fan 30. A vibration damping rubber 77b is interposed between the support plate 76b and the cross-flow fan 30. The motor 35 driving the cross-flow fan 30 is speed-variable as in the case of the aforesaid fan 7a, so that it is possible to eliminate wasteful supply of the cooling air 22 while improving reliability of the bearing and the grease. For instance, the speed of the cross-flow fan 30 is controlled by a control circuit board provided in the I/O package 3. For instance, when the temperature of the cooling air is 30° C. or less, 17V is supplied as the driving voltage, whereas, when the air temperature exceeds 30° C., 24V is supplied as the driving voltage, whereby the rate of discharge of the cooling air from the cross-flow fan 30 is varied. More specifically, when the temperature of the cooling air is high, the difference between the cooling air temperature and the maximum allowable temperature of the semiconductor devices or the like to be cooled in the circuit board is correspondingly small, so that the air flow velocity and rate have to be increased in order to promote heat transfer between the air and the semiconductor device. In contrast, when the cooling air temperature is low, the above-mentioned temperature difference is comparatively large, so that the flow rate and velocity of the cooling air 22 may be set low.

Figure 84:
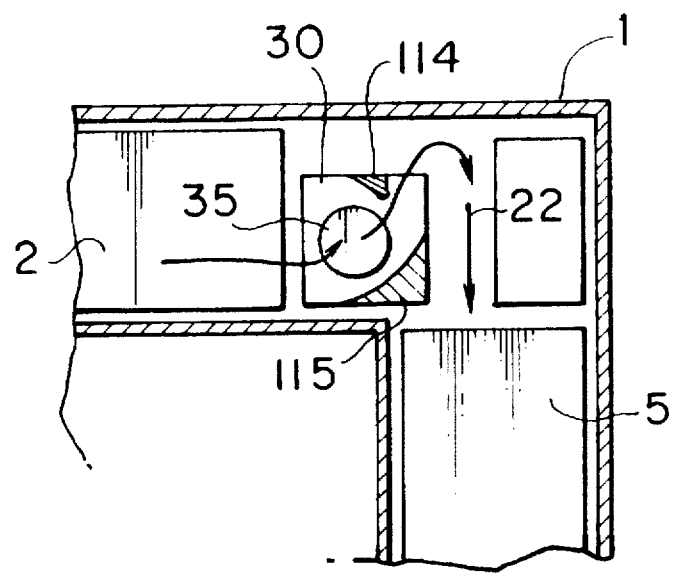
FIG. 84 is a sectional view of a cross flow fan showing another embodiment of the present invention.
Figure 85:
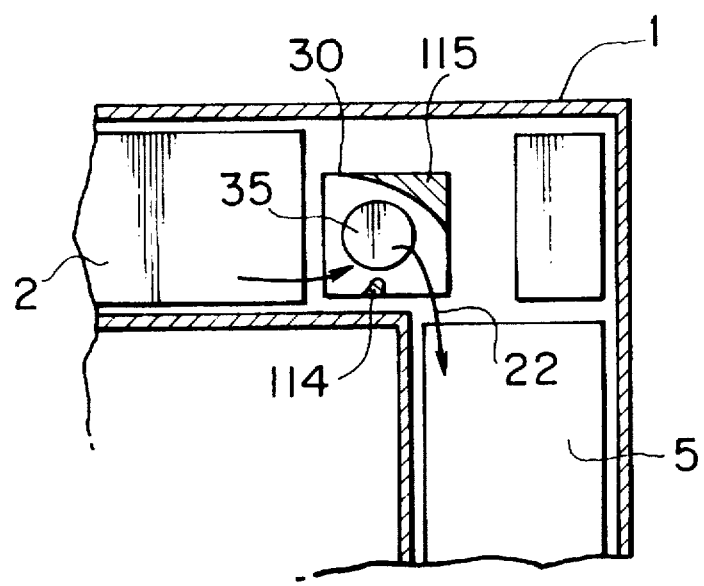
FIG. 85 is a sectional view of a cross flow fan showing another embodiment of the present invention.
Figure 86:
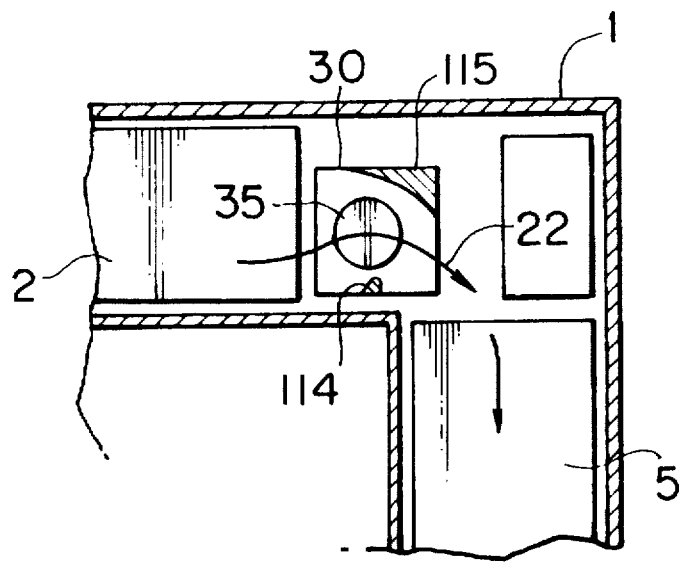
FIG. 86 is a sectional view of a cross flow fan showing another embodiment of the present invention.
Figure 87:
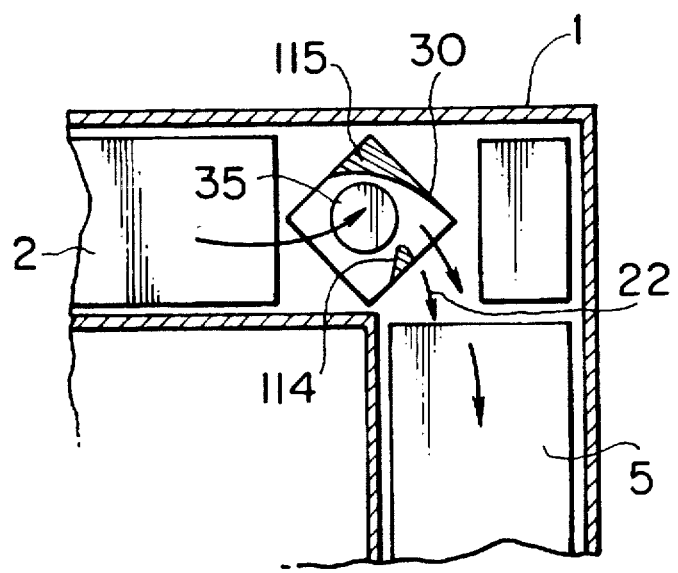
FIG. 87 is a sectional view of a cross flow fan showing another embodiment of the present invention.

FIGS. 84, 85 and 86 show the manner in which the fan is mounted. An experiment showed that the arrangements shown in FIGS. 84 and 85 do not provide high cooling efficiency because cooling air of high velocity impinges upon the wall of the casing or the HDD unit 5. FIG. 86 shows an improved arrangement which employs a cross-flow fan. This cross-flow fan has a casing 115 defining fan inlet and outlet, the fan outlet being bent at an angle greater then a right angle relative to the fan inlet. This type of fan exhibits such a pattern of flow velocity distribution of the discharged air that the flow component adjacent to the casing, which exhibits the highest velocity, is directed to a region spaced away from the heat source, whereas the flow component adjacent to the fan nose 114, which has slow velocity and encounters reduced resistance, approaches the heat source. Consequently, the high-velocity flow component adjacent the casing merges into the low-velocity flow component adjacent to the nose, whereby the overall resistance is reduced while the required flow velocity is obtained. There are only few fans having this type of casing in commercial market. Using different fans of different configurations corresponding to various cooling requirements of different units to be cooled is useless and increases the number of parts to raise the cost. In the embodiment shown in FIG. 87, therefore, a commercially available through-flow fan, having an outlet bent at about a right angle with respect to the inlet, is installed in the casing at a suitable inclination. This arrangement provides an effect substantially equivalent to that obtained when the configuration of the casing of a cross-flow fan is varied. Thus, the embodiment shown in FIG. 87 makes it possible to obtain a cooling system capable of producing high cooling effect and operable at reduced noise level, without using any specially designed fans.

Figure 88:
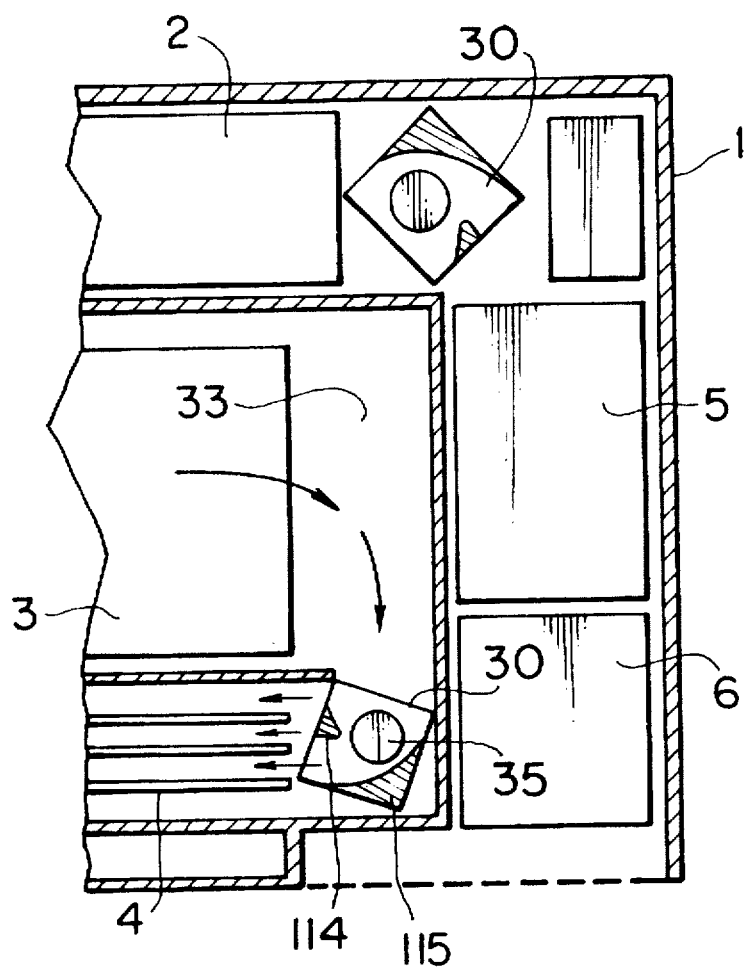
FIG. 88 is a sectional view of a cross flow fan showing another embodiment of the present invention.

FIG. 88 shows an embodiment which employs a cross-flow fan installed in the cooling air channel. In this case, the distance is smaller at the casing side 115 than at the nose side 114. In this case, however, the pressure drop is lower than that produced when the fan is installed such that the fan casing outlet is disposed in parallel with the circuit board.

In the two examples described above, the cooling performance is improved by increasing the distance between the fan outlet and the heat source. Such an increase in the distance may be realized by obliquely installing the fan or by translationally moving one of the fan and the heat source relative to each other. It is to be understood that the former method, i.e., oblique installation of the fan, provides a greater space factor inside the casing than the latter method.

Figure 89:
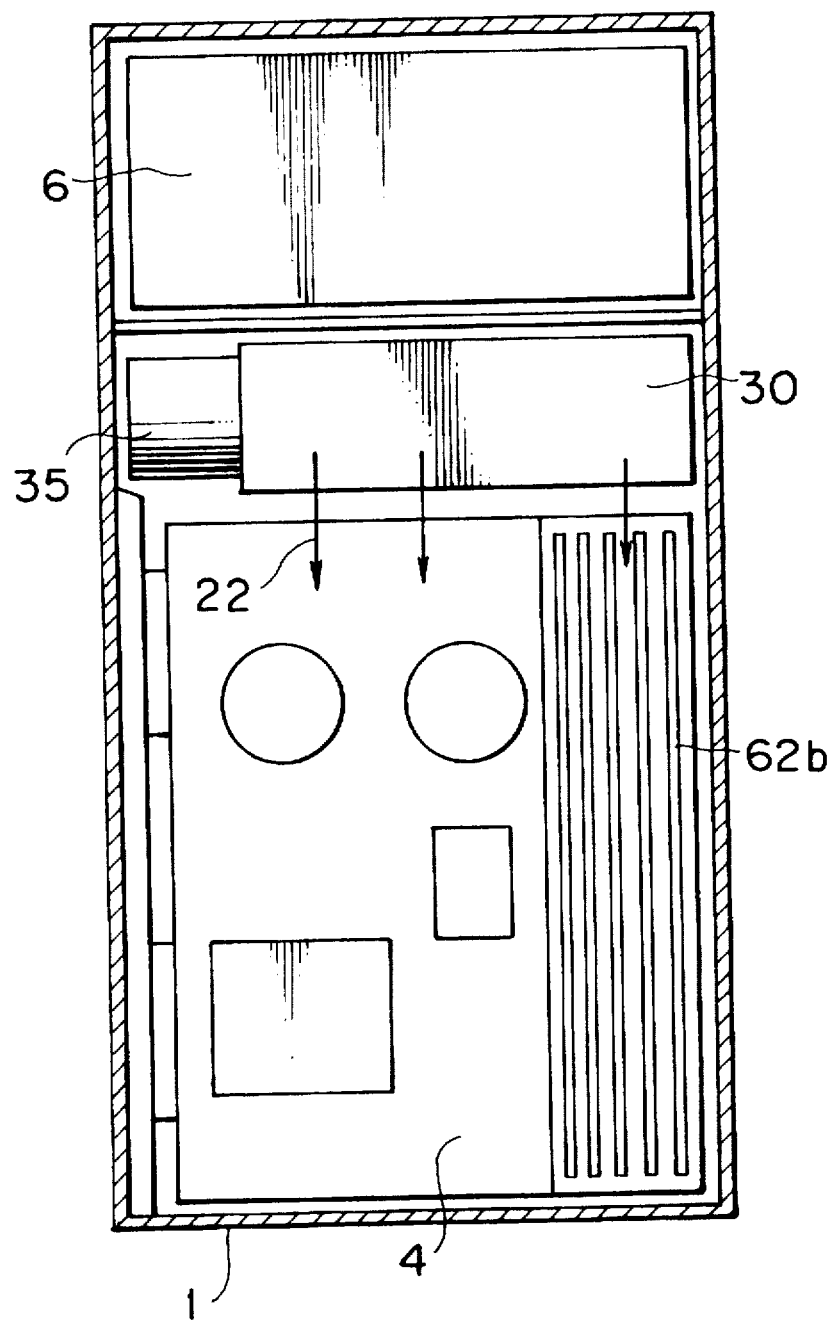
FIG. 89 is a bottom view of a computer showing one embodiment of the present invention.

FIG. 89 is a bottom plan view of the computer 72 shown in FIG. 72 embodying the invention. In order to improve the space factor of the casing, the width of the casing is set substantially equal to the circuit board. In order to realize efficient cooling under this condition, heat dissipation fin unit 62b for power supply is disposed at a position opposite to the motor 35 where the cooling air encounters smaller resistance, so that the air can be concentrated to the region around the fan, thus enhancing the cooling effect.

Figure 90:
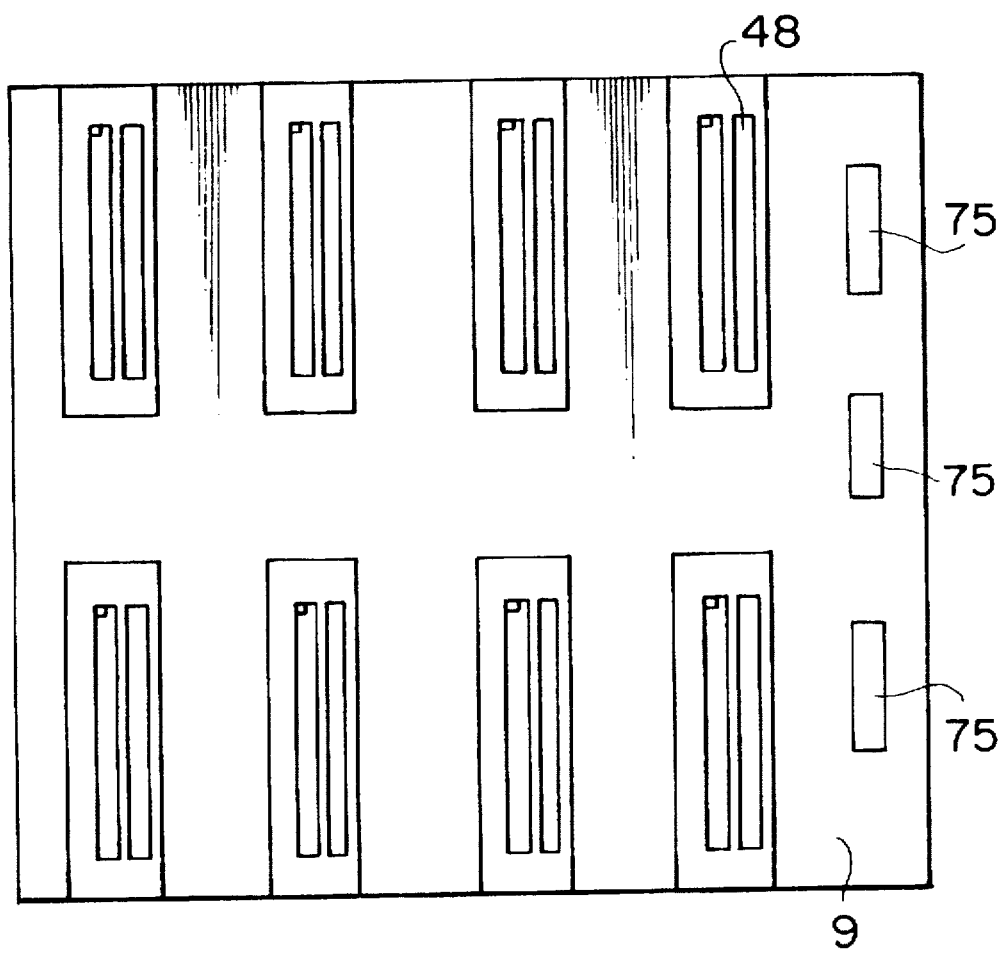
FIG. 90 is a plan view of HDD backboard showing one embodiment of the present invention.

FIG. 90 shows the construction of a HDD back board unit 9 of a computer 1 shown in FIG. 72. There are eight female connectors 48 having pins in the HDD back board unit 9. The spacing between adjacent female connectors 48 is greater in the central region of the HDD back board unit 9. Consequently, when the HDD is mounted on the computer 1, the size of the gap between adjacent HDDs, which form passages for the air, is greater in the central region than in the peripheral region. With this arrangement, it is possible to supply cooling air at a specifically large rate to the main AC/DC converter 70 which is a heat source generating heat at specifically high rate and which is positioned in the center of the AC/DC converter 6 installed downstream of the HDD unit 5, thus meeting the requirement for enhancement of cooling effect on the main AC/DC converter 70.

Figure 91:
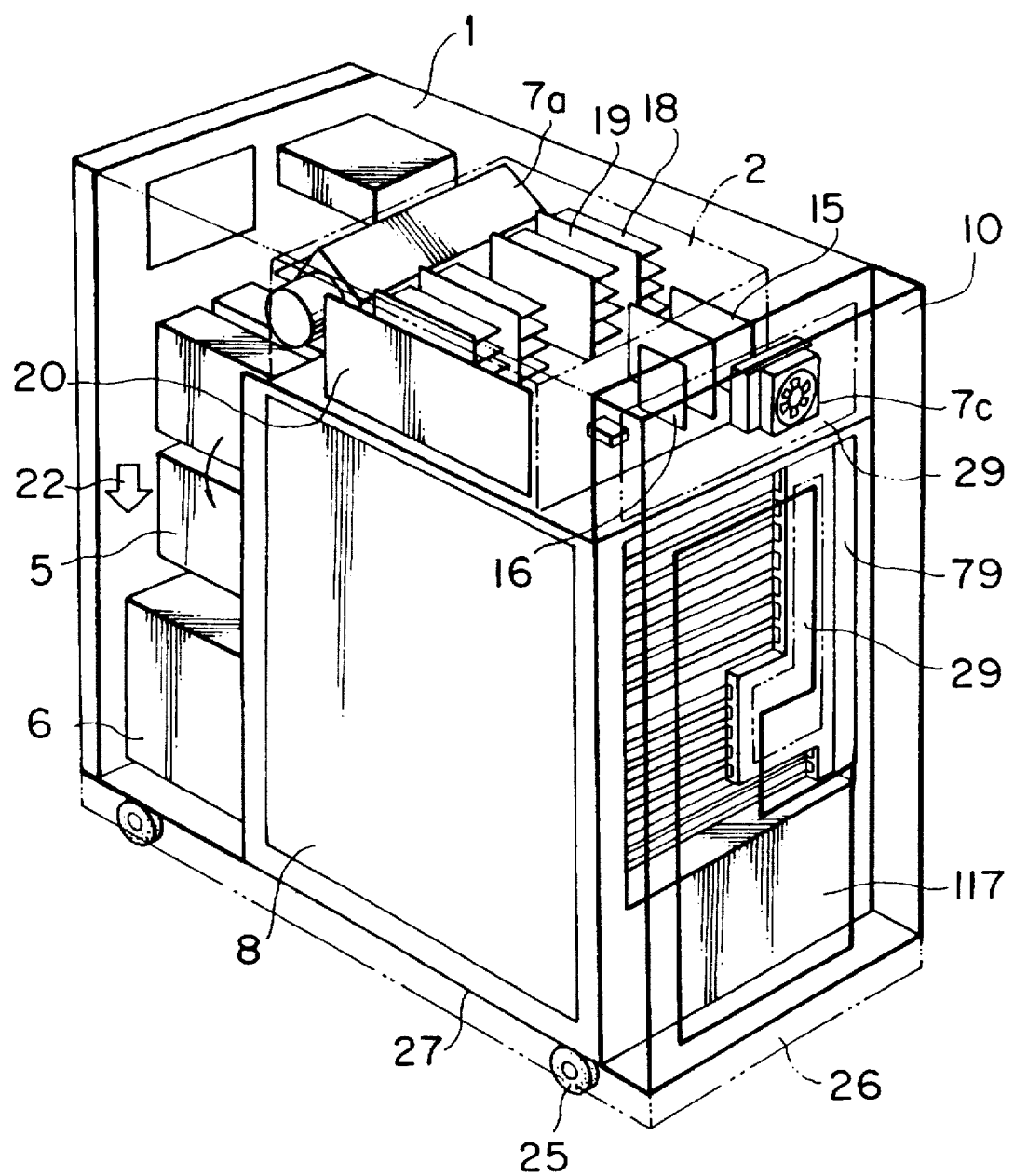
FIG. 91 is a perspective view of an air-supply panel showing one embodiment of the present invention.

FIG. 91 shows the construction of a cable cover unit 10 of a computer 1 which is a different embodiment of the invention. More specifically, this Figure shows a silencing structure making use of the cable cover unit 10. In order to prevent the noise from directly propagating to the exterior through the suction of the cooling air fan, a chamber 116 is defined on the back side of the computer 1 by a cable protection cover 10. An intake opening 117 formed in the cover 10 is deviated from the suction opening 105 so that the suction opening is not directly exposed to the exterior, thus achieving noise confining effect.

The embodiments of the invention described hereinbefore offers the following advantages.

At least two cooling air flow channels are formed in the casing. In addition, various measures are taken such as installation of a cooling air fan between adjacent heat-generating units to be cooled, downward orientation of the cooling air discharge passage, spacing cooling air fans apart from each other and/or provision of double-walled portion in the casing. Consequently, temperature rise of the cooling air inside the casing is suppressed and uniform temperature distribution is developed over heat-generating units in the casing. In addition, the fan driving power is reduced, as well as the level of the noise.

By obliquely installing a cross-flow fan at a bend of each of two or more cooling air flow channels, it is possible to improve the space factor and, hence, to miniaturize the casing.

By constructing a CPU package as high-rate heat generator in a duct-like configuration, and by adopting three-dimensional mounting, it is possible to make an efficient use of the cooling air to enable reduction in the size of the casing.

In a specific form of the invention in which a duct is provided on the suction side of a cross-flow fan, it is possible to make an efficient use of the cooling air and to enhance the performance of the fan.

In another specific form of the invention, a resin mold part is fitted in the central recess of a front panel of the casing, thus stiffening the front panel against distortion about diagonal lines, while reducing the weight of the front panel and enhancing the rigidity of the same.

The resin mold part, which can have a variety of designs and which can be formed small in size, makes it possible to obtain front panels having different designs.

What is claimed is:

1. An air-cooled information processing apparatus comprising:
   a plurality of cooling air flow channels separated from one another by at least one partition;
   a plurality of heat-generating units disposed in each of said cooling air flow channels;
   a cooling air fan disposed with respect to each of said cooling air flow channels for supplying cooling air flow in a respective cooling air flow channel to said plurality of heat-generating units disposed therein; and
   a sub-fan disposed at an upstream side of one of said cooling air flow channels for at least providing localized cooling for a main processing unit of said information processing apparatus as one of said Plurality of heat-generating units disposed in each of said cooling air flow channels, said main processing unit being disposed between said sub-fan and said cooling air fan of said one of said cooling air flow channels;
   wherein said sub-fan supplies cooling air to said main processing unit at a flow rate less than a flow rate of said cooling air fan.

2. An air-cooled information processing apparatus according to claim 1, wherein said plurality of heat-generating units include heat-generating units such as IC chips and LSI packages, said cooling air fan being disposed between adjacent heat-generation units arranged along each cooling air flow channel.

3. An air-cooled information processing apparatus according to claim 1, wherein a cooling air outlet of each of said channels is provided in the lower surface of said air-cooled information processing apparatus.

4. An air-cooled information processing apparatus according to claim 1, wherein said cooling air fan is disposed in each of said cooling air flow channels at a bend of said cooling air flow channel.

5. An air-cooled information processing apparatus according to claim 1, wherein said cooling air fan a cross-flow cooling air fan.

6. An air-cooled information processing apparatus according to claim 1, wherein said cooling air fan in at least one of said air flow channels is arranged in a horizontal direction.

7. An air-cooled information processing apparatus according to claim 1, wherein said air-cooled information processing apparatus has a double-wall structure at least at a portion thereof where a cooling air supply section or a cooling air discharge section is provided.

8. An air-cooled information processing apparatus according to claim 1, wherein said heat-generating units include heat-generating units such as IC chips and LSI packages, and heat-generating units which generate heat at specifically high rates are disposed in the vicinity of cooling air inlets of said cooling air flow channels.

9. An air-cooled information processing apparatus according to claim 1, wherein said cooling air fan is disposed between adjacent heat-generating units arranged along each cooling air flow channel.

10. An air-cooled information processing apparatus according to claim 1, wherein an electric power source is provided as one of said plurality of said heat-generating units in another of said cooling air flow channels.

11. An air-cooled information processing apparatus according to claim 10, wherein said sub-fan is disposed within said one of said cooling air flow channels, and a respective cooling air fan is disposed in each of said cooling air flow channels.

12. An air-cooled information processing apparatus according to claim 11, wherein a respective cooling air fan is disposed between adjacent ones of said plurality of heat-generating units in each of said cooling air flow channels.

13. An air-cooled information processing apparatus according to claim 12, wherein a cooling air outlet of each of said channels is provided in the lower surface of said air-cooled information processing apparatus.

14. An air-cooled information processing apparatus according to claim 12, wherein said cooling air fan is disposed in each of said cooling air flow channels at a bend of said cooling air flow channel.

15. An air-cooled information processing apparatus according to claim 12, wherein said cooling air fan is a cross-flow fan.

16. An air-cooled information processing apparatus according to claim 12, wherein said cooling air fan is arranged in a horizontal direction.

17. An air-cooled information processing apparatus according to claim 12, wherein a heat generating unit having comparatively small rate of heat generation is disposed upstream of said cooling air fan and a heat-generating unit having a comparatively large rate of heat generation is disposed downstream of said cooling air fan in said cooling air flow channel.

18. An air-cooled information processing apparatus according to claim 17, further comprising a power supply unit which generates heat at a large rate, said power supply unit having cooling fins which extend in the direction of flow of cooling air.

19. An air-cooled information processing apparatus according to claim 12, wherein, said cooling air flow channels include at least one first cooling air flow channel in which at least two heat-generating units from among said plurality of heat-generating units are disposed in parallel with each other with respect to the direction of flow of cooling air, and at least one second cooling air flow channel in which at least two heat-generating units from among said plurality of heat-generating units are arranged in series to each other along the flow of cooling air.

* * * * *